United States Patent
Kojima et al.

(10) Patent No.: US 6,761,950 B2
(45) Date of Patent: Jul. 13, 2004

(54) INFORMATION RECORDING MEDIUM AND METHOD FOR PRODUCING THE SAME

(75) Inventors: Rie Kojima, Kadoma (JP); Haruhiko Habuta, Osaka (JP); Noboru Yamada, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 52 days.

(21) Appl. No.: 10/310,768

(22) Filed: Dec. 6, 2002

(65) Prior Publication Data

US 2003/0138669 A1 Jul. 24, 2003

(30) Foreign Application Priority Data

Dec. 7, 2001 (JP) ........................................ 2001-373684

(51) Int. Cl.[7] ................................................. B32B 3/02
(52) U.S. Cl. .................... 428/64.1; 428/64.5; 428/64.6; 430/270.13
(58) Field of Search ............................. 428/64.1, 64.4, 428/64.5, 64.6, 913; 430/270.13, 495.1, 945

(56) References Cited

U.S. PATENT DOCUMENTS

| | | | | |
|---|---|---|---|---|
| 6,071,588 A | * | 6/2000 | Nobumasa et al. | 428/64.4 |
| 6,231,945 B1 | * | 5/2001 | Miyamoto et al. | 428/64.1 |
| 2003/0190447 A1 | * | 10/2003 | Kojima et al. | 428/64.1 |

FOREIGN PATENT DOCUMENTS

| | | |
|---|---|---|
| JP | 5-159373 | 6/1993 |
| JP | 8-077604 | 3/1996 |
| JP | 10-275360 | 10/1998 |
| JP | 2001/322357 | 11/2001 |
| JP | 2002-260281 | 9/2002 |
| WO | 97/34298 | 9/1997 |

OTHER PUBLICATIONS

N. Yamada et al., "Phase–Change Optical Disk Having a Nitride Interface Layer", Japanese Journal of Applied Physics, vol. 37(1998), pp. 2104–2110.

H. Kubota, "Wave Optics", pp. 199–236, (Iwanami Shoten, 1971).

E. Ohno et al., "Disk Technologies for 4.7 GB DVD–RAM", Matsushita Technical Journal, vol. 45, No. 6, Dec. 1999, pp. 60–66.

* cited by examiner

*Primary Examiner*—Elizabeth Mulvaney
(74) *Attorney, Agent, or Firm*—Wenderoth, Lind & Ponack, L.L.P.

(57) ABSTRACT

An information recording medium which ensures high reliability and favorable overwrite cyclability is provided, even when an interface layer is not provided between a recording layer and a dielectric layer. The recording layer 4 and the dielectric layers 2 and 6 are formed on the surface of the substrate 1. In the recording layer 4, a phase change is generated between a crystal phase and an amorphous phase by irradiation of light or application of an electric energy. The dielectric layers 2 and 6 are Zr—Zn—S—O-based material layers comprising Zr, Zn, S and O, preferably consisting essentially of a material expressed, for example, with the formula $(ZrO_2)_X(Zn-S)_{100-X}$ (mol %) wherein X is in the range of $50 \leq X \leq 80$.

18 Claims, 9 Drawing Sheets

US 6,761,950 B2

INFORMATION RECORDING MEDIUM AND METHOD FOR PRODUCING THE SAME

CROSS-REFERENCE TO RELATED APPLICATIONS

The present application claims a priority under 35 U.S.C. §119 to Japanese Patent Application No. 2001-373684 filed on Dec. 7, 2001, entitled "Information recording medium and method for producing the same". The contents of that application are incorporated herein by the reference thereto in their entirety.

BACKGROUND OF THE INVENTION

1. Field of the Invention

This invention relates to an information recording medium which is used for optically or electrically recording, erasing, overwriting and reproducing information, and a method for producing the same.

2. Description of Related Art

The inventors developed 4.7 GB DVD-RAM which is a large capacity rewritable phase-change type information recording medium and can be used as a datafile and an image file. This has been already commercialized.

This 4.7 GB DVD-RAM is disclosed, for example, in Japanese Patent Kokai (Laid-Open) Publication No. 2001-322357. The constitution of DVD-RAM disclosed in this publication is shown in FIG. 9. The information recording medium 31 shown in FIG. 9 has a seven-layer structure where a first dielectric layer 102, a first interface layer 103, a recording layer 4, a second interface layer 105, a second dielectric layer 106, an optical compensation layer 7, and a reflective layer 8 are formed on one surface of a substrate 1 in this order. In this information recording medium, the first dielectric layer exists in a position closer to an incident laser beam than the second dielectric layer. The same relationship exists between the first interface layer and the second interface layer. Thus, in this specification, when the information recording medium contains two or more layers having the same function, "first" "second" "third" . . . is given to the beginning of the name of each layer in the order of the layer which is closer to the incident laser beam.

The first dielectric layer 102 and the second dielectric layer 106 have the function which adjusts an optical path length so as to enhance the optical absorption efficiency of the recording layer 4, and enlarges the difference between the reflectance of crystal phase and the reflectance of amorphous phase so as to enlarge a signal amplitude. ZnS-20 mol % $SiO_2$ (i.e. $(SiO_2)_{80}(ZnS)_{20}$) conventionally used as a material for the dielectric layer is amorphous material. It has low thermal conductivity, is transparent, and has a high refractive index. Moreover, ZnS-20 mol % $SiO_2$ exhibits a high film-forming speed at the time of the film formation, and good mechanical characteristic and moisture resistance. Thus, ZnS-20 mol % $SiO_2$ is an excellent material suitable for forming the dielectric layer.

If the thermal conductivity of the first dielectric layer 102 and the second dielectric layer 106 is low, the heat can diffuse from the recording layer 4 to the reflective layer 8 quickly in the thickness direction when a laser beam enters the recording layer 4, and therefore, in-plane heat diffusion in the dielectric layers 102 or 106 is suppressed. That is, the recording layer 4 is cooled by the dielectric layer for a shorter time, and therefore, an amorphous mark (record mark) can be easily formed. When a record mark is hard to form, a high peak power is necessary for recording. When a record mark is easy to form, recording can be conducted with a low peak power. When the thermal conductivity of the dielectric layer is low, recording can be conducted with a low peak power, and therefore, the recording sensitivity of the information recording medium becomes higher. On the other hand, when the thermal conductivity of the dielectric layer is high, recording is conducted with a high peak power, and therefore the recording sensitivity of the information recording medium becomes lower. The dielectric layer in the information recording medium exists in a form of such thin film that thermal conductivity cannot be measured accurately. For this reason, the inventors employ the recording sensitivity of the information recording medium as a relative judgment reference for learning the degree of the thermal conductivity of the dielectric layer.

The recording layer 4 is formed using the material containing Ge—Sn—Sb—Te which crystallizes at a high speed. The information recording medium which contains such material as the recording layer 4, not only has excellent initial recording characteristic, but also has excellent archival characteristic and an excellent archival overwrite characteristic. In a phase-change type information recording medium, information is recorded, erased and overwritten by utilizing reversible phase change between crystal phase and amorphous phase of the recording layer 4. When the recording layer 4 is irradiated with a high power (i.e. peak power) laser beam, and then cooled rapidly, the irradiated part turns into an amorphous phase and a record mark is formed. When the recording layer is irradiated with a low power (i.e. bias power) laser beam to raise its temperature and then cooled gradually, the irradiated part turns into a crystal phase and recorded information is erased. By irradiating the recording layer with the laser beam of which power is modulated between the peak power level and the bias power level, it is possible to overwrite new information while erasing information already recorded. Overwrite cyclability is expressed with the maximum number which corresponds to repeatable overwrite number on the condition that the jitter value does not cause a problem in a practical use. It can be said that the better overwrite cyclability is, the larger this number is. Particularly, an information recording medium for datafiles is expected to have excellent overwrite cyclability.

The first interface layer 103 and the second interface layer 105 have the function which prevents a material transfer caused between the first dielectric layer 102 and the recording layer 4, and between the second dielectric layer 106 and the recording layer 4, respectively. The material transfer here means the phenomenon which S of ZnS-20 mol % $SiO_2$ of the first and second dielectric layers diffuses into the recording layer while the recording the layer is irradiated with a laser beam and information is repeatedly overwritten. If a lot of S diffuses into the recording layer, a reduction of the reflectance of the recording layer is caused, and overwrite cyclability deteriorates. This phenomenon has already been known (See N. Yamada et al. Japanese Journal of Applied Physics Vol.37 (1998) pp.2104–2110). Moreover, Japanese Patent Kokai (Laid-Open) Publication No. 10-275360 and International Publication No. WO 97/34298 disclose that the interface layer which prevents this phenomenon is formed using a nitride containing Ge.

The optical compensation layer 107 adjusts the ratio Ac/Aa where Ac is optical absorptance of the recording layer 4 in a crystalline state, and Aa is optical absorptance Aa of the recording layer 4 in an amorphous state, and serves to suppress distortion of overwritten marks. The reflective layer 8 optically serves to increase the light quantity absorbed by the recording layer 4, and thermally serves to diffuse the heat generated in the recording layer 4 to cool the recording layer quickly and to facilitate amorphization of the recording layer. The reflective layer 8 also serves to protect a multilayered film from the operation environment.

Thus, the information recording medium shown in FIG. 9 ensures excellent overwrite cyclability and high reliability with a large capacity of 4.7 GB by using the structure including the seven layers each of which functions as mentioned above, and thereby has been commercialized.

As material suitable for the dielectric layer of the information recording medium, various materials have already been proposed. For example, in Japanese Patent Kokai (Laid-Open) Publication No. 5-159373, it is disclosed that the heat-resistance protective layer is formed from a mixture of at least one compound selected from nitride, carbide, oxide and sulfide with a melting point higher than that of Si, and low alkali glass in an optical information recording medium. In this publication, the carbide, oxide, and sulfide of Nb, Zr, Mo, Ta, Ti, Cr, Si, Zn, and Al, are illustrated as the high melting point compound. Moreover, in the publication, it is disclosed that the low alkali glass essentially consists of $SiO_2$, BaO, $B_2O_3$, and $Al_2O_3$.

SUMMARY OF THE INVENTION

As mentioned above, when forming the first and the second dielectric layers by using ZnS-20 mol % $SiO_2$, the interface layer is inevitably needed between the recording layer and the dielectric layer for preventing the diffusion of S. However, when considering price of the medium, it is desirable that the number of the layers which compose the medium is as small as possible. If the number of layers is small, reduction of the cost of materials, miniaturization of manufacturing apparatus, and the increase in the throughput due to reduction in manufacture time can be realized, which results in the reduction of the price of the medium.

The inventors examined a possibility of eliminating at least one of the first interface layer and second interface layer as one method of reducing the number of layers. The inventors considered that in this case, a dielectric layer needs to be made from material other than ZnS-20 mol % $SiO_2$ so that the diffusion of S from the dielectric layer into the recording layer due to overwriting may not be caused. Further, the followings are desired as to the material for the dielectric layer:

The adhesiveness of the material to the recording layer which is of chalcogenide material is good;

The material realizes that recording sensitivity which is equivalent to or higher than that of the above seven-layer structure;

The material is transparent; and

The material has a high melting point so that it may not melt when recording.

It is an object of the present invention to provide an information recording medium which is provided with a dielectric layer having favorable adhesiveness to a recording layer, in which medium a substance does not transfer from the dielectric layer to the recording layer even when the dielectric layer is formed in direct contact with the recording layer without forming the interface layer, and excellent overwrite cyclability is ensured.

The above-mentioned Japanese Patent Kokai (Laid-Open) Publication No. 5-159373 does not refer to the problem that a substance transfers from the dielectric layer to the recording layer. Therefore, it should be noted that this publication does not teach the problem which this invention solves, and means to solve the problem, i.e. a specific composition of the material for the dielectric layer.

The inventors formed the dielectric layer by using various compounds and evaluated the adhesiveness of the dielectric layer to the recording layer and overwrite cyclability of the information recording medium, as explained in the below-mentioned Example. As a result, it was found that, when providing a dielectric on both sides of the recording layer directly, without an interface layer, the adhesiveness of the dielectric layer to the recording layer is good in the case where the dielectric layer is formed from a material which is easy to diffuse in the recording layer, for example, the conventional ZnS-20 mol % $SiO_2$, although, overwrite cyclability of the medium is inferior. Moreover, for example, $ZrO_2$ has low thermal conductivity and a high melting point. Therefore, if $ZrO_2$ is used for a dielectric layer, the recording sensitivity of the information recording medium can be high and excellent overwrite cyclability can be ensured. However, when forming a dielectric layer using $ZrO_2$, the result was that the adhesiveness of the dielectric layer to the recording layer is inferior. With respect to the information recording medium in which the dielectric layer is formed in contact with the recording layer using other various oxides, nitrides, sulfides and selenides, the adhesiveness of the dielectric layer to the recording layer and overwrite cyclability were evaluated. However, when forming the dielectric layer using one kind of oxide, nitride, sulfide or selenide, favorable adhesiveness and favorable overwrite cyclability could not be obtained together.

The inventors examined forming a dielectric layer from a mixture of ZnS and a compound other than $SiO_2$ which is mixed with ZnS in the conventional ZnS-20 mol % $SiO_2$. As a result, it has been found that a combination of ZnS and $ZrO_2$ is suitable as a constitutive material for the dielectric layer which contacts with the recording layer, which led to this invention.

That is, the present invention provides an information recording medium which includes a substrate and a recording layer wherein a phase change between a crystal phase and an amorphous phase is generated by irradiation of light or application of an electric energy, and which further includes a Zr—Zn—S—O-based material layer comprising Zr, Zn, S and O. Here, the term "material layer comprising Zr, Zn, S and O" is used based on the intention that it does not matter in what compound each atom exists. In this material, however, it is considered that most Zr exists in the form of $ZrO_2$ with O, while Zn and S exist in the forms of ZnS, Zn which does not bond to another atom, and S which does not bond to another atom. As mentioned below, in this specification, the combination of the three forms of ZnS, Zn which does not bond to another atom, and S which does not bond to another atom, are regarded as forming a system which is indicated as "Zn—S." The characteristic of the material layer comprising Zr, Zn, S and O is that the adhesiveness of the layer to the recording layer is good and the material is difficult to transfer between this layer and the recording layer.

The information recording medium of the present invention is a medium on or from which information is recorded or reproduced by irradiation of light or by application of an electric energy. Generally, irradiation of light is carried out by irradiation of a laser light (that is, laser beam), and application of an electric energy is carried out by applying a voltage to a recording layer. Hereafter, the Zr—Zn—S—O-based material layer which constitutes the information recording medium of this invention is described in detail.

More specifically, the information recording medium of this invention includes the Zr—Zn—S—O-based material layer which consists essentially of the material expressed with the formula (1):

$$Zr_B Zn_C S_D O_{100-B-C-D} \text{ (atomic \%)} \quad (1)$$

wherein B, C and D are respectively within the range of $8 \leq B \leq 33$, and $3 \leq C \leq 30$, $C \leq D \leq 2C \leq 45$, and satisfy $40 \leq B+C+D \leq 80$, as a constituent element. The "atomic %" here shows that the formula (1) is a compositional formula of which basis (i.e. 100%) is the sum of the numbers of Zr, Zn, S and O atoms. Also in the following formulae, the indication of "atomic %" is used for showing the same meaning.

In the formula (1) it does not matter what compound each atom of Zr, Zn, S and O forms. The reason why the material is specified by this formula is that it is difficult to determine the composition represented with ratio of each compound when analyzing the composition of a layer formed into a thin film, and actually only an elementary composition (that is, ratio of each atom) is often determined. As mentioned in the above, in the material expressed with the formula (1), it is considered that most Zr exists as $ZrO_2$ with O, and most Zn exists as Zn—S with S. Here, "Zn—S" means that, in the Zr—Zn—S—O-based material layer, not only ZnS exists, but also Zn which does not bond to another atom and/or S which does not bond to another atom exist. Therefore, Zn—S is indicated as, for example, $ZnS_{1.5}$. The indication shows that (the number of S atoms)/(the number of Zn) is 1.5. Further, in this case, an excess of S which does not bond to Zn (or another atom) exists in the Zr—Zn—S—O-based material layer. In the formula (1), since C and D satisfy $C \leq D \leq 2C \leq 45$, (the number of S atoms)/(the number of Zn atoms) is in the range of 1 to 2.

Preferably, the Zr—Zn—S—O-based material layer which consists essentially of the material expressed with the above-mentioned formula (1) exists as either dielectric layer of the two dielectric layers adjacent to the recording layer in the information recording medium. More preferably, it exists as both of the two dielectric layers. In the dielectric layer which contains Zr, Zn, S and O in the above-mentioned range, $ZrO_2$ with a melting point higher than 2700° C. ensures excellent overwrite cyclability and Zn—S ensures adhesiveness to the recording layer which is of chalcogenide material. Further, a thin film of $ZrO_2$ is amorphous and a thin film of ZnS is crystalline. When two materials whose structure is different from each other are mixed to make complex the structure of the mixture, the thermal conductivity of the mixture is lowered. Thereby, the recording layer is cooled more rapidly, and therefore, the recording sensitivity of the information recording medium is improved. Therefore, in the information recording medium of the present invention, delamination between the recording layer and the dielectric layer is not caused even when the interface layer is not provided, and good overwrite cyclability and recording sensitivity are exhibited. Alternatively, the layer of the material expressed with the formula (1) may be an interface layer which is located between the recording layer and a dielectric layer in an information recording medium.

The Zr—Zn—S—O-based material layer substantially consisting of the material expressed with the formula (1) may be the layer which substantially consists of the material expressed with the formula (11):

$$(ZrO_2)_X (Zn—S)_{100-X} \text{ (mol \%)} \quad (11)$$

wherein X is in the range of $50 \leq X \leq 80$. The formula (11) expresses the preferable ratio of the two compounds when the Zr—Zn—S—O-based material consists of $ZrO_2$ and Zn—S. The term "mol %" here shows that the formula (11) is a compositional formula of which basis (i.e. 100%) is the total of each compound. Also in the following formulae, the indication of "mol %" is used for showing the same meaning.

Preferably, the layer which substantially consists of the material expressed with the formula (11) also exists as either dielectric layer of the two dielectric layers adjacent to the recording layer. More preferably, it exists as both of the two dielectric layers. The effect by using the layer which substantially consists of the material expressed with the formula (11) as a dielectric layer is the same as described in relation to the material expressed with the formula (1). The content of $ZrO_2$ is preferably 50 mol % or more in order to ensure good recording sensitivity of the information recording medium. On the other hand, the content of $ZrO_2$ is preferably 80 mol % or less in order to ensure the adhesiveness brought by Zn—S. Alternatively, the layer which substantially consists of the material expressed with the formula (11) may be an interface layer which is located between the recording layer and a dielectric layer in an information recording medium.

In the information recording medium of this invention, the Zr—Zn—S—O-based material layer may further contains Si, and substantially consist of the material expressed with the formula (2):

$$Zr_E Si_F Zn_G S_H O_{100-E-F-G-H} \text{ (atomic \%)} \quad (2)$$

wherein E, F, G and H are respectively in the range of $1 \leq E \leq 30$, $0 \leq F \leq 23$, $2 \leq G \leq 30$ and $G \leq H \leq 2G \leq 45$, and satisfy $40 \leq E+F+G+H \leq 80$.

Also in the formula (2), it does not matter what compound each atom of Zr, Si, Zn, S and O forms. The reason why the material is specified by this formula is the same as the reason for employing the formula (1). In the material expressed with the formula (2), it is considered that most Si exists as $SiO_2$ with O. Further, $G \leq H \leq 2G$ means that (the number of S atoms)/(the number of Zn atoms) is in the range of 1 to 2.

Preferably, the layer which substantially consists of the material expressed with the formula (2) exists as either dielectric layer of the two dielectric layers adjacent to the recording layer. More preferably, it exists as both of the two dielectric layers. In the information recording medium in which the Zr—Zn—S—O-based material layer containing Si is employed as the dielectric layer, favorable adhesiveness of the dielectric layer to the recording layer and excellent overwrite cyclability are ensured, and higher recording sensitivity is realized. It is considered that the higher recording sensitivity is realized because the thermal conductivity of the layer becomes low by containing Si. Alternatively, the layer substantially consisting of the material expressed with the formula (2) may be an interface layer which is located between the recording layer and a dielectric layer in an information recording medium.

The Zr—Zn—S—O-based material layer containing Si may be the layer which substantially consists of the material expressed with the formula (21):

$$(ZrO_2)_Y (SiO_2)_Z (Zn—S)_{100-Y-Z} \text{ (mol \%)} \quad (21)$$

wherein Y and Z are respectively within the range of $20 \leq Y \leq 70$, and $10 \leq Z \leq 50$, and satisfy $50 \leq Y+Z \leq 80$. The formula (21) shows the preferable ratio of three compounds when the Zr—Zn—S—O-based material layer containing Si consists of a mixture of $ZrO_2$, $SiO_2$, and Zn—S. Preferably, the layer which consists essentially of the material expressed with the formula (21) exists as either dielectric layer of the two dielectric layers adjacent to the recording layer. More preferably, it exists as both of the two dielectric layers. Alternatively, the layer substantially consisting of the material expressed with the formula (21) may be an interface layer which is located between the recording layer and a dielectric layer in an information recording medium.

When using the layer which substantially consists of the material expressed with the formula (21) as a dielectric layer, $SiO_2$ serves to enhance the recording sensitivity of the information recording medium. When using this material, the content of $SiO_2$ (i.e. Z in the formula (21)) is preferably 10 mol % or more. On the other hand, if the content of $SiO_2$ is too high, the content of other components becomes low, and thereby the adhesiveness of the layer to the recording layer, and the overwrite cyclability of the information recording medium deteriorate. Therefore, the content of $SiO_2$ is preferably 50 mol % or less. Further, by adjusting the content of $SiO_2$ within the range of 10 to 50 mol %, the recording sensitivity can be adjusted. In the material expressed with the formula (21), the content of Zn—S is preferably 20 mol % or more so as to ensure the adhesiveness to the recording layer, and preferably 50 mol % or less so as not to cause S to diffuse into the recording layer. Therefore, in the formula (21), it is preferable that $50 \leq Y+Z \leq 80$, The material expressed with the formula (21) may contain $ZrO_2$ and $SiO_2$ at a substantially equal ratio. In this case, this material is expressed with the following formula (22):

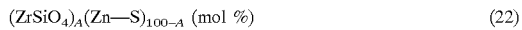

$$(ZrSiO_4)_A(Zn{-}S)_{100-A} \text{ (mol \%)} \qquad (22)$$

wherein A is within the range of $33 \leq A \leq 67$. $ZrSiO_4$ is a complex oxide which contains $ZrO_2$ and $SiO_2$ at a substantially equal ratio. $ZrSiO_4$ has a high melting point and a stable structure with stoichiometric composition. Preferably, the layer which substantially consists of the material expressed with the formula (22) exists as either dielectric layer of the two dielectric layers adjacent to the recording layer. More preferably, it exists as both of the two dielectric layers. In the formula (22), $ZrSiO_4$ and Zn—S exist in the layer at a suitable ratio by setting A into the range of $33 \leq A \leq 67$. Therefore, the dielectric layer which substantially consists of the material expressed with the formula (22) adheres to the recording layer well and ensures that the information recording medium has favorable recording sensitivity and favorable overwrite cyclability. When $ZrO_2$ and $SiO_2$ form $ZrSiO_4$ which is a complex oxide, a thin film of $ZrSiO_4$ is amorphous. As mentioned in the above, a thin film of ZnS is crystalline. When materials whose structure is different from each other are mixed to make complex the structure of the mixture, the thermal conductivity of the mixture is lowered. Thereby, the recording layer is cooled more rapidly, and therefore, the recording sensitivity of the information recording medium is improved. Thus, the layer which substantially consists of the material expressed with the formula (22) is excellent in adhesiveness to the recording layer, and ensures that the information recording medium has favorable recording sensitivity and favorable overwrite cyclability. Alternatively, the layer which substantially consists of the material expressed with the formula (22) may be an interface layer which is located between the recording layer and a dielectric layer in an information recording medium.

In the Zr—Zn—S—O-based material layer which constitutes the information recording medium of the present invention, it is preferable that the number of S atoms and the number of Zn atoms satisfy $1 \leq$ (the number of S atoms)/(the number of Zn atoms)$\leq 2$. When the Zr—Zn—S—O-based material layer in which (the number of S atoms)/(the number of Zn atoms) is in this range is formed in contact with the recording layer in the production process of the information recording medium, the medium is excellent in adhesiveness of the Zr—Zn—S—O-based material layer to the recording layer and has favorable overwrite cyclability and favorable recording sensitivity. More preferably, (the number of S atoms)/(the number of Zn) is 1 or more. In that case, the adhesiveness of the Zr—Zn—S—O-based material layer to the recording layer is more improved. However, (the number of S atoms)/(the number of Zn atoms) is preferably 2 or less. When (the number of S atoms)/(the number of Zn atoms) exceeds 2, the content of S in the Zr—Zn—S—O-based material layer becomes high, whereby the overwrite cyclability of the information recording medium deteriorates due to the diffusion of S into the recording layer, in the case where this Zr—Zn—S—O-based material layer is formed as a dielectric layer in contact with the recording layer.

In any one of the formulae (1), (11), (2), (21) and (22), (the number of S atoms)/(the number of Zn atoms) is in the range of 1 to 2. Therefore, the content of S is 33 atomic % or less in all materials expressed with these formulae, and is less than the content of S in the conventional $(ZnS)_{80}(SiO_2)_{20}$ (mol %) $(=Zn_{36.4}S_{36.4}Si_{9.0}O_{18.2})$, that is, 36.4 atomic %. In other words, the materials expressed with the above formulae ensure that, by defining the ratio of the number of S atoms to the number of Zn atoms, it is ensured that the crystallization characteristic of the recording layer and overwrite cyclability of the information recording medium do not deteriorate while favorable adhesiveness of the layer (specifically the dielectric layer) formed from any one of the materials to the recording layer is maintained.

The information recording medium of the present invention preferably has a recording layer in which a phase change is generated reversibly. That is, the information recording medium of this invention is preferably provided as a rewritable information recording medium.

Specifically, the recording layer where a phase change occurs reversibly preferably contains any one material selected from Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te. Each of these is a rapid crystallization material. Therefore, when a recording layer is formed from these materials, it is possible to record information at a high density and a high transfer rate, and to obtain the information recording medium excellent in reliability (specifically archival characteristic or archival overwrite characteristic).

The information recording medium of this invention may have two or more recording layers. For example, such information recording medium has a single-sided dual-layer structure, in which two recording layers are formed on one surface of a substrate with a dielectric layer and an intermediate layer therebetween. As to the information recording medium of the single-sided dual-layer structure, information is recorded in two recording layers by irradiation of light from one side. By employing this structure, the recording capacity can be made large. Alternatively, an information recording medium of this invention may include a recording layer on both surfaces of a substrate.

In the information recording medium of this invention, it is desirable that the film thickness of the recording layer is 15 nm or less. If it exceeds 15 nm, the heat applied to the recording layer will diffuse in the planar direction, and will be difficult to diffuse in the thickness direction.

The information recording medium of this invention may have a constitution in which a first dielectric layer, a recording layer, a second dielectric layer, and a reflective layer are formed in this order on one surface of a substrate. The information recording medium of this constitution is a medium on which information is recorded by irradiation of light. In this specification, the "first dielectric layer" means the dielectric layer which is in the position closer to the incident light, and the "second dielectric layer" means the dielectric layer which is in the position farther from the incident light. That is, the incident light passes through the first dielectric layer and the recording layer in this order, and then reaches the second dielectric layer. The information recording medium of this constitution is used, for example, when recording and reproducing by the laser beam of which wavelength is about 660 nm.

When the information recording medium of this invention has this constitution, at least one of the first dielectric layer and the second dielectric layer is the above Zr—Zn—S—O-based material layer (specifically, the layer which consists essentially of any one of the materials expressed with the above formulae (1), (11), (2), (21), and (22)). Preferably, both of the dielectric layers are the above Zr—Zn—S—O-based material layer. In this case, the compositions of both dielectric layers may be the same or different from each other.

The information recording medium of this invention may have a constitution in which a reflective layer, a second dielectric layer, a recording layer, and a first dielectric layer are formed in this order on one surface of a substrate. This constitution is employed when the thickness of the substrate to which a light is applied needs to be thin. Specifically, the information recording medium of this constitution is used, when information is recorded and reproduced by a short-wavelength laser beam of which wavelength is about 405 nm, and the numerical aperture NA of an objective lens is made as large as, for example, 0.85 in order to set a focal position shallow. In order to use such a wavelength and numerical aperture NA, the thickness of the substrate to which light is applied needs to be set at between about 60 and 120 $\mu$m, for example. It is difficult to form a layer on the surface of such thin substrate. Therefore, the information recording medium of this constitution is identified as an medium formed by using a substrate to which a light is not applied as a support substrate, and stacking a reflective layer and so on in the order on one surface of the substrate.

When the information recording medium of this invention has this constitution, at least one of the first dielectric layer and the second dielectric layer is the above Zr—Zn—S—O-based material layer. Preferably, both of the dielectric layers are the above Zr—Zn—S—O-based material layers. In this case, the compositions of both dielectric layers may be the same or different from each other.

This invention also provides a method for producing the information recording medium of this invention which includes the process of forming the above-mentioned Zr—Zn—S—O-based material layer by a sputtering method. According to the sputtering method, the Zr—Zn—S—O-based layer of which composition is substantially the same as that of a sputtering target, can be formed. Therefore, according to this producing method, the Zr—Zn—S—O-based material layer of a desired composition can be easily formed by selecting a sputtering target appropriately.

Specifically, a sputtering target which substantially consists of the material expressed with the following formula (10):

 (10)

wherein, b, c, and d are respectively within the range of $11 \leq b \leq 30$, $5 \leq c \leq 27$ and $c \leq d \leq 2c \leq 40$, and satisfy $40 \leq b+c+d \leq 80$, can be used. The formula (10) is equivalent to an elementary composition formula of the material expressed with the formula (110) mentioned below. Therefore, by using this target, the layer which substantially consists of the material expressed with the above-mentioned formula (10) can be formed.

The elementary composition of the layer formed by sputtering may differ from the elementary composition of a sputtering target depending on a sputtering device, sputtering conditions, and the size of the sputtering target and so on. Even when such difference occurs upon using the sputtering target consisting of the material expressed with the above-mentioned formula (10), the elementary composition of the layer to be formed is expressed at least with the above-mentioned formula (1).

In the producing method of the information recording medium of this invention, a sputtering target which substantially consists of the material expressed with the formula (110):

 (110)

wherein x is in the range of $50 \leq x \leq 80$, can be used. This is equivalent to the formula which expresses the composition of a sputtering target with the ratio of $ZrO_2$ and Zn—S. The reason why the sputtering target is thus specified is that the sputtering target consisting of the material which contains Zr, Zn, S and O is usually provided with the indication of the composition based on these two compounds. Further, the inventors have confirmed that, according to analysis with an X-ray microanalyser, the elementary composition of a commercially available sputtering target becomes substantially equal to the elementary composition calculated from the indicated composition (that is, the indicated composition (i.e. nominal composition) is correct). Therefore, this sputtering target makes it possible to form the layer which substantially consists of the material expressed with the formula (11).

In the producing method of the information recording medium of this invention, in order to form the Zr—Zn—S—O-based material layer containing Si, a sputtering target which substantially consists of the material expressed with the formula (20):

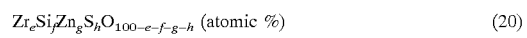 (20)

wherein e, f, g and h are respectively in the range of $3 \leq e \leq 27$, $1 \leq f \leq 20$, $5 \leq g \leq 27$ and $g \leq h \leq 2g \leq 40$, and satisfy $40 \leq e+f+g+h \leq 80$, may be used. When this sputtering target is used, the layer which substantially consists of the material expressed with the formula (21) or the formula (2) is formed.

In the producing method of the information recording medium of this invention, a sputtering target which substantially consists of the material expressed with the formula (210):

 (210)

wherein y and z are respectively within the range of $20 \leq y \leq 70$, and $10 \leq z \leq 50$, and satisfy $50 \leq y+z \leq 80$, may be used. The reason why the sputtering target is thus specified is that the sputtering target consisting of the material containing Zr, Zn, Si, S and O is usually provided with the indication of composition based on $ZrO_2$, $SiO_2$, and Zn—S. The inventors have confirmed that also the indicated composition (i.e. nominal composition) of the target whose composition is indicated with the formula (210) is correct. Therefore, this sputtering target makes it possible to form the layer which substantially consists of the material expressed with the formula (21).

The sputtering target expressed with the above-mentioned formula (210) may contain $ZrO_2$ and $SiO_2$ at a substantially equal ratio. In that case, the sputtering target which substantially consists of the material expressed with the formula (220):

$$(ZrSiO_4)_a(Zn\text{—}S)_{100-a} \text{ (mol \%)} \tag{220}$$

wherein a is within the range of $33 \leq a \leq 67$, may be used. This sputtering target makes it possible to form the layer which consists of the material shown by the formula (22).

In any one of the above formulae (10), (110), (20), (210) and (220), (the number of S atoms)/(the number of Zn) is in the range of 1 to 2. Therefore, the sputtering target which consists of any one of the materials expressed with these formulae makes it possible to form the Zr—Zn—S—O-based material layer wherein (the number of S atoms)/(the number of Zn) is in the range of 1 to 2.

Preferably, this invention is characterized in that the dielectric layer is formed from $ZrO_2$—(Zn—S)-based material, $ZrO_2$—$SiO_2$—(Zn—S)-based material, or the $ZrSiO_4$—(Zn—S)-based material, in direct contact with the recording layer. According to this characteristic, by eliminating the interface layer which is provided between the recording layer and the dielectric layer in the prior art optical information recording medium, the number of layers can be reduced, while the optical information recording medium which has high reliability and ensures excellent overwrite cyclability and high recording sensitivity, can be realized. When the layer of any one of these materials is used as a dielectric layer for insulating a recording layer in the information recording medium to which an electric energy is applied, the phase change of the recording layer can be generated with a small electric energy.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE INVENTION

Hereafter, the embodiments of the present invention are described with reference to the accompanying drawings. The following embodiments are illustrative, and the present invention is not limited to the following embodiments.
(Embodiment 1)

Figure 1:
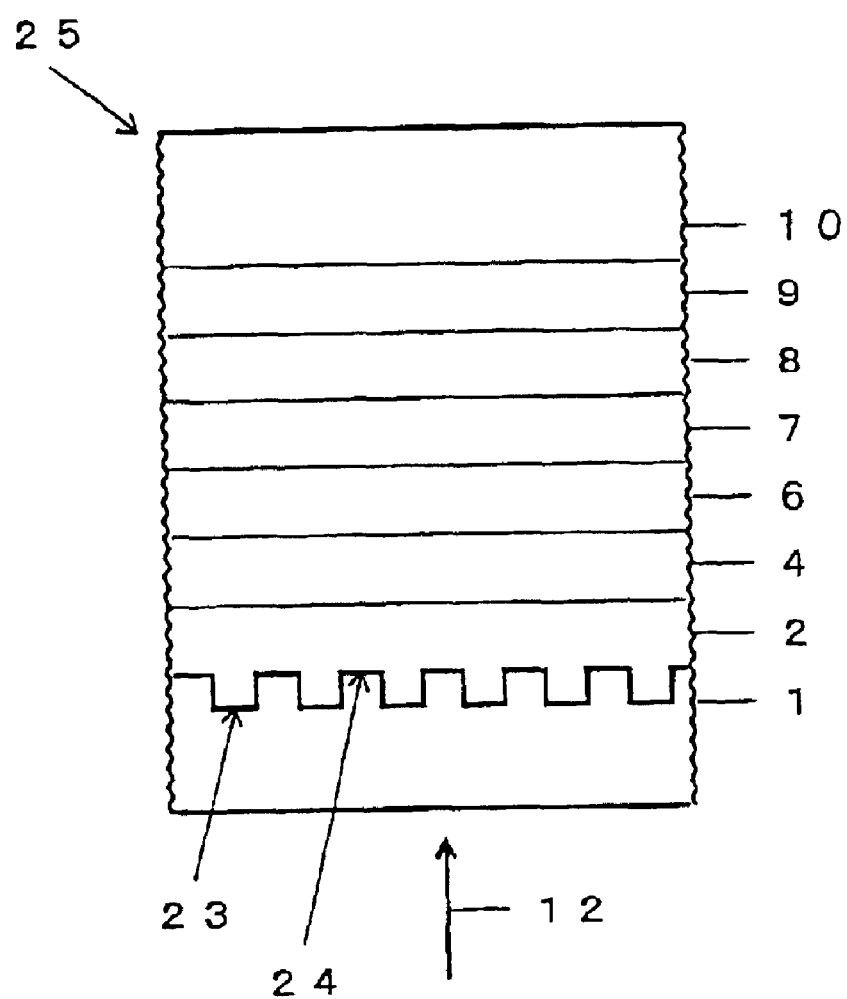
FIG. 1 is a fragmentary sectional view which shows an example of the optical information recording medium of the invention.

As Embodiment 1 of this invention, an example of the optical information recording medium on or from which information is recorded or reproduced by a laser beam, is described. FIG. 1 shows the partial cross section of the optical information recording medium.

The information recording medium 25 shown in FIG. 1 has a construction in which a first dielectric layer 2, a recording layer 4, a second dielectric layer 6, an optical compensation layer 7, and a reflective layer 8 are formed on one surface of a substrate 1 in this order, and a dummy substrate 10 is bonded with an adhesive layer 9. The information recording medium of this constitution can be used as a 4.7 GB DVD-RAM on or from which information is recorded or reproduced by a laser beam with a wavelength of about 660 nm in a red wavelength region. A laser beam 12 is applied to the information recording medium of this constitution from the substrate 1 side, and thereby, information is recorded and reproduced. The information recording medium 25 is different from the prior art information recording medium 31 shown in FIG. 9 in that it does not have the first interface layer 103 and the second interface layer 105.

In Embodiment 1, both of the first dielectric layer 2 and the second dielectric layer 6 are a Zr—Zn—S—O-based material layer.

Generally, it is required that the material for a dielectric layer 1) is transparent; 2) has a high melting point and does not melt at the time of recording; and 3) has good adhesiveness to the recording layer which is of chalcogenide material. Transparency is a characteristic necessary for allowing the laser beam 12 applied from the substrate 1 side to pass through the dielectric layer and to reach the recording layer 4. Particularly, this characteristic is required for the first dielectric layer on the laser incident side. The high melting point is a characteristic necessary for ensuring that the material of the dielectric layer is not immixed in the recording layer when applying the laser beam of a peak power level. If the material of the dielectric layer is immixed in the recording layer, overwrite cyclability deteriorates remarkably. Good adhesiveness to the recording layer which is of chalcogenide material is a characteristic necessary for ensuring reliability of the information recording medium. Further, it is necessary to select the material for the dielectric layer so that the information recording medium has recording sensitivity equivalent to or higher than the conventional information recording medium (that is, a medium wherein an interface layer is located between the dielectric layer consisting of ZnS-20 mol % $SiO_2$ and the recording layer).

It is preferable that the Zr—Zn—S—O-based material layer is a layer which substantially consists of a mixture of $ZrO_2$ and Zn—S. $ZrO_2$ is transparent and has a high melting point (about 2700° C.), and low thermal conductivity among oxides. Zn—S has good adhesiveness to the recording layer which is of chalcogenide material. Therefore, the information recording medium 25 which is excellent in overwrite cyclability with favorable adhesiveness between the recording layer and the dielectric layer can be realized by forming the first and the second dielectric layers 2 and 6 from the mixture of these two kinds of oxides in contact with the recording layer 4 as illustrated. The mixture of $ZrO_2$ and Zn—S is expressed with the above-mentioned formula (11), i.e. $(ZrO_2)_X(Zn{-}S)_{100-X}$ (mol %). It is preferable that the $ZrO_2$ content (that is, X) is 50 mol % or more in this mixture in order to ensure the overwrite cyclability of the medium. Further, it is preferable that the Zn—S content is 20 mol % or more in order to ensure the adhesiveness to the recording layer. Therefore, X is preferably in the range of 50 to 80. As mentioned in the above, Zn—S is a compound wherein (the number of S atoms)/(the number of Zn atoms) is in the range of 1 to 2.

The first and the second dielectric layers 2 and 6 may be a Zr—Zn—S—O-based material layer containing Si. Preferably, the Zr—Zn—S—O-based material layer containing Si substantially consists of a mixture of $ZrO_2$, Zn—S and $SiO_2$. This mixture is expressed with the above-mentioned formula (21), i.e. $(ZrO_2)_Y(SiO_2)_Z(Zn{-}S)_{100-Y-Z}$ (mol %). In this formula, X and Y are respectively within the range of $20 \leq Y \leq 70$, and $10 \leq Z \leq 50$, and satisfy $50 \leq Y+Z \leq 80$.

The Zr—Zn—S—O-based material layer containing $SiO_2$ enhances the recording sensitivity of the information recording medium. Moreover, the recording sensitivity can be adjusted by adjusting the ratio of $SiO_2$. In order to make the recording sensitivity higher by using $SiO_2$, the $SiO_2$ content in the mixture is preferably 10 mol % or more. On the other hand, since the adhesiveness to the recording layer 4 is reduced in the case where the $SiO_2$ content is high, the $SiO_2$ content is preferably 50 mol % or less. The function of $ZrO_2$ and Zn—S is as described above. By mixing $ZrO_2$ and Zn—S at a suitable ratio, the performance of the information recording medium is made suitable. In the case of the $ZrO_2$—$SiO_2$—(Zn—S) mixture, the Zn—S content is preferably 20 mol % or more. Further, Zn—S content is preferably 50 mol % or less so as not to cause the diffusion of S into the recording layer. Therefore, in the formula (21), Y+Z is preferably in the range of 50 to 80.

The Zr—Zn—S—O-based material layer containing Si may contains $ZrO_2$ and $SiO_2$ at substantially equal ratio. In that case, $ZrO_2$ and $SiO_2$ preferably forms $ZrSiO_4$. The mixture in which $ZrSiO_4$ is formed is expressed with the formula (22), i.e. $(ZrSiO_4)_A(Zn{-}S)_{100-A}$ (mol %). In this formula, A is within the range of $33 \leq A \leq 67$.

$ZrSiO_4$ is transparent and has a high melting point (about 2500° C.), and low thermal conductivity among oxides. Therefore, the information recording medium 25 which is excellent in overwrite cyclability with favorable adhesiveness between the recording layer and the dielectric layer can be realized by employing a layer of a combination of $ZrSiO_4$ and Zn—S that adheres to the recording layer well, as the first dielectric layer 2 and/or the second dielectric layer 6, and disposing the layer in contact with the recording layer 4. In order to ensure good overwrite cyclability, the $ZrSiO_4$ content in $ZrSiO_4$—(Zn—S) is preferably 33 mol % or more. In order to ensure good adhesiveness, the Zn—S content is preferably 33 mol % or more. Therefore, in the formula (22), A is preferably in the range of 33 to 67.

Further, in the Zr—Zn—S—O-based material layer, the number of S atoms may be larger than that of Zn atoms. The larger the number of S atoms is, the better the adhesiveness of the Zr—Zn—S—O-based material layer to the recording layer is. It is considered that this is because the excess S atoms which do not bond to Zn serve to improve the adhesiveness of the layer to the recording layer. On the other hand, the larger the number of S atoms is, the more S diffuse into the recording layer which result in deterioration of crystallization characteristic of the recording layer or in reduction of the optical change (i.e. |Rc−Ra|). Therefore, it is necessary to select the ratio (the number of S atoms)/(the number of Zn atoms), considering the adhesiveness to the recording layer and the degree of S diffusion into the recording layer.

The composition of the dielectric layer of the mixture of oxide and sulfide can be determined by a X-ray microanalyser (XMA) or Rutherford backscattering (RBS), and the structure of the layer can be analyzed by X-ray diffraction.

By analyzing the composition, the atomic % of each element is obtained. For example, when the material is expressed with the formula (11) wherein (the number of S atoms)/(the number of Zn atoms)=1 and X=50, the elementary composition thereof becomes approximately $Zr_{20}O_{40}Zn_{20}S_{20}$ (atomic %). When the material is expressed with the formula (11) wherein (the number of S atoms)/(the number of Zn atoms)=2 and X=80, the elementary composition thereof becomes approximately $Zr_{26.7}O_{53.3}Zn_{6.7}S_{13.3}$ (atomic %). These elementary compositions all satisfy the range of B, C, D and B+C+D in the formula (1).

When the material is expressed with the formula (21) wherein (the number of S atoms)/(the number of Zn atoms)=1, and Y=20 and Z=30, the elementary composition thereof becomes approximately $Zr_8Si_{12}O_{40}Zn_{20}S_{20}$ (atomic %). When the material is expressed with the formula (21) wherein (the number of S atoms)/(the number of Zn atoms)=2, and Y=70 and Z=10, the elementary composition thereof becomes approximately $Zr_{23.3}Si_{3.3}O_{53.3}Zn_{6.7}S_{13.4}$ (atomic %). These elementary compositions all satisfy the range of E, F, G, H and E+F+G+H in the formula (2).

When the material is expressed with the formula (22) wherein (the number of S atoms)/(the number of Zn atoms)=1, and A=33, the elementary composition thereof becomes approximately $Zr_{9.9}Si_{9.9}O_{39.8}Zn_{20.2}S_{20.2}$ (atomic %). When the material is expressed with the formula (22) wherein (the number of S atoms)/(the number of Zn atoms)=2, and A=67, the elementary composition thereof becomes approximately $Zr_{13.4}Si_{13.4}O_{53.4}Zn_{6.6}S_{13.2}$ (atomic %).

By changing each optical path length (that is, the product "nd" of refractive index n of a dielectric layer and the film thickness d of a dielectric layer), the first dielectric layer 2 and the second dielectric layer 6 serve to adjust optical absorptance Ac (%) of the recording layer 4 in a crystalline state and optical absorptance Aa (%) of the recording layer 4 in an amorphous state, adjust the optical reflectance Rc (%) of the information recording medium 25 when the recording layer 4 is in a crystalline state and the optical reflectance Ra (%) of the information recording medium 25 when the recording layer 4 is in an amorphous state, and adjust the phase difference Δϕ of the light of the information recording medium 25 between the portions where the recording layer 4 is in a crystalline state and an amorphous state. In order to improve signal quality by increasing the reproduced-signal amplitude of a record mark, it is desirable that a reflectance difference (|Rc−Ra|) or a reflectance ratio (Rc/Ra) is large. Further, it is desirable that Ac and Aa are also large so that the recording layer 4 may absorb a laser beam. The optical path length of each of the first dielectric layer 2 and the second dielectric layer 6 is determined so as to satisfy these conditions simultaneously. The optical path length which satisfies those conditions can be determined accurately, for example, by calculation based on a matrix method (for example, see "Wave Optics" by Hiroshi Kubota et al., Section 3, Iwanami Shinsho, 1971).

The Zr—Zn—S—O-based material described above has the refractive index which differs depending on the composition. In general, the material expressed with the formula (11) has a refractive index within the range of 2.3 to 2.4, the material expressed with the formula (2) has a refractive index within the range of 1.8 to 2.4, and the material expressed with the formula (22) has a refractive index within the range of 1.8 to 2.1. When setting the refractive index of a dielectric layer at n, the film thickness at d (nm), and the wavelength of the laser beam 12 at λ(nm), the optical path length "nd" is expressed with nd=aλ, wherein "a" is a positive number. In order to improve the signal quality by increasing the reproduced-signal amplitude of the record mark of the information recording medium 25, for example, it is preferable that Rc and Ra satisfy 15%≦Rc, and Ra≦2%, respectively. Moreover, in order to eliminate the mark distortion by overwriting, or to make it small, it is preferable that Ac and Aa satisfy 1.1≦Ac/Aa. The optical path length (aλ) of each of the first dielectric layer 2 and the second dielectric layer 6 was accurately calculated based on the matrix method so that these preferable conditions might be satisfied simultaneously. From the obtained optical path length (aλ), λ and n, the thickness d of each dielectric layer was calculated. As a result, it was found that the thickness of the first dielectric layer 2 is preferably in the range of 100 nm to 200 nm, and more preferably from 130 nm to 170 nm. Further, it was found that the thickness of the second dielectric layer 6 is preferably in the range of 20 nm to 70 nm, and more preferably from 30 nm to 60 nm.

The substrate 1 is usually a transparent disc-shaped plate. A guide groove for guiding a laser beam may be formed in the surface where the dielectric layer, the recording layer and so on may be formed. In the case where the guide groove is formed on the substrate, groove portions and land portions are formed, when the substrate is viewed in cross section. It can be said that a groove portion is located between two adjacent land portions. Therefore, the surface wherein the guide groove is formed has a top surface and a bottom surface which are connected by side walls. In this specification, the bottom surface is referred to as a "groove surface", whereas a top surface is referred to as a "land surface." Therefore, in FIGS. 1 to 6, the surface 23 corresponds to the "groove surface" and the surface 24 corresponds to the "land surface." When viewed from the direction of the laser beam 12, the groove surface is always located closer to the laser beam 12, whereas the land surface is always located away from the laser beam 12. Record marks are formed in the recording layer on the surface of the recording layer corresponding to the groove surface of the guide groove (groove recording), or on the surface of the recording layer corresponding to the land surface of the guide groove (land recording), or on both surfaces of the recording layer (land-groove recording). In the embodiment shown in FIG. 1, the distance in the thickness direction between the groove surface 23 and the land surface 24 (i.e. the depth of groove) is preferably in the range of 40 nm to 60 nm. The below-mentioned embodiments shown in FIGS. 2, 3 and 6, the distance in the thickness direction between the groove surface 23 and the land surface 24 is preferably in this range. Moreover, it is desirable that the surface where a layer is not formed is flat. As material for the substrate 1, a resin like a polycarbonate, amorphous polyolefin, or PMMA, or glass can be employed. Considering moldability, price and mechanical strength, a polycarbonate resin is preferably used. In the embodiment shown in FIG. 1, the thickness of the substrate 1 is in the range of about 0.5 to 0.7 mm.

The recording layer 4 is a layer where a phase change between a crystal phase and an amorphous phase is generated by irradiation of light or application of an electric energy, and record marks are formed. The erasure and overwrite can be carried out if the phase change is reversible. It is preferable to use Ge—Sb—Te or Ge—Sn—Sb—Te which is a rapid crystallization material, as a reversible phase change material. Specifically, GeTe—$Sb_2Te_3$ pseudo-binary composition is preferably used as Ge—Sb—Te. In this case, the composition preferably satisfy $4Sb_2Te_3$≦GeTe≦$25Sb_2Te_3$. In case of GeTe<$4Sb_2Te_3$, the variation in the amount of reflected light before and after recording is small, resulting in deterioration of the quality of a read-out signal. In case of $25Sb_2Te_3$<GeTe, the volume variation between a crystal phase and an amorphous phase is large, resulting in deterioration of overwrite cyclability. Ge—Sn—Sb—Te has a crystallization speed higher than Ge—Sb—Te. Ge—Sn—Sb—Te is, for example, a material in which Sn is substituted for part of Ge of GeTe—$Sb_2Te_3$ pseudo-binary composition. It is preferable that the content of Sn is 20 atomic % or less in the recording layer 4. If it exceeds 20 atomic %, the crystallization speed is too high and therefore, the stability of an amorphous phase is impaired, which results in deterioration of reliability of record marks. The content of Sn can be adjusted depending on the recording conditions.

The recording layer 4 may be formed from a material containing Bi such as Ge—Bi—Te, Ge—Sn—Bi—Te, Ge—Sb—Bi—Te, or Ge—Sn—Sb—Bi—Te. Bi more easily crystallizes than Sb. Therefore, the crystallization speed of the recording layer can be increased by substituting Bi for part of Sb.

Ge—Bi—Te is a mixture of GeTe and $Bi_2Te_3$. In this mixture it is preferable that $8Bi_2Te_3$≦GeTe≦$25Bi_2Te_3$. In case of GeTe<$8Bi_2Te_3$, the crystallization temperature is reduced, resulting in deterioration of archival characteristic. In case of $25Bi_2Te_3$<GeTe, the volume variation between a crystal phase and an amorphous phase is large, resulting in deterioration of overwrite cyclability.

Ge—Sn—Bi—Te is obtained by substituting Sn for part of Ge of Ge—Bi—Te. The crystallization speed can be controlled depending on the recording conditions by adjusting the content of Sn introduced by substitution. Substitution by Sn is suitable for fine adjustment of the crystallization speed compared with substitution by Bi. In the recording layer, the content of Sn is preferably 10 atomic % or less. If the content of Sn is more than 10 atomic %, the crystallization speed becomes too high, which reduces the stability of an amorphous phase, and therefore, the archival characteristic of record marks is deteriorated.

Ge—Sn—Sb—Bi—Te is obtained by substituting Sn for part of Ge of Ge—Sb—Te, and Bi for part of Sb of Ge—Sb—Te. This corresponds to a mixture of GeTe, SnTe, $Sb_2Te_3$ and $Bi_2Te_3$. As to this mixture, the crystallization speed can be controlled depending on the recording conditions, by adjusting the content of Sn and Bi introduced by substitution. In Ge—Sn—Sb—Bi—Te, it is preferable that $4(Sb—Bi)_2Te_3$≦(Ge—Sn)Te≦$25(Sb—Bi)_2Te_3$. In case of (Ge—Sn)Te<$4(Sb—Bi)_2Te_3$, the variation in the amount of reflected light before and after recording is small, resulting in deterioration of the quality of a read-out signal. In case of $25(Sb—Bi)_2Te_3$<(Ge—Sn)Te, the volume variation between a crystal phase and an amorphous phase is large, resulting in deterioration of overwrite cyclability. In the recording layer, the content of Bi is preferably 10 atomic % or less and the content of Si is preferably 20 atomic % or less. These Bi content and Si content make the archival characteristic of record marks good.

As the material in which a phase change is generated reversibly, Ag—In—Sb—Te, Ag—In—Sb—Te—Ge, and Ge—Sb—Te containing Sb in an amount of 70 atomic % or more may be employed.

As an irreversible phase change material, it is preferable to use $TeO_x+\alpha$ ($\alpha$ is Pd, Ge, or the like) as disclosed in Japanese Patent Publication No. 7-025209 B2. The information recording medium whose recording layer is of an irreversible phase change material is a so-called write-once type in which recording can be conducted only once. Also in such information recording medium, there are problems that the atom in the dielectric layer diffuses into the recording layer with heat at the time of recording, which results in the deterioration of the signal quality. Therefore, this invention is preferably applied to the write-once type information recording medium as well as the rewritable information recording medium.

As mentioned above, the recording layer 4 preferably has a thickness of 15 nm or less, and more preferably 12 nm or less.

The optical compensation layer 7 adjusts the ratio Ac/Aa of the optical absorptance Ac when the recording layer 4 is in a crystalline state, and the optical absorptance Aa when the recording layer 4 is in an amorphous state, and serves to suppress the distortion of the mark shape at the time of overwriting. It is preferable to form the optical compensation layer 7 from the material which has a high refractive index and absorbs a light moderately. For example, the optical compensation layer 7 may be formed using the material whose refractive index n is in the range of 3 to 6, and whose extinction coefficient k is in the range of 1 to 4. Specifically, it is preferable to use material selected from amorphous Ge alloys, such as Ge—Cr and Ge—Mo, amorphous Si alloys, such as Si—Cr, Si—Mo and Si—W, telluride, and crystalline metal, such as Ti, Zr, Nb, Ta, Cr, Mo, W, SnTe, PbTe and so on, semimetals, and semiconductor material. The film thickness of the optical compensation layer 7 is preferably in the range of 20 nm to 80 nm, and more preferably from 30 nm to 50 nm.

The reflective layer 8 has an optical function of increasing the quantity of light absorbed by the recording layer 4, and a thermal function of diffusing the heat generated in the recording layer 4 quickly to quench the recording layer 4, and thereby facilitate the amorphization of the recording layer 4. Further, the reflective layer 8 protects the multilayered film including the recording layer 4 and the dielectric layers 2 and 6 from the operation environment. As the material for the reflective layer 8, for example, the single-metal material with high thermal conductivity, such as Al, Au, Ag and Cu, is used. The reflective layer 8 may be formed from the material which contains another one or more elements in addition to one or more elements selected from the above-mentioned metallic material for the purpose of improving the moisture resistance and/or the purpose of adjusting thermal conductivity or an optical characteristic (for example, an optical reflectance, an optical absorptance or transmissivity). Specifically, an alloy material, such as Al—Cr, Al—Ti, Ag—Pd, and Ag—Pd—Cu, Ag—Pd—Ti, or Au—Cr, may be used. Each of these materials is excellent in corrosion resistance and has a quenching function. The similar purpose may be accomplished also by forming the reflective layer 8 in two or more layers. The thickness of the reflective layer 8 is preferably in the range of 50 to 180 nm, and more preferably from 60 nm to 100 nm.

In the illustrated information recording medium 25, the adhesive layer 9 is provided in order to adhere the dummy substrate 10 to the reflective layer 8. The adhesive layer 9 may be formed using a highly heat-resistant and highly adhesive material, for example, a bonding resin such as an ultraviolet-curing resin. Specifically, the adhesive layer 9 may be formed from an acrylic resin based material, or an epoxy resin based material. Moreover, if necessary, before forming the adhesive layer 9, a protective layer which consists of an ultraviolet-curing resin and has a thickness of 5 to 20 μm may be provided on the surface of the reflective layer 8. The thickness of the adhesive layer 9 is preferably in the range of 15 to 40 μm, and more preferably in the range of 20 to 35 μm.

The dummy substrate 10 enhances the mechanical strength of the information recording medium 25 and protects the multilayered body consisting of the layers from the first dielectric layer 2 to the reflective layer 8. The preferable material for the dummy substrate 10 is the same as that for the substrate 1. In the information recording medium 25 which includes the dummy substrate 10, it is preferable that the dummy substrate 10 and the substrate 1 are formed from the substantially same material and have the same thickness so as not to cause mechanical curvature and distortion.

The information recording medium of Embodiment 1 is a single-sided structure disc which has one recording layer. The information recording medium of this invention may have two recording layers. For example, an information recording medium of the double-sided structure is obtained by bonding two laminated pieces in which the layers up to the reflective layer 8 are stacked. The two pieces are bonded through an adhesive layer with the reflective layers 8 facing each other. In this case, the bonding of two pieces are carried out by forming the adhesive layer from a slow-acting resin and applying heat and pressure. In the case where the protective layer is provided on the reflective layer 8, an information recording medium of the double-sided structure is obtained by bonding two layered pieces in which the layers up to the protective layer are formed, with the protective layers facing each other.

Next, the method for producing the information recording medium 25 of Embodiment 1 is described. The information recording medium 25 is produced by carrying out the process in which the substrate 1 where the guide groove (the groove surface 23 and the land surface 24) is formed is set in a film-forming device, and then the first dielectric layer 2 is formed on the surface of the substrate 1 where the guide groove is formed (Process a), the process in which the recording layer 4 is formed (Process b), the process in which the second dielectric layer 6 is formed (Process c), the process in which the optical compensation layer 7 is formed (Process d), and the process in which the reflective layer 8 is formed (Process e) in this order, and further carrying out the process in which the adhesive layer 9 is formed on the surface of the reflective layer 8, and the process in which the dummy substrate 10 is bonded. In this specification including the following description, unless otherwise indicated, the "surface" of each layer means the surface (vertical to the thickness direction) which is exposed when each layer is formed.

First, Process a in which the first dielectric layer 2 is formed on the surface of the substrate 1 in which the guide groove is formed is carried out. Process a is carried out by sputtering. The sputtering is conducted in Ar gas atmosphere or in a mixed-gas atmosphere of Ar gas and oxygen using a high frequency electric power unit.

As the sputtering target used in Process a, the target which substantially consists of material which is expressed with the above formula (110), i.e. $(ZrO_2)_x(Zn-S)_{100-x}$ (mol %) wherein x is within the range of $50 \leq x \leq 80$, may be used. By using this target, the layer which substantially consists of the material expressed with the above-mentioned formula (11) is formed.

The sputtering target may substantially consist of material which is expressed with the formula (210), i.e. $(ZrO_2)_y$ $(SiO_2)_z(Zn-S)_{100-y-z}$ (mol %) wherein y and z are respectively within the range of $20 \leq y \leq 70$ and $10 \leq z \leq 50$, and satisfy $50 \leq y+z \leq 80$. By using this target, the layer which substantially consists of the material expressed with the above-mentioned formula (21) is formed.

The sputtering target may substantially consist of material which is expressed with the above-mentioned formula (220) i.e. $(ZrSiO_4)_a(Zn-S)_{100-a}$ (mol %) wherein a is within the range of $33 \leq a \leq 67$. By using this target, the layer which substantially consists of the material expressed with the formula (22) is formed.

Next, Process b is carried out by forming the recording layer 4 on the surface of the first dielectric layer 2. Process b is also carried out by sputtering. The sputtering is conducted in Ar gas atmosphere or in a mixed-gas atmosphere of Ar gas and $N_2$ gas using a direct-current power source. A sputtering target which contains any one material selected from Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te, and Sb—Te is used. The recording layer 4 after film formation is in an amorphous state.

Next, Process c is conducted by forming the second dielectric layer 6 on the surface of the recording layer 4. Process c is carried out in the same manner as Process a. The second dielectric layer 6 may be formed using a sputtering target consisting of a material which differs from that of the first dielectric layer 2.

Next, Process d is carried out by forming the optical compensation layer 7 on the surface of the second dielectric layer 6. In Process d, the sputtering is carried out using a direct-current power source or a high frequency electric power unit. A sputtering target which consists of a material selected from amorphous Ge alloys, such as Ge—Cr and Ge—Mo, amorphous Si alloys, such as Si—Cr and Si—Mo, telluride, and crystalline metal, such as Ti, Zr, Nb, Ta, Cr, Mo, W, SnTe and PbTe, semimetal, semiconductor material and so on, is used. Generally, the sputtering is conducted in Ar gas atmosphere.

Next, Process e is conducted by forming the reflective layer 8 on the surface of the optical compensation layer 7. Process e is carried out by sputtering. The sputtering is conducted in Ar gas atmosphere using a direct current power source or a high frequency electric power unit. A sputtering target which consists of alloy material, such as Al—Cr, Al—Ti, Ag—Pd, Ag—Pd—Cu, Ag—Pd—Ti, or Au—Cr, may be used.

As mentioned above, Processes a–e are all sputtering processes. Therefore, Processes a–e may be conducted successively by changing the target in order in one sputtering device. Alternatively, each of Processes a–e may be conducted using an independent sputtering device.

After forming the reflective layer 8, the substrate 1 on which the layers from the first dielectric layer 2 to the reflective layer 8 are formed in order is picked out from the sputtering device. Then, an ultraviolet-curing resin is applied to the surface of the reflective layer 8, for example, by a spin coat method. The dummy substrate 10 is stuck to the applied ultraviolet-curing resin. An ultraviolet ray is applied from the dummy substrate 10 side to cure the resin, whereby the bonding process is finished.

After finishing the bonding process, an initialization process is carried out if necessary. The initialization process is a process in which the temperature of the recording layer 4 which is in an amorphous state is raised to a temperature more than the crystallization temperature so as to crystallize the layer, for example, by irradiation of a semiconductor laser. The initialization process may be carried out before the bonding process. In this manner, the information recording medium 25 of Embodiment 1 can be produced by implementing Processes a–e, the process of forming the adhesive layer, and the bonding process of the dummy substrate in order.

(Embodiment 2)

Figure 2:
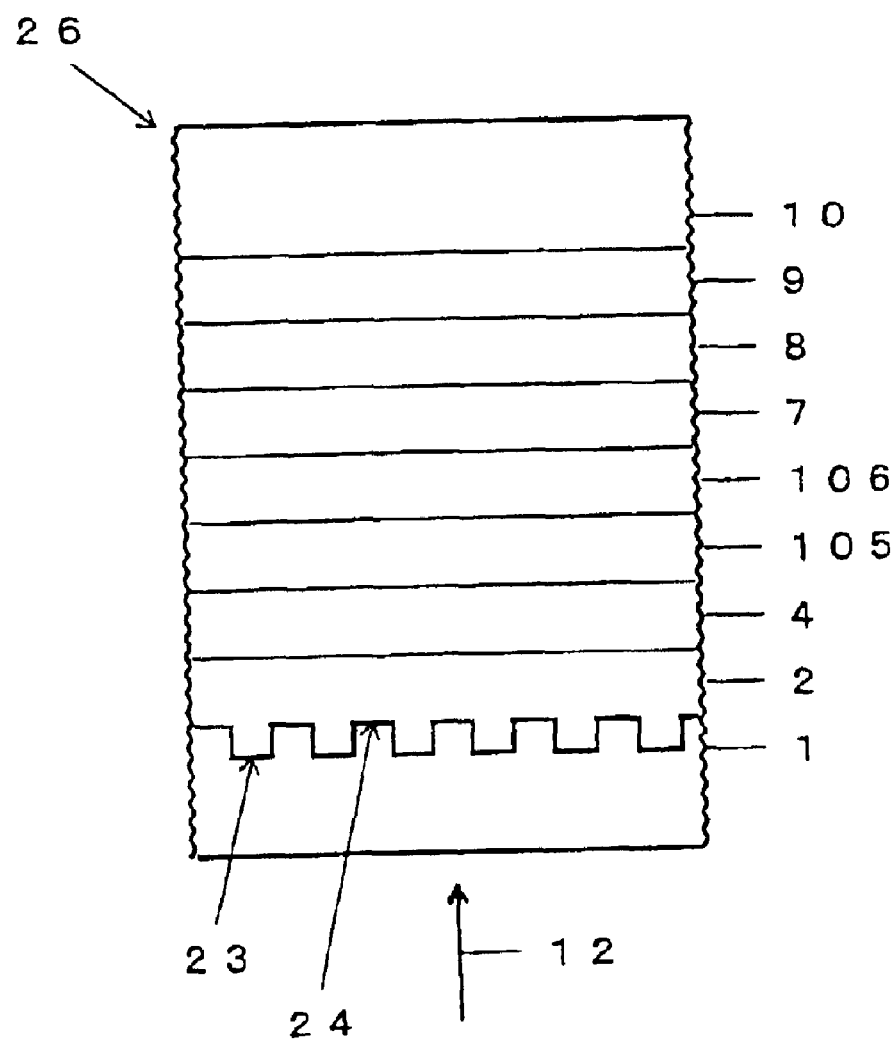
FIG. 2 is a fragmentary sectional view which shows another example of the optical information recording medium of the invention.

As Embodiment 2 of the present invention, another example of the optical information recording medium on or from which information is recorded or reproduced by using a laser beam, is described. FIG. 2 shows the partial cross section of the optical information recording medium.

The information recording medium 26 shown in FIG. 2 has a constitution in which a first dielectric layer 2, a recording layer 4, a second interface layer 105, a second dielectric layer 106, an optical compensation layer 7, and a reflective layer 8 are formed on one surface of a substrate 1 in this order, and furthermore a dummy substrate 10 is adhered with an adhesive layer 9. The information recording medium 26 shown in FIG. 2 is different from the prior art information recording medium 31 shown in FIG. 9 in that it does not have the first interface layer 103. Moreover, the information recording medium 26 is different from the information recording medium 25 of Embodiment 1 shown in FIG. 1 in that the second dielectric layer 106 is formed on the recording layer 4 with the second interface layer 105 therebetween. In the information recording medium 26, the first dielectric layer 2 is a Zr—Zn—S—O-based material layer like Embodiment 1. In addition, in FIG. 2, the reference numerals which are identical to those used in FIG. 1 denote identical components which are formed from the material and by the method described with reference to FIG. 1. Therefore, as to the components already described in connection with FIG. 1, the detailed description is omitted.

The information recording medium 26 of this embodiment has a constitution in which the second dielectric layer 106 is formed from ZnS-20 mol % $SiO_2$ used for the prior art information recording medium. Therefore, the second interface layer 105 is provided in order to prevent the material transfer caused between the second dielectric layer 106 and the recording layer 4 due to repeated recording. The second interface layer 105 is formed from nitride such as Si—N, Al—N, Zr—N, Ti—N, Ge—N, Cr—N or Ta—N, the nitride oxide containing one or more compounds of these, oxide such as $Al_2O_3$, $Cr_2O_3$, $HfO_2$, $SiO_2$, $Ta_2O_5$, $TiO_2$ or $ZrO_2$, carbon, carbide such as SiC, or fluoride such as $LaF_3$. The material obtained by mixing two or more compounds of these can be used. Examples of such material includes Ge—Cr—N, $ZrO_2$—$Cr_2O_3$, $ZrO_2$—$SiO_2$—C, $ZrO_2$—$SiO_2$—$Cr_2O_3$, $ZrO_2$—$SiO_2$—$Cr_2O_3$—$LaF_3$, $HfO_2$—$SiO_2$—$Cr_2O_3$, $HfO_2$—$SiO_2$—$Cr_2O_3$, $Ta_2O_5$—$Cr_2O_3$, $Ta_2O_5$—$Cr_2O_3$—$LaF_3$ and so on. Alternatively, the second interface layer 105 may be the Zr—Zn—S—O-based material layer. The thickness of the interface layer is preferably in the range of 1 to 10 nm, and more preferably from 2 to 5 nm. If the thickness of the interface layer is large, the recording and erasing performance is affected because of the change of the optical reflectance and the optical absorptance of the multilayered body which consists of the layers from the first dielectric layer 2 to the reflective layer 8 and is formed on the surface of the substrate 1.

Next, the method for producing the information recording medium 26 of Embodiment 2 is described. The information recording medium 26 is produced by carrying out the process in which the first dielectric layer 2 is formed on the surface of the substrate 1 on which the guide groove is formed (Process a), the process in which the recording layer 4 is formed (Process b), the process in which the second interface layer 105 is formed (Process f), the process in which the second dielectric layer 106 is formed (Process g), the process in which the optical compensation layer 7 is formed (Process d) and the process in which the reflective layer 8 is formed (Process e) in this order, and further carrying out the process in which the adhesive layer 9 is formed on the surface of the reflective layer 8, and the process in which the dummy substrate 10 is bonded. Since Processes a, b, d, and e are as described in relation to Embodiment 1, the description of these processes is omitted here. Hereafter, only the processes not carried out in the production of the information recording medium of Embodiment 1 are described.

Process f is a process which is carried out after forming the recording layer 4, in order to form the second interface layer 105 on the surface of the recording layer 4. Also in Process f, the sputtering is conducted. In Process f, the sputtering may be a reactive sputtering which is conducted, for example, in a mixed-gas atmosphere of Ar gas and $N_2$ gas, using a high frequency electric power unit and a sputtering target containing Ge. According to this reactive sputtering, the interface layer containing Ge—N is formed on the surface of the recording layer 4. Alternatively, in Process f, the sputtering is conducted in Ar gas atmosphere using a high frequency electric power unit and a sputtering target containing $ZrO_2$, so as to form the interface layer containing $ZrO_2$. Alternatively, in Process f, the sputtering is conducted in Ar gas atmosphere using a high frequency electric power unit and a sputtering target containing $ZrO_2$—$SiO_2$—$Cr_2O_3$, so as to form the interface layer containing $ZrO_2$—$SiO_2$—$Cr_2O_3$. Alternatively, in Process f, the sputtering is conducted in Ar gas atmosphere using a high frequency electric power unit and a sputtering target containing $LaF_3$, so as to form the interface layer containing $LaF_3$.

Next, Process g is carried out in order to form the second dielectric layer 106 on the surface of the second interface layer 105. In Process g, the sputtering is conducted, for example, in Ar gas atmosphere or a mixed-gas atmosphere of Ar gas and $O_2$ gas, using a high frequency electric power unit and a sputtering target consisting of ZnS-20 mol % $SiO_2$. Thereby, the layer consisting of ZnS-20 mol % $SiO_2$ is formed. After finishing the process in which the dummy substrate 10 is bonded, the initialization process is carried out if necessary as described in relation to Embodiment 1. The information recording medium 26 is thus obtained.

(Embodiment 3)

Figure 3:
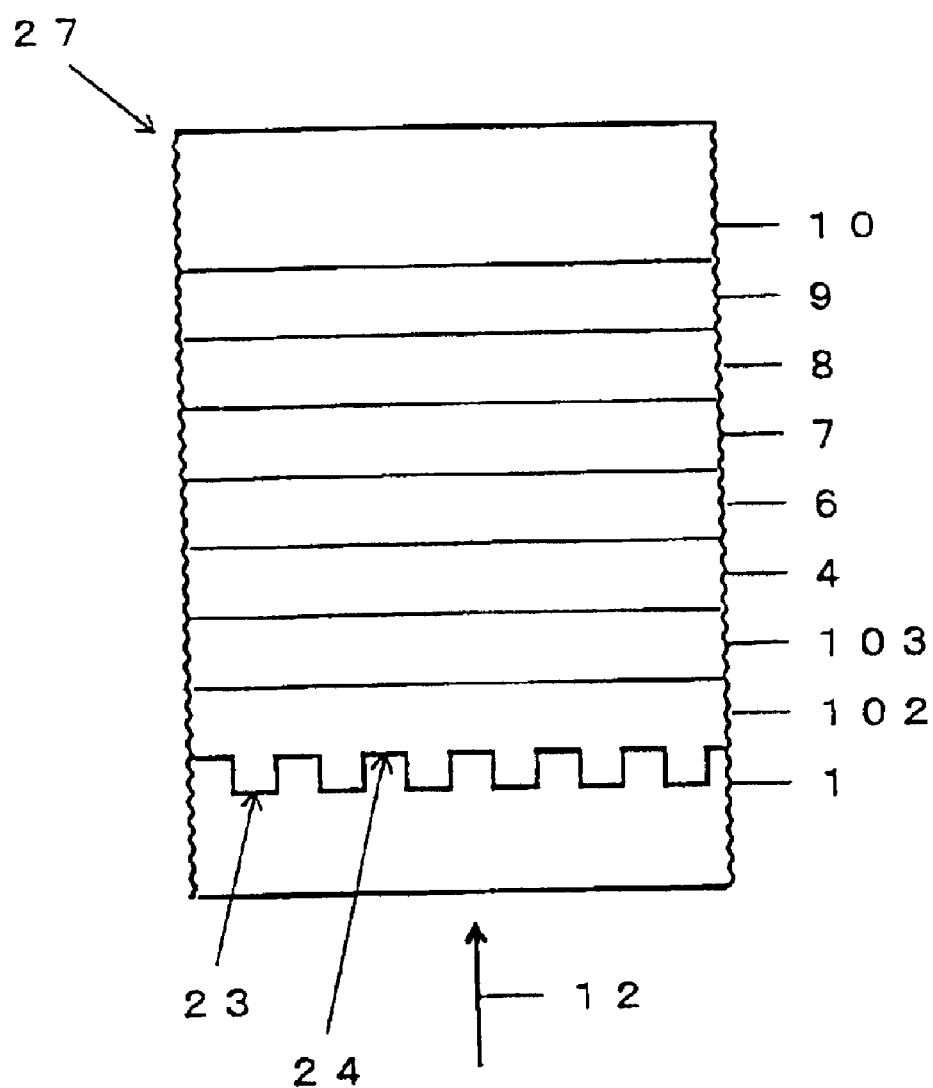
FIG. 3 is a fragmentary sectional view which shows further another example of the optical information recording medium of the invention.

As Embodiment 3 of the present invention, another example of the optical information recording medium on or from which information is recorded or reproduced by using a laser beam, is described. FIG. 3 shows the partial cross section of the optical information recording medium.

The information recording medium 27 shown in FIG. 3 has a constitution in which a first dielectric layer 102, a first interface layer 103, a recording layer 4, a second dielectric layer 6, an optical compensation layer 7, and a reflective layer 8 are formed on one surface of a substrate 1 in this order, and furthermore a dummy substrate 10 is bonded with an adhesive layer 9. The information recording medium 27 shown in FIG. 3 is different from the prior art information recording medium 31 shown in FIG. 9 in that it does not have the second interface layer 105. Moreover, the information recording medium 27 is different from the information recording medium 25 of Embodiment 1 shown in FIG. 1 in that the first dielectric layer 102 and the first interface layer 103 are formed between the substrate 1 and the recording layer 4 in this order. In the information recording medium 27, the second dielectric layer 6 is a Zr—Zn—S—O-based material layer like Embodiment 1. In addition, in FIG. 3, the reference numerals which are identical to those used in FIG. 1 denote identical components which are formed from the material and by the method described with reference to FIG. 1. Therefore, the detailed description as to the components already described in connection with FIG. 1, is omitted.

The information recording medium 27 of this embodiment has a constitution in which the first dielectric layer 102 is formed from ZnS-20 mol % $SiO_2$ used for the prior art information recording medium. Therefore, the first interface layer 103 is provided in order to prevent the material transfer caused between the first dielectric layer 102 and the recording layer 4 due to repeated recording. The preferable material and thickness of the first interface layer 103 are the same as those of the second interface layer 105 of the information recording medium 26 of Embodiment 2 described with reference to FIG. 2. Therefore, detailed description about it is omitted.

Next, the method for producing the information recording medium 27 of Embodiment 3 is described. The information recording medium 27 is produced by carrying out the process in which the first dielectric layer 102 is formed on the surface of the substrate 1 where the guide groove is formed (Process h), the process in which the first interface layer 103 is formed (Process i), the process in which the recording layer 4 is formed (Process b), the process in which the second dielectric layer 6 is formed (Process c), the process in which the optical compensation layer 7 is formed (Process d), and the process in which the reflective layer 8 is formed (Process e) in this order, and further carrying out the process in which the adhesive layer 9 is formed on the surface of the reflective layer 8, and the process in which the dummy substrate 10 is bonded. Since Processes b, c, d and e are as described in relation to Embodiment 1, the description of these processes is omitted here. Hereafter, only the processes not carried out in the production of the information recording medium of Embodiment 1 are described.

Process h is a process in which the first dielectric layer 102 is formed on the surface of the substrate 1. The method is the same as that of Process g which is described in relation to the producing method of Embodiment 2. Process i is a process in which the first interface layer 103 is formed on the surface of the first dielectric layer 102. The method is the same as that of Process f described in relation to the producing method of Embodiment 2. After finishing the process in which the dummy substrate 10 is bonded, the initialization process is carried out if necessary as described in relation to Embodiment 1. The information recording medium 27 is thus obtained.

(Embodiment 4)

Figure 4:
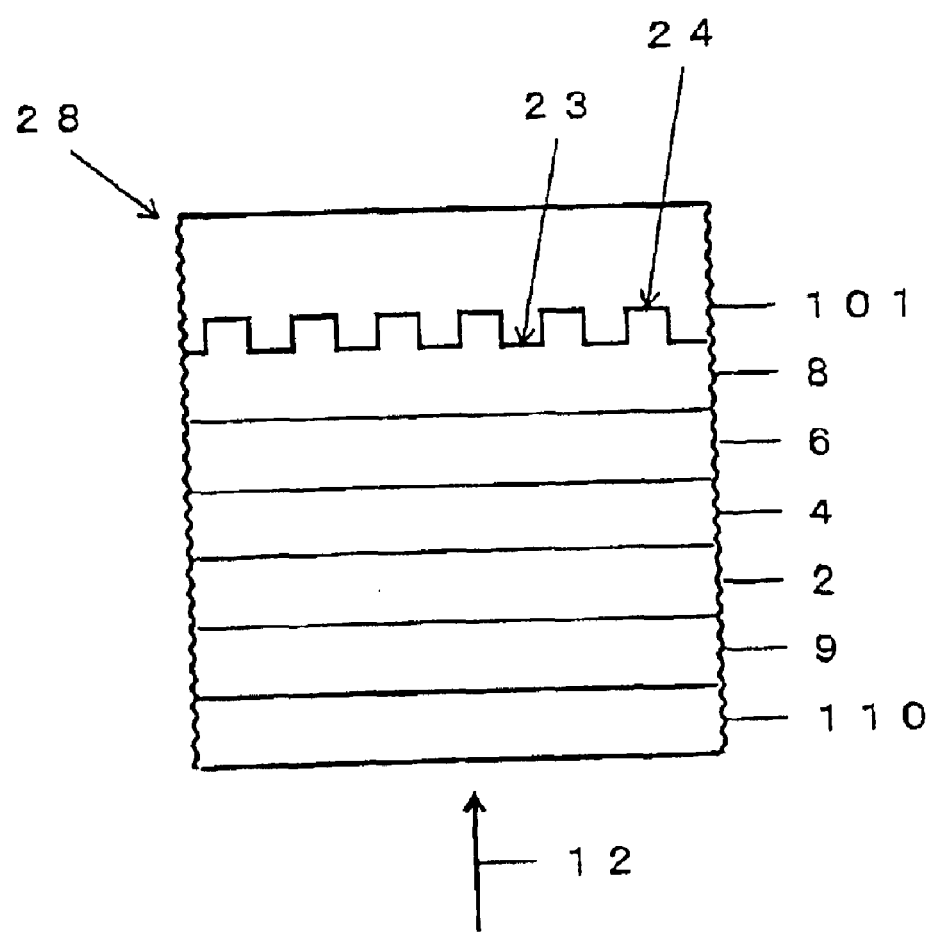
FIG. 4 is a fragmentary sectional view which shows further another example of the optical information recording medium of the invention.

As Embodiment 4 of the present invention, another example of the optical information recording medium on or from which information is recorded or reproduced by using a laser beam, is described. FIG. 4 shows the partial cross section of the optical information recording medium.

The information recording medium 28 shown in FIG. 4 has a constitution in which a reflective layer 8, a second dielectric layer 6, a recording layer 4, and a first dielectric layer 2 are formed on one surface of a substrate 101 in this order, and further a dummy substrate 110 is bonded with an adhesive layer 9. This information recording medium 28 is different from the prior art information recording medium 31 shown in FIG. 9 in that it does not have the first interface layer 103 and the second interface layer 105. Moreover, the information recording medium of this constitution is different from the information recording medium 25 which has the constitution shown in FIG. 1 in that it does not have the optical compensation layer 7.

A laser beam 12 is applied to the information recording medium 28 of this constitution from the dummy substrate 110 side, and thereby, information is recorded or reproduced. In order to make the recording density of the information recording medium high, it is necessary to form small record marks in the recording layer by narrowing a laser beam as well as using a laser beam of short wavelength. In order to narrow the beam, it is necessary to make the numerical aperture NA of an objective lens larger. However, a focal position becomes shallow when NA becomes large. Therefore, the substrate to which a laser beam is applied needs to be made thin. In the information recording medium 28 shown in FIG. 4, the thickness of the dummy substrate 110 can be made small, since the substrate 110 to which the laser beam is applied does not need to have a function as a support at the time of forming the recording layer and so on. Therefore, by employing this constitution, it is possible to obtain a large capacity information recording medium 28 on which information can be recorded with a higher density. Specifically, by employing this constitution, it is possible to obtain a 25 GB information recording medium on or from which information is recorded or reproduced by using a laser beam with a wavelength of about 405 nm in a bluish-violet wavelength region.

Also in this information recording medium, the first and the second dielectric layers 2 and 6 are a Zr—Zn—S—O-based material layer like Embodiment 1. A Zr—Zn—S—O-based material layer is used as the dielectric layer irrespective of the formation order of the reflective layer and so on, and recording capacity. Since the material contained in the Zr—Zn—S—O-based material layer is as described in relation to Embodiment 1, detailed description thereof is omitted.

As mentioned above, this information recording medium 28 is suitable for recording and reproducing by a laser beam of a short wavelength. Therefore, the thickness of each of the first and the second dielectric layers 2 and 6 is determined from a preferable optical path length on the assumption that λ is, for example, 405 nm. In order to improve signal quality by increasing the reproduced signal amplitude of the record mark on the information recording medium 28, the optical path length "nd" of each of the first dielectric layer 2 and the second dielectric layer 6 is strictly determined by calculation based on the matrix method so as to satisfy, for example, 20%≦Rc, and Ra≦5%. As a result, when the Zr—Zn—S—O-based material layer having the above refractive index is made into the first and the second dielectric layers 2 and 6, it was found that the thickness of the first dielectric layer 2 is preferably in the range of 30 nm to 100 nm, and more preferably from 50 nm to 80 nm. Moreover, It was found that the thickness of the second dielectric layer 6 is preferably in the range of 3 nm to 50 nm, and more preferably from 10 nm to 30 nm.

The substrate 101 is a transparent disc-shaped plate like the substrate 1 of Embodiment 1. The diameter of the substrate 101 is in the range of 50 mm to 120 mm. The guide groove for guiding a laser beam may be formed in the surface of substrate 101 where the reflective layer and so on is formed. When forming the guide groove, like Embodiment 1, the surface 23 is referred to as the "groove surface", whereas the surface 24 is referred to as the "land surface." In the substrate 101, the distance in the thickness direction between the groove surface 23 and the land surface 24 (i.e. the depth of groove) is preferably in the range of 10 nm to 30 nm, and more preferably from 15 nm to 25 nm. Moreover, it is desirable that the surface where a layer is not formed is flat. The material for the substrate 1 of Embodiment 1 can be used as the material for the substrate 101. Preferably, the thickness of the substrate 101 is in the range of about 0.8 to 1.2 mm. The preferable thickness of the substrate 101 is larger than that of the substrate 1 of Embodiment 1. This is because, as mentioned below, the thickness of the dummy substrate 110 is thin, and therefore, the substrate 101 needs to ensure the strength of the information recording medium.

The dummy substrate 110 is a transparent disc-shaped plate like the substrate 101. As mentioned above, by employing the constitution shown in FIG. 4, it is possible to record information with the laser beam of a short wavelength by making the thickness of the dummy substrate 110 small. Therefore, the thickness of the dummy substrate 110 is preferably in the range of 40 µm to 110 µm. More preferably, the thickness of the adhesive layer 9 and the dummy substrate 110 in total is in the range of 50 µm to 120 µm.

Since the dummy substrate 110 is thin, the substrate is preferably formed from a resin like a polycarbonate, an amorphous polyolefin, or PMMA. The polycarbonate is particularly preferable. Moreover, since the dummy substrate 110 is located so that the laser-beam 12 reaches it first, it is preferable that the substrate has an optical characteristic of small birefringence with respect to a light in a short wavelength region.

The reflective layer 8 may be formed in the same manner as the reflective layer 8 of Embodiment 1. The thickness and the material of the reflective layer 8 of Embodiment 4 may be the same as those of the reflective layer 8 of Embodiment 1. In the illustrated embodiment when the reflective layer 8 is formed from the material containing Ag, the reflective layer has a two-layer structure or a structure which includes more than two layers, in order to prevent S contained in the second dielectric layer 6 and Ag contained in the reflective layer 8 from forming $Ag_2S$. The reflective layer of two-layer structure is formed for example, by forming a layer of Ag—Pd—Cu on the surface of the substrate 101 and then a layer of Al—Cr thereon. In this case, the second dielectric layer 6 is formed on the surface of the layer of Al—Cr. The Al—Cr layer prevents S in the second dielectric layer and Ag in the reflective layer from reacting. The layer located between the second dielectric layer 6 and the layer containing Ag preferably has a thickness of 5 nm or more.

Preferably, the adhesive layer 9 is formed from a transparent ultraviolet-curing resin. The thickness of the adhesive layer 9 is preferably in the range of 5 to 15 µm. The dummy substrate 110 can be omitted, when the adhesive layer 9 also provides the function of the dummy substrate 110 and is formed so as to have a thickness in the range of 50 µm to 120 µm.

In addition, the components identified with the reference numeral which is identical to those used in Embodiment 1 are as already described in relation to Embodiment 1, and therefore the description thereof is omitted.

In a variation of the information recording medium of this embodiment, for example, only the first dielectric layer is formed from a Zr—Zn—S—O-based material layer, and the second dielectric layer is formed from ZnS- 20 mol % $SiO_2$, and the second interface layer is formed between the second dielectric layer and the recording layer. In that case, when the reflective layer contains Ag, it is preferable to make the reflective layer a two-layer structure in order to prevent S in the second dielectric layer from reacting with Ag in the reflective layer. Moreover, in another variation of the information recording medium of Embodiment 4, only the second dielectric layer is formed from a Zr—Zn—S—O-based material, and the first dielectric layer is formed from ZnS-20 mol % $SiO_2$, and the first interface layer is formed between the first dielectric layer and the recording layer.

Next, the method for producing the information recording medium 28 of Embodiment 4 is described. The information recording medium 28 is produced by carrying out the process in which the substrate 101 where the guide groove (the groove surface 23 and the land surface 24) is formed is set in a film-forming device, and the reflective layer 8 is formed on the surface of the substrate 101 on which the guide groove is formed (Process e), the process in which the second dielectric layer 6 is formed (Process c), the process in which the recording layer 4 is formed (Process b), and the process in which the first dielectric layer 2 is formed (Process a) in this order, and further carrying out the process in which the adhesive layer 9 is formed on the surface of the first dielectric layer 2, and the process in which the dummy substrate (110) is bonded.

First, Process e is carried out in order to form the reflective layer 8 on the surface of the substrate 101 where the guide groove is formed. The method for carrying out Process e is as described in relation to Embodiment 1. Next, Process c, Process b, and Process a are carried out in this order. The method for carrying out Processes c, b, and a is as described in relation to Embodiment 1. In the producing method of the information recording medium of this embodiment, the order of carrying out each process differs from that in the producing method of the information recording medium of Embodiment 1.

After forming the first dielectric layer 2, the substrate 101 on which the layers from the reflective layer 8 to the first dielectric layer 2 are stacked in order is picked out from the sputtering device. Then, an ultraviolet-curing resin is applied on the first dielectric layer 2, for example, by a spin coat method. The dummy substrate 110 is stuck to the applied ultraviolet-curing resin. An ultraviolet ray is applied from the dummy substrate 110 side to cure the resin, whereby the bonding process is finished. The process for bonding the dummy substrate 110 can be omitted by forming the adhesive layer 9 into thickness of 60 μm to 120 μm and applying an ultraviolet ray thereto.

After finishing the bonding process, the initialization process is conducted if necessary. The method of the initialization process is as described in relation to Embodiment 1.

(Embodiment 5)

Figure 5:
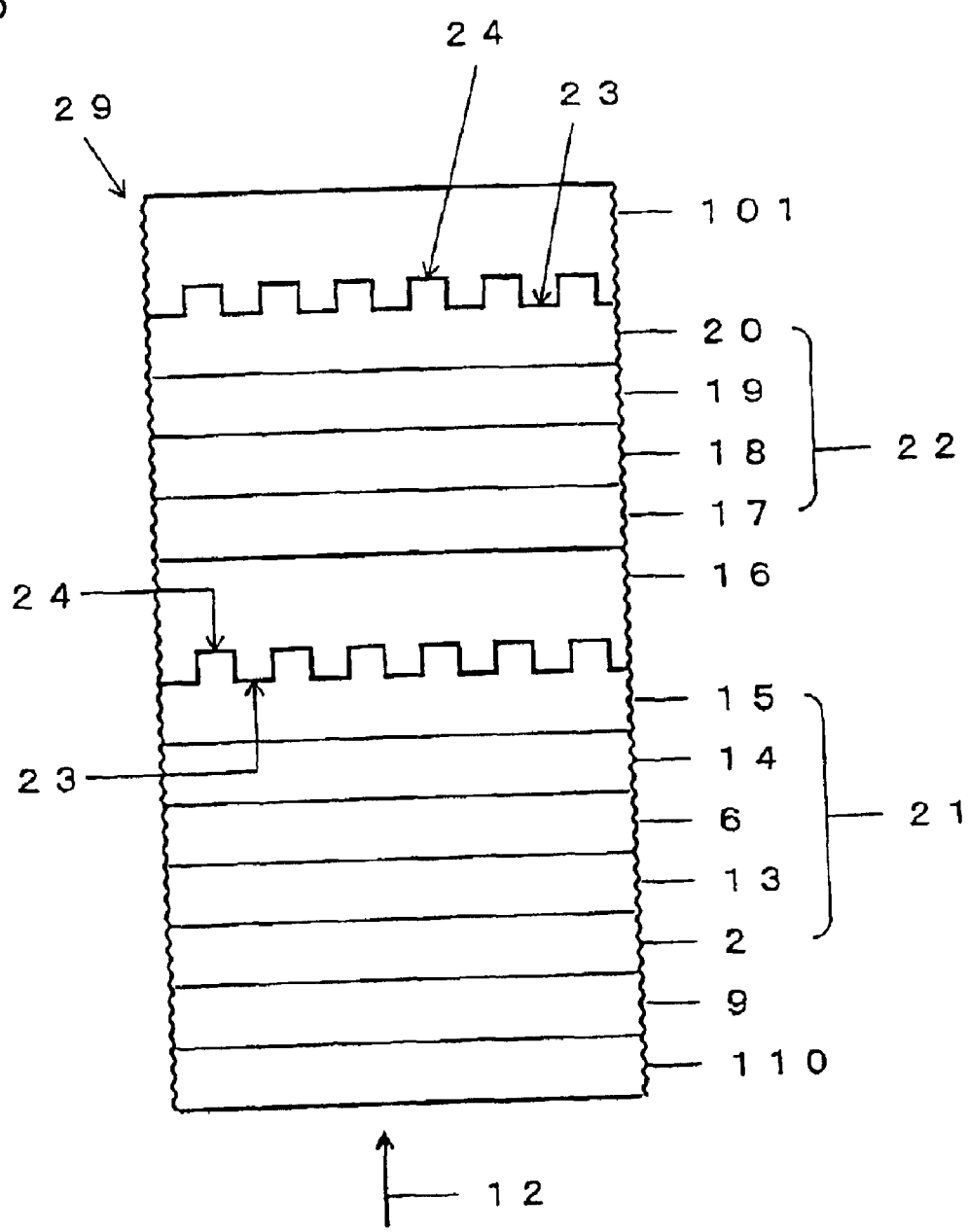
FIG. 5 is a fragmentary sectional view which shows further another example of the optical information recording medium of the invention.

As Embodiment 5, another example of the optical information recording medium on or from which information is recorded or reproduced by using a laser beam, is described. FIG. 5 shows the partial cross section of the optical information recording medium.

The information recording medium 29 shown in FIG. 5 has a constitution in which a second information layer 22, an intermediate layer 16, and a first information layer 21 are formed on one surface of a substrate 101 in this order, and furthermore a dummy substrate 110 is bonded with an adhesive layer 9. In detail, the second information layer 22 is formed by stacking a second reflective layer 20, a fifth dielectric layer 19, a second recording layer 18, and a fourth dielectric layer 17 on one surface of the substrate 101 in this order. The intermediate layer 16 is formed on the surface of the fourth dielectric layer 17. The first information layer 21 is formed by stacking a third dielectric layer 15, a first reflective layer 14, a second dielectric layer 6, a first recording layer 13, and a first dielectric layer 2 on the surface of the intermediate layer 16 in this order. Also in this embodiment, a laser beam 12 is applied from the dummy substrate 110 side. Moreover, in the information recording medium of this embodiment, information can be recorded in each of the two recording layers. Therefore, by employing this constitution, the information recording medium which has about double the capacity of Embodiment 4, can be obtained. Specifically, by employing this constitution, it is possible to obtain a 50 GB information recording medium in which information is recorded by a laser beam with a wavelength of about 405 nm in a bluish-violet wavelength region.

The recording in and reproducing from the first information layer 21 is conducted by the laser beam 12 which has passed through the dummy substrate 110. The recording in and reproducing from the second information layer 22 is conducted by the laser beam 12 which has passed through the dummy substrate 110, the first information layer 21, and the intermediate layer 16.

Also in the information recording medium 29 of the embodiment shown in FIG. 5, the fifth dielectric layer 19, the fourth dielectric layer 17, the second dielectric layer 6, and the first dielectric layer 2 are preferably all a Zr—Zn—S—O-based material layer. If this material layer is used, it is not necessary to form an interface layer between the first recording layer 13 and the first dielectric layers 2, between the first recording layer 13 and the second dielectric layer 6, between the second recording layer 18 and the fourth dielectric layer 17, and between the second recording layer 18 and the fifth dielectric layer 19. Since the material for the Zr—Zn—S—O-based material layer is as described in relation to Embodiment 1, the detailed description thereof is omitted.

Each of the fifth dielectric layer 19 and the second dielectric layer 6 serves as a thermal insulating layer between the reflective layer and the recording layer. The film thickness of each of the fifth and the second dielectric layers 19 and 6 is preferably in the range of 3 nm to 50 nm, and more preferably from 10 nm to 30 nm.

The film thickness of each of fourth and the first dielectric layers 17 and 2 is preferably in the range of 30 nm to 100 nm, and more preferably from 50 nm to 80 nm.

Thus, also in the information recording medium of the single-sided dual-layer structure shown in FIG. 5, the Zr—Zn—S—O-based material layer makes it possible to form the dielectric layer located on both sides of the recording layer in direct contact with the recording layer without the interface layer. Therefore, according to this invention the number of the layers which compose the whole medium can be reduced, also as to the information recording medium of the single-sided dual-layer structure.

The third dielectric layer 15 is located between the intermediate layer 16 and the first reflective layer 14. The third dielectric layer 15 is preferably transparent and has a high refractive index ($2.3 \leq n$) so that it may serve to enhance the transmissivity of the first information layer 21. Moreover, the third dielectric layer 15 preferably consists of the material with higher thermal conductivity so that it serves to diffuse the heat of the first recording layer 13 quickly, like the reflective layer. The material which satisfies these conditions is $TiO_2$ and $Cr_2O_3$. A mixture of $TiO_2$ and $Cr_2O_3$ wherein the ratio of $Cr_2O_3$ is 40 mol % or more may be used. The film thickness of the third dielectric layer 15 is preferably in the range of 10 nm to 30 nm.

The substrate 101 is the same as the substrate 101 of Embodiment 4. Therefore, the detailed description about the substrate 101 is omitted here.

The second reflective layer 20 is the same as the reflective layer 8 of Embodiment 1. Further, the second recording layer 18 is the same as the recording layer 4 of Embodiment 1. Therefore, the detailed description about the second reflective layer 20 and the second recording layer 18 is omitted here.

The intermediate layer 16 is provided in order to make the focal position of the laser beam in the first information layer 21 significantly differ from the focal position in the second information layer 22. In the intermediate layer 16, the guide groove is optionally formed on the first information layer 21 side. The intermediate layer 16 can be formed from an ultraviolet-curing resin. It is desirable that the intermediate layer 16 is transparent with respect to the light of the wavelength λ used for recording and reproducing information so that the laser beam 12 can reach the second information layer 22 efficiently. The thickness of the intermediate layer 16 needs to be equal to or more than the focal depth ΔZ determined by the numerical aperture NA of an objective lens and the laser beam wavelength λ. ΔZ can be approximated to be $\Delta Z = \lambda/\{2(NA)^2\}$. When λ is 405 nm, and NA is 0.85, ΔZ becomes ΔZ=0.28 μm. Further, since the range within ±0.3 μm of this value is included in the range of focal depth, the intermediate layer 16 needs to have a thickness of 0.8 μm or more. Furthermore, the total thickness of the intermediate layer 16 and the dummy substrate 110 is preferably set within a tolerance of substrate thickness acceptable to the objective lens to be used, so that the distance between the first recording layer 13 of the first information layer 21 and second recording layer 18 of the second information layer 22 may be within the range where the objective lens can concentrate light. Therefore, the thickness of the intermediate layer is preferably in the range of 10 μm to 40 μm.

If necessary, the intermediate layer 16 may be constituted by stacking a plurality of resin layers. Specifically, it may have a two-layer structure consisting of a layer which protects the fourth dielectric layer 17, and a layer which has a guide groove.

The first reflective layer 14 serves to diffuse the heat of the first recording layer 13 quickly. When information is recorded in or reproduced from the second information layer 22, the laser beam 12 which has passed through the first information layer 21 is used. For this reason, the first information layer 21 needs to have a high transmissivity as a whole, and preferably has a transmissivity of 45% or more. Therefore, the first reflective layer 14 is limited in the material and the thickness, compared with the second reflective layer 20. In order to decrease optical absorption by the first reflective layer 14, it is desirable that the first reflective layer 14 has a small thickness, a low extinction coefficient, and high thermal conductivity. Specifically, it is preferable that the first reflective layer 14 is made of an alloy containing Ag, and is formed into a film of which thickness is in the range of 5 nm to 15 nm. In the case where the first reflective layer 14 contains Ag and the second dielectric layer is a Zr—Zn—S—O-based material layer, a substantially transparent layer which does not contain S and has a thickness in the range of about 5 nm to 10 nm is preferably formed between the first reflective layer 14 and the second dielectric layer 6 in order to prevent Ag in the layer 14 from reacting with S in the layer 6. Such layer is formed from, for example, $TiO_2$, $Cr_2O_3$ or $Cr_2O_3$—$ZrO_2$ (40 mol % ≦ $Cr_2O_3$).

In order to ensure the high transmissivity of the first information layer 21, the first recording layer 13 is also limited in the material and film thickness, compared with the second recording layer 18. The first recording layer 13 is preferably formed so that the average of the transmittance of the crystal phase and the transmittance of the amorphous phase becomes 45% or more. Therefore, the film thickness of the first recording layer 13 is preferably 7 nm or less. The material which constitutes the first recording layer 13 is selected so that even if the layer is such a thin film, it is ensured that good record marks are formed by melting and quenching, and thereby the signal with high quality is reproduced, and that record marks are erased by temperature rising and gradual cooling. Specifically, it is preferable to form the first recording layer 13 from a reversible phase change material, for example, Ge—Sb—Te such as GeTe—$Sb_2Te_3$-based material, Ge—Sn—Sb—Te obtained by substituting Sn for part of Ge of GeTe—$Sb_2Te_3$-based material, Ge—Bi—Te, Ge—Sn—Bi—Te, Ge—Sb—Bi—Te, or Ge—Sn—Sb—Bi—Te.

The adhesive layer 9 is preferably formed from a transparent ultraviolet-curing resin like the adhesive layer 9 of Embodiment 4. The thickness of the adhesive layer is preferably in the range of 5 to 15 μm.

The dummy substrate 110 is the same as the dummy substrate 110 of Embodiment 4. Therefore, the detailed description about the dummy substrate is omitted here. Also in this embodiment, the dummy substrate 110 can also be omitted, when the adhesive layer 9 also serves as the dummy substrate 110 and can be formed so as to have a thickness of 50 μm to 120 μm.

The information recording medium of a constitution having two information layers each of which has a recording layer is described above. The information recording medium which has a plurality of recording layers is not limited to this constitution. The medium can also have a constitution including three or more information layers. Further, in a variation of the illustrated embodiment, for example, one of the two information layers has one recording layer in which a reversible phase change is generated, and the other has one recording layer in which an irreversible phase change is generated.

Moreover, in a variation of the information recording medium which has three information layers, one is made into the read-only information layer, another has a recording layer in which a reversible phase change is generated, and the other has a recording layer in which an irreversible phase change is generated. Thus, there are many variations of the information recording medium which has two or more information layers. Also in any form, by forming a dielectric layer from a Zr—Zn—S—O-based material layer, the need of providing an interface layer between the recording layer and the dielectric layer can be eliminated.

Next, the method for producing the information recording medium 29 of Embodiment 5 is described. The information recording medium 29 is produced by carrying out the process in which the second reflective layer 20 is formed on the substrate 101 (Process j), the process in which the fifth dielectric layer 19 is formed (Process k), the process in which the second recording layer 18 is formed (Process l), and the process in which the fourth dielectric layer 17 is formed (Process m) in this order, and then carrying out the process in which the intermediate layer 16 is formed on the surface of the fourth dielectric layer 17, and further carrying out the process in which the third dielectric layer 15 is formed on the surface of the intermediate layer 16 (Process n), the process in which the first reflective layer 14 is formed (Process o), the process in which the second dielectric layer 6 is formed (Process p), the process in which the first recording layer 13 is formed (Process q), and the process in which the first dielectric layer 2 is formed (Process r) in this order, and furthermore carrying out the process in which the adhesive layer 9 is formed on the surface of the first dielectric layer 2, and the process in which the dummy substrate 110 is bonded.

Processes j to m correspond to the processes for forming the second information layer 22. Process j is a process in which the second reflective layer 20 is formed on the surface of the substrate 101 where the guide groove is formed. Process j is carried out in the same manner as Process e in the production of Embodiment 1. Next, Process k is carried out in order to form the fifth dielectric layer 19 on the surface of the second reflective layer 20. Process k is carried out in the same manner as Process c in the production of Embodiment 1. Next, Process 1 is carried out to form the second recording layer 18 on the surface of the fifth dielectric layer 19. Process 1 is carried out in the same manner as Process b in the production of Embodiment 1. Finally, Process m is carried out in order to form the fourth dielectric layer 17 on the surface of the second recording layer 18. Process m is carried out in the same manner as Process a in the production of Embodiment 1.

The substrate 101 on which the second information layer 22 is formed according to Processes j to m is picked out from the sputtering device, and then the intermediate layer 16 is formed. The intermediate layer 16 is formed according to the following procedures. First, an ultraviolet-curing resin is applied to the surface of the fourth dielectric layer 17 by, for example, a spin coat method. Next, a polycarbonate substrate on which the guide groove is formed is stuck to the ultraviolet-curing resin with the guide groove side in contact with the resin. After applying an ultraviolet ray and curing the resin, the polycarbonate substrate on which the guide groove is formed is peeled. Thereby, the guide groove is transferred to the ultraviolet-curing resin, and the intermediate layer 16 which has the illustrated guide groove is formed. Alternatively, the intermediate layer 16 may be formed by forming a layer from an ultraviolet-curing resin which protects the fourth dielectric layer 17, and then forming a layer having a guide groove thereon. In this case, the intermediate layer to be obtained has a two-layer structure.

The substrate 101 on which the layers up to the intermediate layer 16 are formed is again placed in a sputtering device, and then the first information layer 21 is formed on the surface of the intermediate layer 16. The processes for forming the first information layer 21 correspond to Processes n to r.

Process n is a process in which the third dielectric layer 15 is formed on the surface of the intermediate layer 16 on which the guide groove is formed. In Process n, the sputtering is conducted in Ar gas atmosphere or in a mixed-gas atmosphere of Ar gas and $O_2$ gas, using a high frequency electric power unit and a sputtering target consisting of $TiO_2$ or $Cr_2O_3$. Alternatively, in Process n, the sputtering may be carried out in Ar gas atmosphere using a sputtering target consisting of a mixture of $ZrO_2$ and $Cr_2O_3$. Alternatively, in Process n, a reactive sputtering may be carried out in a mixed-gas atmosphere of Ar gas and $O_2$ gas using a sputtering target consisting of Ti or Cr.

Next, Process o is carried out in order to form the first reflective layer 14 on the surface of the third dielectric layer 15. In Process o, the sputtering is conducted in Ar gas atmosphere, using a direct current power source and a sputtering target of the alloy containing Ag. Before carrying out Process p, Process n is carried out again. This process corresponds to a process of forming a layer which prevents a reaction of S and an element such as Ag which is contained in the first reflective layer 14 and reacts with S.

Then, Process p is carried out in order to form the second dielectric layer 6 on the surface of 14 of the first reflective layer 14. Process p is carried out in the same manner as Process k.

Next, Process q is carried out in order to form the first recording layer 13 on the surface of the second dielectric layer 6. In Process q the sputtering is conducted in Ar gas atmosphere or in a mixed-gas atmosphere of Ar gas and $N_2$ gas, using a direct current power source and a sputtering target which contains a material selected from Ge—Sb—Te, Ge—Sn—Sb—Te, Ge—Bi—Te, Ge—Sn—Bi—Te, Ge—Sb—Bi—Te, and Ge—Sn—Sb—Bi—Te.

Next, Process r is carried out in order to form the first dielectric layer 2 on the surface of the first recording layer 13. Process r is carried out in the same manner as Process m. Thus, the first information layer 21 is formed by carrying out Processes n to r in this order.

The substrate 101 on which the first information layer 21 are formed is picked out from the sputtering device. Then, an ultraviolet-curing resin is applied to the surface of the first dielectric layer 2, for example, by a spin coat method. The dummy substrate 110 is stuck to the applied ultraviolet-curing resin. An ultraviolet ray is applied from the dummy substrate 110 side to cure the resin, whereby the bonding process is finished. Also in the producing method of the information recording medium of Embodiment 5, the process of bonding the dummy substrate 110 can also be omitted in the same manner as the producing method of the information recording medium of Embodiment 4.

After finishing the bonding process, the initialization process of the second information layer 22 and the first information layer 21 is carried out if necessary. The Initialization process of the second information layer 22 may be carried out before or after forming the intermediate layer, and the initialization process of the first information layer 21 may be carried out before or after the bonding process of the dummy substrate 110. The method for carrying out the initialization process is as described in relation to Embodiment 1.

(Embodiment 6)

Figure 6:
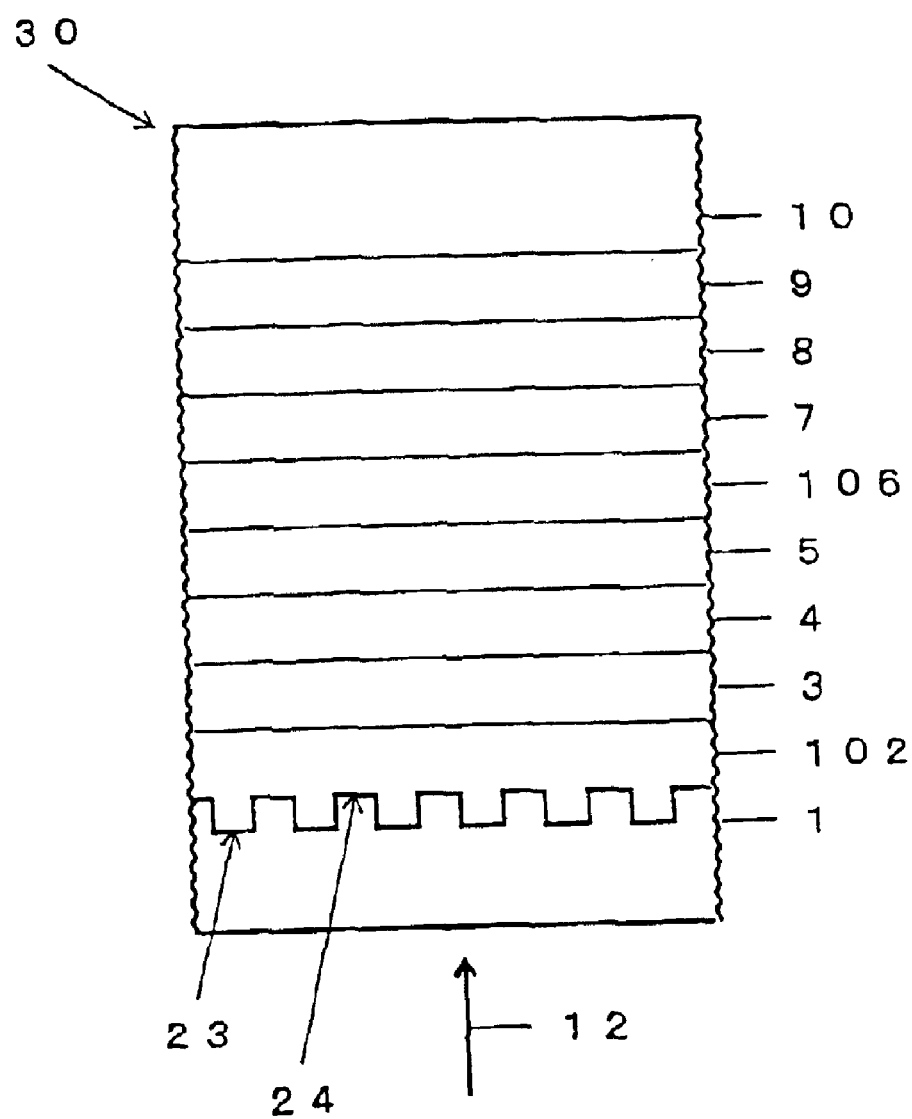
FIG. 6 is a fragmentary sectional view which shows further another example of the optical information recording medium of the invention.

As Embodiment 6, another example of the information recording medium on or from which information is recorded or reproduced by using a laser beam, is described. FIG. 6 shows the partial cross section of the optical information recording medium.

The information recording medium 30 shown in FIG. 6 has a constitution in which a first dielectric layer 102, a first interface layer 3, a recording layer 4, a second interface layer 5, a second dielectric layer 106, an optical compensation layer 7, and a reflective layer 8 are formed on one surface of a substrate 1 in this order, and furthermore a dummy substrate 10 is bonded with an adhesive layer 9. In the information recording medium 30 shown in FIG. 6, the first and the second interface layers 3 and 5 are a Zr—Zn—S—O-based material layer. In addition in FIG. 6, the reference numerals which are identical to those used in FIG. 1 denote identical components which are formed from the material and by the method described with reference to FIG. 1. Therefore, the detailed description is omitted as to the components already described with reference to FIG. 1.

The information recording medium of this embodiment has a constitution in which the first and the second dielectric layers 102 and 106 are formed from ZnS- 20 mol % $SiO_2$ used for the prior art information recording medium. In such constitution, a Zr—Zn—S—O-based material layer can be used as the first and second interface layers 3 and 5. The preferable material for the first and the second interface layers 3 and 5 is the same as that for the first and the second dielectric layers 2 and 6 of Embodiment 1. Therefore, the detailed description about it is omitted. The thickness of the first and the second interface layers 3 and 5 is preferably in the range of 1 to 10 nm, and more preferably in the range of about 2 to 7 nm so that recording and erasing characteristic may not be affected. The interface layer which is the Zr—Zn—S—O-based material layer has the advantages that cost for the material is inexpensive, the extinction coefficient is low (i.e. transparency is high), and its melting point is high and then it is thermally stable, compared with the prior art interface layer consisting of the nitride containing Ge.

Next, the method for producing the information recording medium 30 of Embodiment 6 is described. The information recording medium 30 is produced by carrying out the process in which the first dielectric layer 102 is formed on the surface of the substrate 1 where the guide groove is formed (Process h), the process in which the first interface layer 3 is formed (Process s), the process in which the recording layer 4 is formed (Process b), the process in which the second interface layer 5 is formed (Process t), the process in which the second dielectric layer 106 is formed (Process g), the process in which the optical compensation layer 7 is formed (Process d), and the process in which the reflective layer 8 is formed (Process e) in this order, and further by carrying out the process in which the adhesive layer 9 is formed on the surface of the reflective layer 8, and the process in which the dummy substrate 10 is bonded. Processes b, d, and e are as described in relation to Embodiment 1, Process g is as described in relation to Embodiment 2, and Process h is as described in relation to Embodiment 3. Therefore, the description of these processes is omitted here.

Process s is a process in which the first interface layer 3 is formed on the surface of the first dielectric layer 102. Process s is carried out in the same manner as Process a in the production of Embodiment 1. Process t is a process in which the second interface layer 5 is formed on the surface of the recording layer 4. Process t is carried out in the same manner as Process c in the production of Embodiment 1.

In the above, the optical information recording media on or from which information is recorded or reproduced by a laser beam are described as embodiments of this invention with reference to FIGS. 1 to 6. The optical information recording medium of this invention is not limited to these embodiments. As long as a Zr—Zn—S—O-based material layer is provided, preferably in contact with a recording layer, as one of constitutive layers, the optical information recording medium of this invention may be embodied in other forms. Moreover, the optical information recording medium of this invention is suitable for recording with a laser beam of various wavelengths. Therefore, the optical information recording medium of this invention may be, for example, DVD-RAM or DVD-R on or from which information is recorded or reproduced by a laser beam with a wavelength between 630 and 680 nm, or a large capacity optical disk on or from which information is recorded or reproduced by a laser beam with a wavelength between 400 and 450 nm.

(Embodiment 7)

Figure 7:
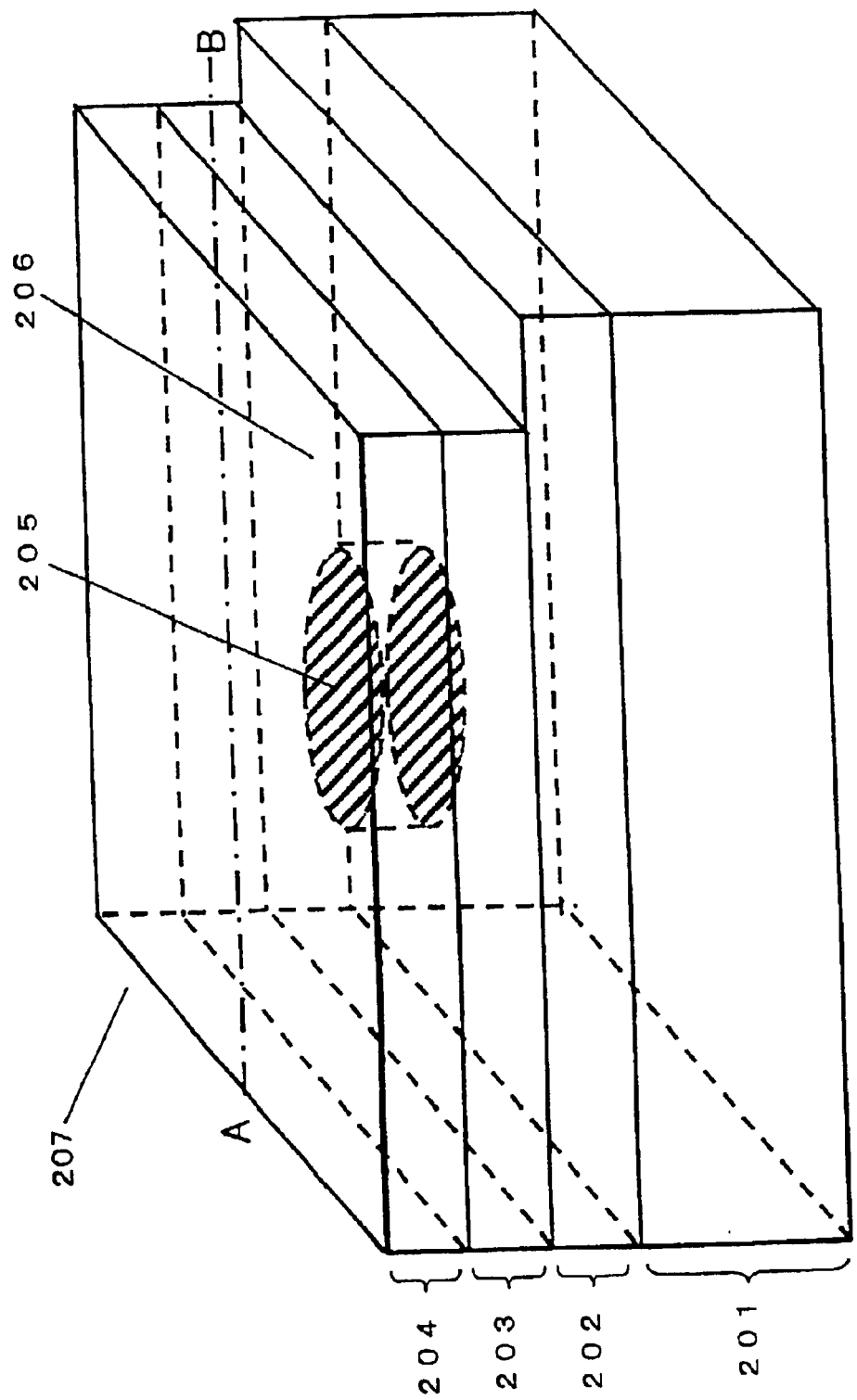
FIG. 7 is a schematical view which shows an example of the information recording medium of the invention on which information is recorded by application of an electric energy.

As Embodiment 7, an example of the information recording medium on or from which information is recorded or reproduced by applying an electric energy, is described. FIG. 7 shows the partial cross section of the information recording medium.

FIG. 7 shows a memory 207 in which a lower electrode 202, a recording part 203, and an upper electrode 204 are formed on the surface of a substrate 201 in this order. The recording part 203 of the memory 207 has a constitution including a cylinder shaped recording layer 205 and a dielectric layer 206 which encloses the recording layer 205. It differs from the optical information recording media described with reference to FIGS. 1 to 6. In the memory 207 of this embodiment, the recording layer 205 and the dielectric layer 206 are formed on the same surface, and they are not in the laminated relationship. However, since the recording layer 205 and the dielectric layer 206 both constitute part of the multilayered body including the substrate 201, the lower and the upper electrodes 202 and 204 in the memory 207, they can be each referred to as a "layer." Therefore, the information recording medium of this invention also includes an embodiment which has a recording layer and a dielectric layer on the same surface.

As the substrate 201, a semiconductor substrate, such as Si substrate, a polycarbonate substrate, or an insulating substrate such as a $SiO_2$ substrate and an $Al_2O_3$ substrate can be used. The lower electrode 202 and the upper electrode 204 are formed from a suitable electrically conductive material. The lower electrode 202 and the upper electrode 204 are formed by, for example, sputtering a metal such as Au, Ag, Pt, Al, Ti, W, Cr, or a mixture thereof.

The recording layer 205 which constitutes the recording part 203 consists of the material in which the phase change is generated by applying an electric energy. Therefore, the recording layer 205 can be referred to as "a phase-change part." The recording layer 205 is formed from the material in which the phase change between a crystal phase and an amorphous phase is caused by the Joule heat generated by applying an electric energy. As the material for the recording layer 205, for example, Ge—Sb—Te, Ge—Sn—Sb—Te, Ge—Bi—Te, Ge—Sn—Bi—Te, Ge—Sb—Bi—Te and Ge—Sn—Sb—Bi—Te-based material is used, and more specifically, a GeTe—$Sb_2Te_3$-based material or a GeTe—$Bi_2Te_3$-based material is used.

The dielectric layer 206 which constitutes the recording part 203 serves to prevent the current which flows the recording layer 205 by applying a voltage between the upper electrode 204 and the lower electrode 202, from escaping to the periphery part, and to insulate the recording layer 205 electrically and thermally. Therefore, the dielectric layer 206 can be referred to as "a thermal insulating part." The dielectric layer 206 is a Zr—Zn—S—O-based material layer. Specifically, the layer is one which substantially consists of the material expressed with the above-mentioned formula (1), (11), (2), (21) or (22). The Zr—Zn—S—O-based material layer is preferably used because it has a high melting point, atoms in the material layer are difficult to diffuse even when the material is heated, and it has low thermal conductivity.

This memory 207 is further explained together with the operation method in the below-mentioned Example.

EXAMPLES

Example 1

In Example 1, as a preliminary test leading to this invention, information recording mediums, which each had a constitution similar to the information recording medium 25 described in Embodiment 1 with reference to FIG. 1, were produced while varying a material for the first and the second dielectric layers as shown in Table 1. In the mediums, the first dielectric layer and the second dielectric layer were made of a material having the same composition.

Hereafter, the producing method of the information recording medium is explained. In order to make understanding easier, the same reference numbers for the elements of the information recording medium 25 of FIG. 1 are used as reference numbers of corresponding elements of that in this Example. (With respect to information recording mediums of the following Examples, please note that the same reference numbers for the elements of the corresponding information recording medium are used similarly to this Example.)

Firstly, a circular polycarbonate substrate having a diameter of 120 mm and a thickness of 0.6 mm was prepared as a substrate 1. A guide groove was previously provided on one side of the circular polycarbonate substrate with a depth of 56 nm and a track pitch (i.e. a distance between centers of a groove surface 23 and a land surface 24 in a plane parallel to the principal surface of the substrate) of 0.615 µm.

On this substrate 1, the first dielectric layer 2 of $(ZnS)_{80}(SiO_2)_{20}$ (mol %) with a thickness of 150 nm, a recording layer 4 of $Ge_{27}Sn_8Sb_{12}Te_{53}$ (atomic %) with a thickness of 9 nm, the second dielectric layer 6 of $(ZnS)_{80}(SiO_2)_{20}$ (mol %) with a thickness of 50 nm, an optical compensation layer 7 of $Ge_{80}Cr_{20}$ (atomic %) with a thickness of 40 nm, and a reflective layer 8 of Ag—Pd—Cu with a thickness of 80 nm were formed into films in order by a sputtering method as follows.

In a process for forming the first dielectric layer 2, a sputtering target (a diameter of 100 mm and a thickness of 6 mm) which had a composition of $(ZnS)_{80}(SiO_2)_{20}$ (mol %) was attached to a film-forming device, and then a high frequency sputtering was carried out with a power of 400 W while introducing a mixed gas of Ar gas (97%) and $O_2$ gas (3%). A pressure during the sputtering was set at about 0.13 Pa.

In a process for forming the recording layer 4, a sputtering target (a diameter of 100 mm, a thickness of 6 mm) made of a Ge—Sn—Sb—Te based material resulted by substituting Sn for a part of Ge in a GeTe—$Sb_2Te_3$ pseudo-binary system composition was attached to the film-forming device, and then a DC (direct current) sputtering was carried out with a power of 100 W while introducing a mixed gas of Ar gas (97%) and $N_2$ gas (3%). A pressure during the sputtering was set at about 0.13 Pa.

A process for forming the second dielectric layer 6 was carried out similarly to the process for forming the first dielectric layer except for its thickness so that the first dielectric layer 2 and the second dielectric layer 6 had the substantially same composition.

In a process for forming the optical compensation layer 7, a sputtering target (a diameter of 100 mm, a thickness of 6 mm) of which material had a composition of $Ge_{80}Cr_{20}$ (atomic %) was attached to the film-forming device, and then a DC sputtering was carried out with a power of 300 W while introducing Ar gas (100%). The pressure during the sputtering was set at about 0.4 Pa.

In a process for forming the reflective layer 8, a sputtering target (a diameter of 100 mm, a thickness of 6 mm) of which material had a composition of Ag—Pd—Cu was attached to the film-forming device and then a DC sputtering was carried out with a power of 200 W while introducing Ar gas (100%). The pressure during the sputtering was set at about 0.4 Pa.

After the first dielectric layer 2, the recording layer 4, the second dielectric layer 6, the optical compensation layer 7, and the reflective layer 8 were formed into films in order on the substrate 1 as described above to obtain a multilayered structure, an ultraviolet-curing resin was applied on the reflective layer 8. A circular polycarbonate substrate of a diameter of 120 mm and a thickness of 0.6 mm as a dummy substrate 10 was stuck on the applied ultraviolet-curing resin. Then, an ultraviolet ray was applied from the dummy substrate 10 to cure the resin. Thereby, an adhesive layer 9 consisting of the cured resin was formed at a thickness of 30 µm. The dummy substrate 10 was laminated to the multilayered structure with the adhesive layer 9.

In an initialization process following the lamination, the recording layer 4 of the information recording medium 25 was crystallized in the substantially all of an annular area ranging from 22 to 60 mm in a radial direction by using a semiconductor laser with a wavelength of 810 nm. Thereby, the initialization process was finished and the information recording medium 25 of Sample No. 1-1 was produced.

Furthermore, information recording mediums 25 of Sample Nos. 1-2 to 1-12, which each had a constitution similar to the information recording medium 25 of Sample No. 1-1, except that a material for the first dielectric layer 2 and the second dielectric layer 6 was a material shown in Table 1, were produced. These information recording mediums 25 were produced as in the case of the information recording medium 25 of Sample No. 1-1 described above but a process for forming the first dielectric layer and the second dielectric layer was changed.

In order to produce the information recording mediums 25 of Sample Nos. 1-2 to 1-12, sputtering targets (a diameter of 100 mm and a thickness of 6 mm for each) of which material had a composition of $SiO_2$, ZnS, $(ZnSe)_{80}(SiO_2)_{20}$ (mol %), ZnSe, $ZrO_2$, $(ZrO_2)_{80}(SiO_2)_{20}$ (mol %), $ZrSiO_4$, $Ge_{90}Cr_{10}$ (atomic %), $(Bi_2O_3)_{80}(SiO_2)_{20}$ (mol %), $TeO_2$, or $(TeO_2)_{80}(SiO_2)_{20}$ (mol %) were respectively used in the processes for forming the first dielectric layer 2 and the second dielectric layer 6.

In addition, a power was adjusted depending on the melting point of a material used as the sputtering target. More specifically, it was set at 1 kW for Sample No. 1-2. For Sample Nos. 1-3 to 1-5, it was set at 400 W like in the case of Sample No. 1-1. It was set at 500 W for Sample Nos. 1-6 to 1-8. It was set at 300 W for Sample No. 1-9. It was set at 200 W for Sample Nos. 1-10 to 1-12. A pressure during the sputtering was set at about 1.33 Pa for Sample No. 1-9, and it was set at about 0.13 Pa for other samples like in the case of Sample No. 1-1. As a gas which was introduced to the film-forming device, a mixed gas of Ar gas (97%) and $O_2$ gas (3%) was used for No. 1-2 and 1-10 to 1-12 like in the case of Sample No. 1-1, and Ar gas (100%) was used for Sample Nos. 1-3 to 1-8, and a mixed gas of Ar gas (60%) and $N_2$ gas (40%) was used for No. 1-9.

In the case of the information recording medium of Sample No. 1-9, the dielectric layer of Ge—Cr—N was formed in the processes for forming the first and the second dielectric layers by reacting $N_2$ in the mixed gas with Ge and Cr which were sputtered from the sputtering target. In the case of other samples, the formed dielectric layer was considered to have the substantially same composition as that of the used sputtering target.

Figure 9:
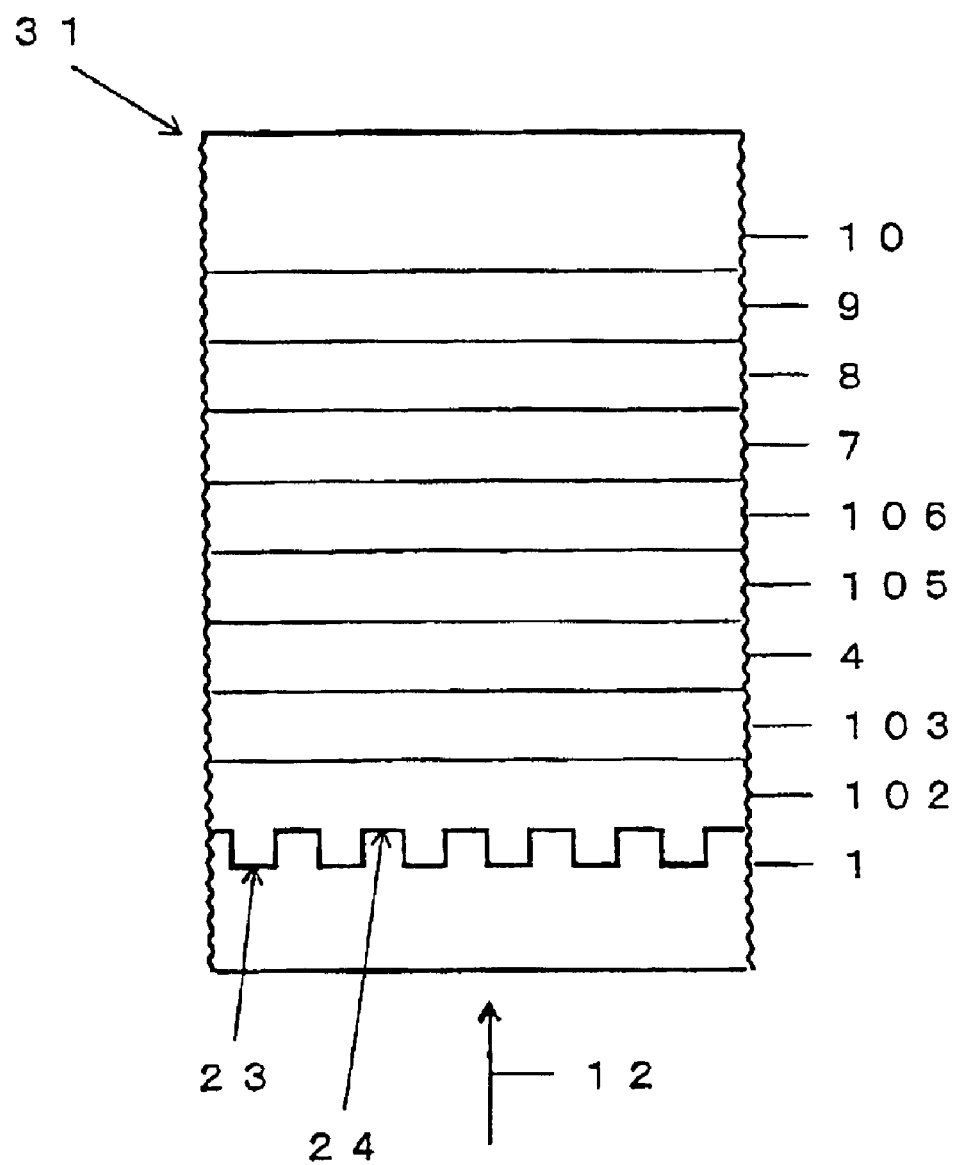
FIG. 9 is a fragmentary sectional view which shows an example of the prior art information recording medium.

For the purpose of comparison, an information recording medium 31 having the structure in the prior art as shown in FIG. 9, which has the first interface layer 103 and the second interface layer 105 respectively between the first dielectric layer 102 and the recording layer 4, and between the second dielectric layer 106 and the recording layer 4, was produced. Both of the first interface layer 103 and the second interface layer 105 consist of Ge—Cr—N and were formed at 5 nm in thickness.

The information recording medium 31 having the structure in the prior art was produced under a condition similar to the information recording medium of Sample No. 1-1 except that the first interface layer 103 and the second interface layer 105 were formed. In a process for forming the first interface layer 103, a sputtering target (a diameter of 100 mm, a thickness of 6 mm) which material had a composition of $Ge_{90}Cr_{10}$ (atomic %) was attached to the film-forming device, and then a high frequency sputtering was carried out with a power of 300 W under a pressure of about 1.33 Pa while introducing a mixed gas of Ar gas (60%) and $N_2$ gas (40%). As a result, the first interface layer 103 of Ge—Cr—N was formed by reacting $N_2$ in the mixed gas with Ge and Cr which were sputtered from the sputtering target. A process for forming the second interface layer 105 was also conducted under a condition similar to this.

As to the information recording mediums 25 of Sample Nos. 1-1 to 1-12 and the information recording medium 31 of Comparative Sample (prior art) thus obtained, adhesiveness of the dielectric layer and overwrite cyclability of the information recording medium were evaluated. As mentioned below, adhesiveness was evaluated based on the occurrence of delamination. Overwrite cyclability was evaluated based on the number of overwrite cycles. These results are shown in Table 1 together with a peak power (Pp) obtained on evaluating overwrite cyclability. Please note that neither the information recording mediums 25 of Sample Nos. 1-1 to 1-12, nor the information recording medium 31 of Comparative Sample were in the scope of this invention.

The evaluation of adhesiveness of the dielectric layer in the case of the information recording medium 25 was based on the delamination under a condition of a high humidity and a high temperature. Specifically, the information recording medium 25 after the initialization process was located for 100 hours in a high humidity/high temperature-tank under a condition of a relative humidity of 80% at the temperature of 90° C. Then, the medium 25 was investigated by observation using a light microscope whether the delamination occurred between the recording layer and the adjacent dielectric layer, more specifically, between the recording layer 4 and at least one of the first dielectric layer 2 and the second dielectric layer 6. Of course, adhesiveness was high when no peeling occurred, on the other hand, adhesiveness was low when peeling occurred.

The evaluation of overwrite cyclability of the information recording medium 25 was based on the number of overwrite cycles as an index. The number of overwrite cycles was determined as described below.

In order to record information to the information recording medium 25, an information recording system having a general constitution was used. The system was provided with a spindle motor for rotating the information recording medium 25, an optical head including a semiconductor laser which can emit a laser beam 12, and an objective lens for condensing the laser beam 12 on the recording layer 4 of the information recording medium 25. On evaluating the information recording medium 25, recording which was equivalent to a capacity of 4.7 GB was conducted by using the semiconductor laser with a wavelength of 660 nm and the objective lens with a numerical aperture of 0.6. A linear velocity of rotation of the information recording medium 25 was set at 8.2 m/second. A time interval analyzer was used for a measurement of a jitter in order to obtain an average of jitters as mentioned below.

Firstly, in order to determine a measurement condition for obtaining the number of overwrite cycles, a peak power (Pp) and a bias power (Pb) were determined according to a following procedure. Using the system described above, the information recording medium 25 was irradiated with a laser beam 12 while modulating its power between a peak power (mW) in a high power level and a bias power (mW) in a low power level to record a random signal with a mark length of 0.42 $\mu$m (3T) to 1.96 $\mu$m (14T) ten times on the same groove surface of the recording layer 4 (by groove recording). Then, a jitter between front ends and a jitter between rear ends were measured. A jitter-average was calculated as the mean values of these jitters. Such jitter-average was measured on each recording condition with the bias power being fixed while the peak power was varied. A power that was 1.3 times as large as a peak power at which the jitter-average for the random signal became 13% by gradually increasing the peak power was determined as Pp1 temporarily. Next, a jitter-average was measured on each recording condition with the peak power being fixed at Pp1 while the bias power was varied. The mean value of upper and lower bias powers at which the jitter-average for the random signal became 13% or less was determined as Pb. Then, the jitter-average was measured on each recording condition with the bias power being fixed at Pb while the peak power was varied. A power that was 1.3 times as large as a peak power at which the jitter-average for the random signal became 13% by gradually increasing the peak power was determined Pp. When the recording was conducted under the condition of thus determined Pp and Pb, 8 to 9% of the average of the jitters was obtained in the case of, for example, 10 times of overwrite. Considering the upper limit of the laser power of the system, it is desirable to satisfy Pp$\leq$14 mW and Pb$\leq$8 mW.

The number of overwrite cycles used as the index of overwrite cyclability was determined in this Example based on a jitter-average. The information recording medium 25 was irradiated with the laser beam while modulating its power between Pp and Pb thus determined to continuously record a random signal with a mark length of 0.42 $\mu$m (3T) to 1.96 $\mu$m (14T) in the same groove surface while repeating this predetermined times (by groove recording). After that, jitter-average was measured. The repeating times, i.e. the number of overwrite cycles, was 1, 2, 3, 5, 10, 100, 200, and 500 times, every 1000 times in a range from 1000 to 10000 times, and every 10000 times in a range from 20000 to 100000 times. The limit of overwrite was defined when the jitter-average became 13%. Overwrite cyclability was evaluated based on the number of overwrite cycles at this limit. Of course, the larger number of overwrite cycles, the higher overwrite cyclability. When an information recording medium is used as an external memory of a computer, the number of overwrite cycles is preferably not less than 100000 times. For the use of an audio-visual recorder, it is preferably not less than 10000 times.

TABLE 1

| Sample No. | Material of First and Second Dielectric Layers (mol %) | Delamination | Number of Overwrite Cycles | Peak Power Pp (mW) |
|---|---|---|---|---|
| 1-1 | $(ZnS)_{80}(SiO_2)_{20}$ | No | 1000 | 10.5 |
| 1-2 | $SiO_2$ | Yes | $\geq$100000 | 13.0 |
| 1-3 | ZnS | No | 1000 | 14.0 |
| 1-4 | $(ZnSe)_{80}(SiO_2)_{20}$ | No | 100 | 10.5 |
| 1-5 | ZnSe | No | 100 | 14.0 |
| 1-6 | $ZrO_2$ | Yes | $\geq$100000 | 14.0 |
| 1-7 | $(ZrO_2)_{80}(SiO_2)_{20}$ | Yes | $\geq$100000 | 13.0 |
| 1-8 | $(ZrO_2)_{50}(SiO_2)_{50}$=$ZrSiO_4$ | Yes | $\geq$100000 | 11.5 |
| 1-9 | Ge-Cr-N | No | Not Appreciable | >14 |

TABLE 1-continued

| Sample No. | Material of First and Second Dielectric Layers (mol %) | Delamination | Number of Overwrite Cycles | Peak Power Pp (mW) |
|---|---|---|---|---|
| 1-10 | $(Bi_2O_3)_{80}(SiO_2)_{20}$ | Yes | Not Appreciable | >14 |
| 1-11 | $TeO_2$ | Yes | Not Appreciable | Not Overwritable |
| 1-12 | $(TeO_2)_{80}(SiO_2)_{20}$ | Yes | Not Appreciable | Not Overwritable |
| Comparative Sample | $(ZnS)_{80}(SiO_2)_{20}$ (Prior Art) | No | $\geq 100000$ | 11.0 |

As shown in Table 1, tendency described below can be observed. As to the information recording mediums without delamination (having a high adhesiveness) (that is, Sample Nos. 1-1 and 1-3 to 1-5) among the information recording mediums of Sample Nos. 1-1 to 1-8, the number of overwrite cycles did not reach 100000 times at all. (Overwrite cyclability thereof was low.) As to the information recording mediums with delamination (having a low adhesiveness) (that is, Sample Nos. 1-2 and 1-6 to 1-8) on the other hand, the number of overwrite cycles exceeded 100000 times. (Overwrite cyclability thereof was high.)

Moreover, as to the information recording mediums of Sample Nos. 1-9 and 1-8, a sufficient recorded mark could not be formed when the peak power was not larger than 14 mW. Thus, they showed a low recording sensitivity. As this reason, it was expected that the thermal conductivity of the material for the dielectric layers in these samples was higher than that of other samples.

Moreover, the overwriting could not be made in the information recording mediums of Sample Nos. 1-11 and 1-12. The material for the dielectric layers melted and contaminated in the recording layer during the recording. This was considered because the melting point of the material for the dielectric layers in these samples was lower than that of other materials.

On the other hand, with the information recording medium of Comparative Example in the prior art (which had the interface layers), there was no delamination, and the number of overwrite cycles was not less than 100000 times. That is, both adhesiveness and overwrite cyclability were high.

Moreover, by comparison between the information recording mediums of Sample Nos. 1-1 to 1-8, the information recording mediums in which $(ZnS)_{80}(SiO_2)_{20}$, $(ZnSe)_{80}(SiO_2)_{20}$, or $ZrSiO_4$ was used as the material of the dielectric layers (i.e. Sample Nos. 1-1, 1-4, and 1-8) had a low Pp, and therefore a high recording sensitivity. By comparison between the information recording mediums of in which $(ZnS)_{80}(SiO_2)_{20}$ and $(ZnSe)_{80}(SiO_2)_{20}$ was used as the material of the dielectric layers respectively (i.e. Sample Nos. 1-1 and 1-4), the medium using $(ZnS)_{80}(SiO_2)_{20}$ showed an excellent overwrite cyclability.

According to the result of the preliminary tests described above, there was no information recording medium satisfying a high adhesiveness and a high overwrite cyclability at the same time among the information recording mediums of Sample Nos. 1-1 to 1-12 in which oxide, nitride, selenide, sulfide, or a mixture of one of them and $SiO_2$ was used as the material for the dielectric layers adjacent to the recording layer. However, what was determined in this Example was that the information recording mediums (Sample Nos. 1-6 to 1-8) in which a material containing $ZrO_2$ or a material containing $ZrO_2$ and $SiO_4$ was used as the material for the dielectric layers showed an excellent overwrite cyclability, and especially the information recording mediums (Sample No. 1-8) in which a material consisting of $ZrSiO_4$ was used as the material for the dielectric layers showed an excellent overwrite cyclability and a high recording sensitivity. Furthermore, it was also determined that the information recording mediums (Sample Nos. 1-1 and 1-3 to 1-5) in which a material containing ZnS or ZnSe was used as the material for the dielectric layers showed an excellent adhesiveness with the recording layer and a high recording sensitivity, and that the information recording mediums (Sample Nos. 1-1 and 1-3) in which a material containing ZnS was used as the material for the dielectric layers showed a higher overwrite cyclability than that of the information recording mediums (Sample Nos. 1-4 and 1-5) in which a material containing ZnSe was used as the material for the dielectric layers.

From the result of this example as the preliminary test, it was expected that a high adhesiveness and a high overwrite cyclability could be accomplished at the same time by using a mixture of $ZrO_2$ and ZnS, a mixture of $ZrO_2$, $SiO_2$, and ZnS, or a mixture of $ZrSiO_4$ and ZnS as a material for a dielectric layer.

Example 2

In Example 2, for the purpose of accomplishing a high adhesiveness and a high overwrite cyclability at the same time, information recording mediums were produced. In these mediums, a Zr—Zn—S—O-based material-layer resulted by mixing $ZrO_2$ with ZnS was used for dielectric layers.

Also in this Example, the information recording medium 25 (see FIG. 1) of which the first dielectric layer and the second dielectric layer were made of a material having the same composition was produced similarly to Example 1 while varying the material for these dielectric layers as shown in Table 2. In Example 2, in order to study a composition range of a material expressed as $(ZrO_2)_X(ZnS)_{100-X}$ (mol %) which was suitable to use for a dielectric layer, information recording mediums were produced while varying the content ratio "X" (mol %) of $ZrO_2$ in the first and second dielectric layers as shown in Table 2. Please note that a composition expressed by not "Zn—S" but "ZnS" means that the value of "(the number of S atoms)/(the number of Zn atoms)" substantially equals to 1. (This is also applicable in the following Examples unless otherwise noted.)

The information recording mediums of this Example, similarly to Example 1, each had a constitution which was similar to the information recording medium 25 except that the material for the first and the second dielectric layers was made of the material shown in Table 2. The mediums were produced as in Example 1 except that the processes for forming the first and the second dielectric layers were changed. In order to produce the information recording mediums of Sample Nos. 2-1 to 2-9, in the processes of the first dielectric layer and the second dielectric layer, sputtering targets (a diameter of 100 mm, a thickness of 6 mm) which material had a certain composition shown in Table 2 were respectively used. Additionally, in the processes for forming the first dielectric layer and the second dielectric layer as to all samples, a power was set at 400 W, a pressure was set at about 0.13 Pa, and a gas to be introduced to a film-forming device was Ar gas (100%).

The dielectric layers formed into films by the sputtering method were regarded to have the substantially same composition as the used sputtering target for each. Please note that this is applicable to the following Examples unless otherwise indicated.

With respect to the information recording mediums of Sample Nos. 2-1 to 2-9 thus obtained, adhesiveness of the dielectric layers and overwrite cyclability of the information recording medium were evaluated similarly to Example 1. These results are shown in Table 2 together with a peak power (Pp) obtained on evaluating overwrite cyclability. The results as to the information recording mediums of Sample Nos. 1-1, 1-3 and 1-6 which were produced in Example 1 are also shown in Table 2. Further, in the purpose of comparison, the result as to the information recording medium 31 in the prior art of FIG. 10 which was produced in Example 1 is also shown in Table 2. (This result is also shown in Table 3 to 8 relating to the following Examples.)

TABLE 2

| Sample No. | Material of First and Second Dielectric Layers $(ZrO_2)_x(ZnS)_{100-x}$ (mol %) | De-lamination | Number of Overwrite Cycles | Peak Power Pp (mW) |
|---|---|---|---|---|
| 1-3 | ZnS | No | 1000 | 14.0 |
| 2-1 | $(ZrO_2)_{10}(ZnS)_{90}$ | No | 2000 | 12.0 |
| 2-2 | $(ZrO_2)_{20}(ZnS)_{80}$ | No | 4000 | 12.2 |
| 2-3 | $(ZrO_2)_{30}(ZnS)_{70}$ | No | 6000 | 12.3 |
| 2-4 | $(ZrO_2)_{40}(ZnS)_{60}$ | No | 8000 | 12.5 |
| 2-5 | $(ZrO_2)_{50}(ZnS)_{50}$ | No | 10000 | 12.6 |
| 2-6 | $(ZrO_2)_{60}(ZnS)_{40}$ | No | 30000 | 12.8 |
| 2-7 | $(ZrO_2)_{70}(ZnS)_{30}$ | No | 50000 | 13.2 |
| 2-8 | $(ZrO_2)_{80}(ZnS)_{20}$ | No | 70000 | 13.4 |
| 2-9 | $(ZrO_2)_{90}(ZnS)_{10}$ | Yes | 100000 | 13.6 |
| 1-6 | $ZrO_2$ | Yes | $\geq 100000$ | 14.0 |
| 1-1 | $(ZnS)_{80}(SiO_2)_{20}$ | No | 1000 | 10.5 |
| Comparative Sample | $(ZnS)_{80}(SiO_2)_{20}$ (Prior Art) | No | $\geq 100000$ | 11.0 |

As shown in Table 2, by comparison between the information recording mediums of Sample Nos. 2-2 and 1-1 (with no interface layer) which had the same constitution and of which dielectric layers contained ZnS and the oxide at the same content ratios, the number of overwrite cycles as to the information recording medium of Sample No. 2-2 was 4000 times while that of the information recording medium of Sample No. 1-1 was 1000 times. From such result of a larger number of overwrite cycles obtained for $(ZnS)_{80}(ZrO_2)_{20}$ than that for $(ZnS)_{80}(SiO_2)_{20}$, it was determined that a $ZnS$—$ZrO_2$ based material was more suitable for a material of a dielectric layer than a $ZnS$—$SiO_2$ based material.

Furthermore, delamination did not occur, and therefore a high adhesiveness could be realized as to the information recording mediums (Sample Nos. 1-3 and 2-1 to 2-8) in which a $ZrO_2$—$ZnS$ based material expressed by the formula of $(ZrO_2)_X(ZnS)_{100-X}$ (mol %) wherein X satisfied $X \leq 80$ was used as the material for the dielectric layers. As to the information recording mediums (Sample Nos. 2-5 to 2-9 and 1-6) in which a $ZrO_2$—$ZnS$ based material expressed by a formula of $(ZrO_2)_X(ZnS)_{100-X}$ (mol %) wherein X satisfied $50 \leq X$ was used for the dielectric layers, the number of overwrite cycles of 10000 times or more was obtained. Thus, from the result of this Example, it was confirmed that a material being in a composition range wherein X of the above formula satisfied $50 \leq X \leq 80$ was preferable. As to the information recording medium in which a $ZrO_2$—$ZnS$ based material being in this composition range was used for the dielectric layers, Pp was not larger than 14 mW referring to FIG. 2. As described above, in the case of using a Zr—Zn—S—O based material-layer as a dielectric layer in the information recording medium 25 shown in FIG. 1 without a interface layer, a high adhesiveness and a high overwrite cyclability could be obtained, and further Pp>14 mW.

Example 3

In Example 3, for the purpose of realizing an information recording medium having a high recording sensitivity, information recording mediums were produced. In these mediums, a material of a $ZrO_2$—$ZnS$ based material mixed with $SiO_2$ was used as a material for dielectric layers. Also in this Example, the information recording medium 25 of which the first dielectric layer and the second dielectric layer were made of a material having the same composition was produced similarly to Example 1 while varying the material for these dielectric layers as shown in Table 3. In Example 3, in order to study a composition range of a material expressed as $(ZrO_2)_Y(SiO_2)_Z(ZnS)_{100-Y-Z}$ (mol %), wherein the value of "(the number of S atoms)/(the number of Zn atoms)" substantially equaled to 1, which was suitable to use for a dielectric layer, information recording mediums were produced while varying content ratios "Y" and "Z" (mol %) of $ZrO_2$ and $SiO_2$ in the material for the first and second dielectric layers as shown in Table 3. The study was made with respect to four composition satisfying Y+Z=50 and seven composition satisfying Y+Z=80.

The information recording mediums of this Example, similarly to Example 2, each had a constitution which was similar to the information recording medium 25 of Example 1 except that the material for the first and the second dielectric layers was made of the material shown in Table 3. The mediums were produced as in Example 2 except that processes for forming the first and the second dielectric layers were changed. In order to produce the information recording mediums of Sample Nos. 3-1 to 3-11, in the processes of the first dielectric layer and the second dielectric layer, sputtering targets (a diameter of 100 mm, a thickness of 6 mm) which material had a certain composition shown in Table 3 were respectively used. The processes for forming the first dielectric layer and the second dielectric layer were conducted under a condition as in Example 2.

With respect to the information recording mediums of Sample Nos. 3-1 to 3-11 thus obtained, adhesiveness of the dielectric layers and overwrite cyclability of the information recording medium were evaluated similarly to Example 1. These results are shown in Table 3 together with a peak power (Pp) obtained on evaluating overwrite cyclability.

TABLE 3

| Sample No. | Material of First and Second Dielectric Layers $(ZrO_2)_Y(SiO_2)_Z(ZnS)_{100-Y-Z}$ (mol %) | Delamination | Number of Overwrite Cycles | Peak Power Pp (mW) |
|---|---|---|---|---|
| 3-1 | $(ZrO_2)_{10}(SiO_2)_{40}(ZnS)_{50}$ | Yes | 20000 | 10.0 |
| 3-2 | $(ZrO_2)_{20}(SiO_2)_{30}(ZnS)_{50}$ | No | 20000 | 10.6 |
| 3-3 | $(ZrO_2)_{30}(SiO_2)_{20}(ZnS)_{50}$ | No | 20000 | 11.2 |
| 3-4 | $(ZrO_2)_{40}(SiO_2)_{10}(ZnS)_{50}$ | No | 20000 | 11.8 |
| 3-5 | $(ZrO_2)_{10}(SiO_2)_{70}(ZnS)_{20}$ | Yes | $\geq 100000$ | 9.6 |
| 3-6 | $(ZrO_2)_{20}(SiO_2)_{60}(ZnS)_{20}$ | Yes | $\geq 100000$ | 10.1 |
| 3-7 | $(ZrO_2)_{30}(SiO_2)_{50}(ZnS)_{20}$ | No | $\geq 100000$ | 10.7 |
| 3-8 | $(ZrO_2)_{40}(SiO_2)_{40}(ZnS)_{20}$ | No | $\geq 100000$ | 11.2 |
| 3-9 | $(ZrO_2)_{50}(SiO_2)_{30}(ZnS)_{20}$ | No | $\geq 100000$ | 11.8 |
| 3-10 | $(ZrO_2)_{60}(SiO_2)_{20}(ZnS)_{20}$ | No | $\geq 100000$ | 12.3 |
| 3-11 | $(ZrO_2)_{70}(SiO_2)_{10}(ZnS)_{20}$ | No | $\geq 100000$ | 12.9 |
| Comparative Sample | $(ZnS)_{80}(SiO_2)_{20}$ (Prior Art) | No | $\geq 100000$ | 11.0 |

As shown in Table 3, among the information recording mediums (Sample Nos. 3-1 to 3-4) in which a $ZrO_2$—$SiO_2$—ZnS based material being in a composition range of $(ZrO_2)_Y(SiO_2)_Z(ZnS)_{100-Y-Z}$ (mol %) wherein Y+Z=50 was used as the material for the dielectric layers, an acceptable result of no delamination, the number of overwrite cycles of 20000 times and peak power not larger than 11.8 mW was obtained as to the information recording mediums (Sample Nos. 3-2 to 3-4) in the case of the material being in a composition range wherein $20 \leq Y \leq 40$ and $10 \leq Z \leq 30$. As to the information recording medium of Sample No. 2-5 of which dielectric layers contained ZnS at the same content ratio (see Table 2) as above information mediums, the number of overwrite cycles was 10000 times and Pp was 13.2 mW. From the comparison between them, therefore, it was determined that a higher recording sensitivity and an improved overwrite cyclability could be obtained by using a material of a $ZrO_2$—ZnS based material mixed with $SiO_2$.

Among the information recording mediums (Sample Nos. 3-5 to 3-11) in which a $ZrO_2$—$SiO_2$—ZnS based material being in a composition range of $(ZrO_2)_Y(SiO_2)_Z(ZnS)_{100-Y-Z}$ (mol %) wherein Y+Z=80 was used as the material for the dielectric layers, an acceptable result of no delamination, the number of overwrite cycles being not less than 100000 times and a peak power being not larger than 12.9 mW was obtained as to the information recording mediums (Sample Nos. 3-7 to 3-11) using the material being in a composition range wherein $30 \leq Y \leq 70$ and $10 \leq Z \leq 50$. As to the information recording medium of Sample No. 2-8 of which dielectric layers contained ZnS at the same content ratio (see Table 2) as above information mediums, the number of overwrite cycles was 70000 times and Pp was 13.6 mW. Also from the comparison between them, therefore, it was determined that a higher recording sensitivity and an improved overwrite cyclability could be obtained by using a material of a $ZrO_2$—ZnS based material mixed with $SiO_2$.

Thus, from the result of this Example, it was confirmed that a material being in a composition range wherein Y and X in the above formula satisfied $20 \leq Y \leq 70$ and $10 \leq Z \leq 50$ was preferable as the material for the dielectric layer.

Example 4

In Example 4, for the purpose of accomplishing a high adhesiveness and a high overwrite cyclability at the same time, information recording mediums were produced. In these mediums, a Zr—Zn—S—O based material-layer resulted by mixing $ZrSiO_4$ with ZnS was used for dielectric layers. Also in this Example, the information recording medium 25 (see FIG. 1) of which the first dielectric layer and the second dielectric layer were made of a material having the same composition was produced similarly to Example 1 while varying the material for these dielectric layers as shown in Table 4. In Example 4, in order to study a composition range of a material expressed as $(ZrSiO_4)_A(ZnS)_{100-A}$ (mol %), wherein the value of "(the number of S atoms)/(the number of Zn atoms)" substantially equaled to 1, which was suitable to use for a dielectric layer, information recording mediums were produced while varying content ratios "A" (mol %) of $ZrSiO_4$ in the material for the first and second dielectric layers as shown in Table 4.

The information recording mediums of this Example, similarly to Example 2, each had a constitution which was similar to the information recording medium 25 of Example 1 except that the material for the first and the second dielectric layers was made of the material shown in Table 3. The mediums were produced as in Example 2 except that processes for forming the first and the second dielectric layers were changed. In order to produce the information recording mediums of Sample Nos. 4-1 to 4-9, in the processes of the first dielectric layer and the second dielectric layer, sputtering targets (a diameter of 100 mm, a thickness of 6 mm) which material had a certain composition shown in Table 4 were respectively used. The processes for forming the first dielectric layer and the second dielectric layer were conducted under a condition as in Example 2.

With respect to the information recording mediums of Sample Nos. 4-1 to 4-9 thus obtained, adhesiveness of the dielectric layers and overwrite cyclability of the information recording medium were evaluated similarly to Example 1. These results are shown in Table 4 together with a peak power (Pp) obtained on evaluating overwrite cyclability. The results as to the information recording mediums of Sample Nos. 1-1 and 1-8 which were produced in Example 1 are also shown in Table 4.

TABLE 4

| Sample No. | Material of First and Second Dielectric Layers $(ZrSiO_4)_A(ZnS)_{100-A}$ (mol %) | Delamination | Number of Overwrite Cycles | Peak Power Pp (mW) |
|---|---|---|---|---|
| 1-3 | ZnS | No | 1000 | 14.0 |
| 4-1 | $(ZrSiO_4)_5(ZnS)_{95}$ | No | 2000 | 10.0 |
| 4-2 | $(ZrSiO_4)_{11}(ZnS)_{89}$ | No | 3000 | 10.1 |
| 4-3 | $(ZrSiO_4)_{18}(ZnS)_{82}$ | No | 5000 | 10.2 |
| 4-4 | $(ZrSiO_4)_{25}(ZnS)_{75}$ | No | 9000 | 10.4 |
| 4-5 | $(ZrSiO_4)_{33}(ZnS)_{67}$ | No | 100000 | 10.6 |
| 4-6 | $(ZrSiO_4)_{43}(ZnS)_{57}$ | No | $\geq 100000$ | 10.8 |
| 4-7 | $(ZrSiO_4)_{54}(ZnS)_{46}$ | No | $\geq 100000$ | 11.0 |
| 4-8 | $(ZrSiO_4)_{67}(ZnS)_{33}$ | No | $\geq 100000$ | 11.2 |
| 4-9 | $(ZrSiO_4)_{82}(ZnS)_{18}$ | Yes | $\geq 100000$ | 11.4 |
| 1-8 | $ZrSiO_4$ | Yes | $\geq 100000$ | 11.5 |
| Comparative Sample | $(ZnS)_{80}(SiO_2)_{20}$ (Prior Art) | No | $\geq 100000$ | 11.0 |

As shown in Table 4, delamination did not occur, and therefore a high adhesiveness could be realized as to the information recording mediums (Sample Nos. 1-3 and 4-1 to 4-8) in which a $ZrSiO_4$—ZnS based material expressed by the formula of $(ZrSiO_4)_A(ZnS)_{100-A}$ (mol %) wherein A satisfied $A \leq 67$ was used as the material for the dielectric layers. As to the information recording mediums (Sample Nos. 4-5 to 4-9 and 1-8) in which a $ZrSiO_4$—ZnS based material expressed by a formula of $(ZrSiO_4)_A(ZnS)_{100-A}$ (mol %) wherein A satisfied $33 \leq A$ was used for the dielectric layers, the number of overwrite cycles reached to 100000 times. That is, no delamination and the number of overwrite cycles of 100000 times were obtained as to the information recording mediums (Sample Nos. 4-5 to 4-8) in the case of the material being in a composition range wherein $33 \leq A \leq 67$. Also in the case of the material being in this composition, a peak power Pp which was in a level substantially equal to the information recording medium in the prior art was obtained. Thus, it was confirmed that a material being in a composition range wherein A of the above formula satisfied $33 \leq A \leq 67$ was preferable. As described above, when a Zr—Zn—S—O based material-layer was used as dielectric layers, the performance of the information recording medium 25 of FIG. 1 which did not contain the first and second interface layers was in a level substantially equal to or higher than the information recording medium in the prior art.

Example 5

In Example 5, a composition ratio of S to Zn which existed in a Zr—Zn—S—O based material-layer in the form of Zn—S was studied. Also in this Example, the information recording medium 25 of which the first dielectric layer and the second dielectric layer were made of a material having the same composition was produced similarly to Example 1 while varying the material for these dielectric layers as shown in Table 5. In Example 5, in order to study a composition range of a material expressed as $(ZrSiO_4)_A$ $(Zn—S)_{100-A}$ (mol %) which was suitable to use for a dielectric layer, information recording mediums were produced while varying the value of "(the number of S atoms)/(the number of Zn atoms)" in the material for the first and second dielectric layers in the range of $33 \leq A \leq 67$ as shown in Table 5. The study was made with respect to sixteen compositions satisfying (the number of S atoms)/(the number of Zn atoms)=0.5, 1.5, 2, and 2.5 on respective conditions of A=33, 43, 54, and 67.

The information recording mediums of this Example, similarly to Example 2, each had a constitution which was similar to the information recording medium 25 of Example 1 except that the material for the first and the second dielectric layers was made of the material shown in Table 5. The mediums were produced as in Example 2 except that processes for forming the first and the second dielectric layers were changed. In order to produce the information recording mediums of Sample Nos. 5-1 to 5-16, in the processes of the first dielectric layer and the second dielectric layer, sputtering targets (a diameter of 100 mm, a thickness of 6 mm) which material had a certain composition shown in Table 5 were respectively used. The processes for forming the first dielectric layer and the second dielectric layer were conducted under a condition as in Example 2.

With respect to the information recording mediums of Sample Nos. 5-1 to 5-16 thus obtained, adhesiveness of the dielectric layers and overwrite cyclability of the information recording medium were evaluated similarly to Example 1. These results are shown in Table 5 together with a peak power (Pp) obtained on evaluating overwrite cyclability. The results as to the information recording mediums of Sample Nos. 4-5 to 4-8 which were produced in Example 4 are also shown in Table 5. Please note that the value of "(the number of S atoms)/(the number of Zn atoms)" is hereinafter also referred to as "S/Zn".

TABLE 5

| Sample No. | A | S/Zn | $(ZrSiO_4)_A(Zn-S)_{100-A}$ (mol %) | Delamination | Number of Overwrite Cycles | Peak Power Pp (mW) |
|---|---|---|---|---|---|---|
| 5-1 | 33 | 0.5 | $(ZrSiO_4)_{33}(Zn_1S_{0.5})_{67}$ | Yes | $\geq 100000$ | 10.7 |
| 4-5 |  | 1 | $(ZrSiO_4)_{33}(ZnS)_{67}$ | No | 100000 | 10.6 |
| 5-2 |  | 1.5 | $(ZrSiO_4)_{33}(Zn_1S_{1.5})_{67}$ | No | 50000 | 10.5 |
| 5-3 |  | 2 | $(ZrSiO_4)_{33}(Zn_1S_2)_{67}$ | No | 10000 | 10.4 |
| 5-4 |  | 2.5 | $(ZrSiO_4)_{33}(Zn_1S_{2.5})_{67}$ | No | 1000 | 10.3 |
| 5-5 | 43 | 0.5 | $(ZrSiO_4)_{43}(Zn_1S_{0.5})_{57}$ | Yes | $\geq 100000$ | 10.9 |
| 4-6 |  | 1 | $(ZrSiO_4)_{43}(ZnS)_{57}$ | No | $\geq 100000$ | 10.8 |
| 5-6 |  | 1.5 | $(ZrSiO_4)_{43}(Zn_1S_{1.5})_{57}$ | No | 70000 | 10.7 |
| 5-7 |  | 2 | $(ZrSiO_4)_{43}(Zn_1S_2)_{57}$ | No | 20000 | 10.6 |
| 5-8 |  | 2.5 | $(ZrSiO_4)_{43}(Zn_1S_{2.5})_{57}$ | No | 3000 | 10.5 |
| 5-9 | 54 | 0.5 | $(ZrSiO_4)_{54}(Zn_1S_{0.5})_{46}$ | Yes | $\geq 100000$ | 11.1 |
| 4-7 |  | 1 | $(ZrSiO_4)_{54}(ZnS)_{46}$ | No | $\geq 100000$ | 11.0 |
| 5-10 |  | 1.5 | $(ZrSiO_4)_{54}(Zn_1S_{1.5})_{46}$ | No | 100000 | 10.9 |
| 5-11 |  | 2 | $(ZrSiO_4)_{54}(Zn_1S_2)_{46}$ | No | 30000 | 10.8 |
| 5-12 |  | 2.5 | $(ZrSiO_4)_{54}(Zn_1S_{2.5})_{46}$ | No | 5000 | 10.7 |

TABLE 5-continued

| Sample No. | A | S/Zn | $(ZrSiO_4)_A(Zn\text{-}S)_{100-A}$ (mol %) | De-lamination | Number of Overwrite Cycles | Peak Power Pp (mW) |
|---|---|---|---|---|---|---|
| 5-13 | 67 | 0.5 | $(ZrSiO_4)_{67}(Zn_1S_{0.5})_{33}$ | Yes | ≥100000 | 11.3 |
| 4-8 | | 1 | $(ZrSiO_4)_{67}(ZnS)_{33}$ | No | ≥100000 | 11.2 |
| 5-14 | | 1.5 | $(ZrSiO_4)_{67}(Zn_1S_{1.5})_{33}$ | No | ≥100000 | 11.1 |
| 5-15 | | 2 | $(ZrSiO_4)_{67}(Zn_1S_2)_{33}$ | No | 50000 | 11.0 |
| 5-16 | | 2.5 | $(ZrSiO_4)_{67}(Zn_1S_{2.5})_{33}$ | No | 9000 | 10.9 |
| Comparative Sample | | | $(ZnS)_{80}(SiO_2)_{20}$ (Prior Art) | No | ≥100000 | 11.0 |

As shown in Table 5, delamination occurred in all of the information recording mediums (Sample Nos. 5-1, 5-5, 5-9 and 5-13) in which a $(ZrSiO_4)$—$(Zn$—$S)$ based material, which was expressed by the formula $(ZrSiO_4)_A(Zn$—$S)_{100-A}$ (mol %) wherein 33≦A≦67, satisfying S/Zn=0.5 was used as the material for the dielectric layers. On the other hand, delamination did not occur in the information recording mediums (Sample Nos. 4-5 to 4-8, 5-2 to 5-4, 5-6 to 5-8, 5-10 to 5-12, and 5-14 to 5-16) in which a $(ZrSiO_4)$—$(Zn$—$S)$ based material satisfying S/Zn=1 to 2.5 was used as the material for the dielectric layers.

Though the evaluation of adhesiveness was based on the occurrence of delamination after 100 hours under the certain condition as described above, the information recording mediums was located under the same condition as the evaluation of adhesiveness (a relative humidity of 80% at 90° C.) for a prolonged period until delamination was occurred. The period until the occurrence of the delamination was longer as S/Zn was larger. More specifically, the duration with no delamination was 200 hours for S/Zn=1, 300 hours for S/Zn=1.5, 400 hours for S/Zn=2, 500 hours for S/Zn=2.5.

As to the information recording mediums (Sample Nos. 5-4, 5-8, 5-12, and 5-16) in which a $(ZrSiO_4)$—$(Zn$—$S)$ based material satisfying S/Zn=2.5 was used as the material for the dielectric layers, the number of overwrite cycles was smaller than 10000 times. As to the information recording mediums (Sample Nos. 4-5 to 4-8, 5-1 to 5-3, 5-5 to 5-7, 5-9 to 5-11, and 5-13 to 5-15) in which a $(ZrSiO_4)$—$(Zn$—$S)$ based material satisfying S/Zn=0.5 to 2.0 was used as the material for the dielectric layers, on the other hand, the number of overwrite cycles was not less than 10000 times.

Further, a peak power Pp which was in a level substantially equal to the information recording medium in the prior art was obtained for all of the information recording mediums (Sample Nos. 4-5 to 4-8 and 5-1 to 5-16). In the case where A of the above formula was at a certain value, the peak power was larger and therefore its recording sensitivity was higher as S/Zn was larger.

Thus, it was confirmed that a material being in a composition range wherein A of the above formula satisfied 33≦A≦67 and S/Zn satisfied 1≦"(the number of S atoms)/(the number of Zn atoms)≦2 was preferable as a material for a dielectric layer in order to realize a high adhesiveness and a high overwrite cyclability at the same time.

Please note that similar results indicating that 1≦"(the number of S atoms)/(the number of Zn atoms)≦2 was preferable were also obtained with respect to a $(ZrO_2)$—$(Zn$—$S)$ based material which was expressed by the formula $(ZrO_2)_X(Zn$—$S)_{100-X}$ (mol %) wherein 50≦X≦80 and a $(ZrO_2)$—$(SiO_2)$—$(Zn$—$S)$ based material which was expressed by the formula $(ZrO_2)_Y(SiO_2)_Z(Zn$—$S)_{100-Y-Z}$ (mol %) wherein 50≦Y+Z≦80, 20≦Y≦70, and 10≦Z≦50.

Example 6

In Example 6, an information recording medium which had a constitution similar to the information recording medium 26 described in Embodiment 2 with reference to FIG. 2 was produced. In the medium, the first dielectric layer and the second dielectric layer were made of materials having a different composition from each other, and the second interface layer was contained between the second dielectric layer and a recording layer.

The information recording medium 26 of this Example was produced as follows. Firstly, a circular polycarbonate substrate having a diameter of 120 mm and a thickness of 0.6 mm was prepared as a substrate 1. A guide groove was previously provided on one side of the circular polycarbonate substrate with a depth of 56 nm and a track pitch (i.e. a distance between centers of a groove surface 23 and a land surface 24 in a plane parallel to the principal surface of the substrate) of 0.615 μm.

On this substrate 1, the first dielectric layer 2 of $(ZrSiO_4)_{54}(ZnS)_{46}$ (mol %) with a thickness of 150 nm, a recording layer 4 of $Ge_{27}Sn_8Sb_{12}Te_{53}$ (atomic %) with a thickness of 9 nm, the second interface layer 105 of Ge—Cr—N with a thickness of 3 nm, the second dielectric layer 106 of $(ZnS)_{80}(SiO_2)_{20}$ (mol %) with a thickness of 50 nm, an optical compensation layer 7 of $Ge_{80}Cr_{20}$ (atomic %) with a thickness of 40 nm, and a reflective layer 8 of Ag—Pd—Cu with a thickness of 80 nm were formed into films in order by a sputtering method. Each material for the second interface layer 105 and the second dielectric layer 106 was substantially the same as that in the information recording medium 31 described above while referring to FIG. 9.

The information recording medium 26 of this Example was produced as in the case of the information recording medium of Sample No. 1-1 of Example 1 except that a process for forming the first dielectric layer 2 was changed, and that a process for forming the second interface layer 105 was added between a process for forming the recording layer 4 and a process for forming the second dielectric layer 106. In the process for forming the first dielectric layer 2, a sputtering target (a diameter of 100 mm, a thickness of 6 mm) which had a composition of $(ZrSiO_4)_{54}(ZnS)_{46}$ (mol %) was attached to a film-forming device, and then a high frequency sputtering was carried out with a power of 400 W under a pressure of about 0.13 Pa while introducing Ar gas (100%). The process for forming the second interface layer 105 was conducted similarly to the process for forming the second interface layer 105 in the production method of the information recording medium 31 in the prior art of Comparative Sample described in Example 1. Please note that the process for forming the second dielectric layer 106 was similar to the process for forming the second dielectric layer 6 in the production method of the information recording medium 25 of Sample No. 1-1 described in Example 1, and also similar to the process for forming the second dielectric layer 106 in the production method of the information recording medium 31 in the prior art.

With respect to the information recording medium 26 of Sample No. 6-1 thus obtained, adhesiveness of the dielectric layer and overwrite cyclability of the information recording medium were evaluated similarly to Example 1. However, such evaluations in this Example were different from Example 1 in the following points. The evaluation of adhesiveness was conducted by investigating whether delamination occurred between the recording layer 4 and the first dielectric layer 2 adjacent to it. The evaluation of overwrite cyclability was conducted not only by groove recording but also by land recording (i.e. by land-groove recording) and measuring numbers of overwrite as to each of the groove recording and the land recording. These results are shown in Table 6 together with a peak power (Pp) and a bias power (Pb) obtained on evaluating overwrite cyclability. In the purpose of comparison, the result as to the information recording medium in the prior art shown in FIG. 9 which was produced in Example 1 is also shown in Table 6.

TABLE 6

| Sample No. | De-lamination | Groove Recording | | | Land Recording | | |
| --- | --- | --- | --- | --- | --- | --- | --- |
| | | Number of Overwrite Cycles | Power (mW) Pp | Pb | Number of Overwrite Cycles | Power (mW) Pp | Pb |
| 6-1 | No | ≧100000 | 10.8 | 4.9 | ≧100000 | 11.1 | 5.0 |
| Comparative Sample | No | ≧100000 | 11.0 | 5.0 | ≧100000 | 11.3 | 5.2 |

As shown in Table 6, adhesiveness, the number of overwrite cycles, a peak power and a bias power of the information recording medium 26 of Sample No. 6-1 of this Example in which $(ZrSiO_4)_{54}(ZnS)_{46}$ (mol %) was used only as a material for the first dielectric layer 2 and of which total number of layers was 6 were in a substantially equal level of the information recording medium 31 in the prior art of which total number of layers was 7. The total number of layers is referred to as the number of layers formed on the substrate by a sputtering method (that is, up to the reflective layer 8). Though a layer consisting of material which had a composition of $(ZrSiO_4)_{54}(ZnS)_{46}$ (mol %) (a Zr—Zn—S—O based material-layer) was used as the first dielectric layer 2 in this Example, such composition is an exemplary one. With respect to a $ZrSiO_4$—ZnS based material, acceptable results were obtained as in this Example over the whole composition range in which the content ratio of $ZrSiO_4$ was 33 to 67 mol %. Furthermore, a Zr—Zn—S—O based material-layer other than this may be used as the first dielectric layer 2.

Example 7

In Example 7, information recording mediums each having a constitution similar to the information recording medium 27 described in Embodiment 3 with reference to FIG. 3 were produced. In the mediums, the first dielectric layer and the second dielectric layer were made of materials having a different composition from each other, and the first interface layer was contained between the first dielectric layer and a recording layer.

The information recording medium 27 of this Example was produced as follows. Firstly, a substrate 1 as that in Example 1 was prepared. On this substrate 1, the first dielectric layer 102 of $(ZnS)_{80}(SiO_2)_{20}$ (mol %) with a thickness of 150 nm, the first interface layer 103 of Ge—Cr—N with a thickness of 5 nm, the recording layer 4 of $Ge_{27}Sn_8Sb_{12}Te_{53}$ (atomic %) with a thickness of 9 nm, and the second dielectric layer 6 of $(ZrSiO_4)_{54}(ZnS)_{46}$ with a thickness of 50 nm, an optical compensation layer 7 of $Ge_{80}Cr_{20}$ (atomic %) with a thickness of 40 nm, a reflective layer 8 of Ag—Pd—Cu with a thickness of 80 nm were formed into films in order by a sputtering method. Each material for the first dielectric layer 102 and the first interface layer 103 was substantially the same as that in the information recording medium 31 described above while referring to FIG. 9.

The information recording medium 27 of this Example was produced as in the case of the information recording medium of Sample No. 1-1 of Example 1 except that a process for forming the first interface layer 103 was added between the process for forming the first dielectric layer 102 and the process for forming the recording layer 4, and that the process for forming the second dielectric layer 6 was changed. The process for forming the first interface layer 103 was conducted similarly to the process for forming the first interface layer in the production method of the information recording medium 31 in the prior art of Comparative Sample described in Example 1. The process for forming the second dielectric layer 6 was conducted by using a sputtering target (a diameter of 100 mm, a thickness of 6 mm) which material had a composition of $(ZrSiO_4)_{54}(ZnS)_{46}$. In this process, a gas to be introduced to a film-forming device was Ar gas (100%), a power was at 400 W, and a pressure was at about 0.13 Pa. Please note that the process for forming the first dielectric layer 102 was similar to the process for forming the first dielectric layer 2 in the production method of the information recording medium 25 of Sample No. 1-1 described in Example 1, and also similar to the process for forming the first dielectric layer 2 in the production method of the information recording medium 31 in the prior art.

With respect to the information recording medium 27 of Sample No. 7-1 thus obtained, adhesiveness of the dielectric layer and overwrite cyclability of the information recording medium were evaluated similarly to Example 1. However, in this Example, the evaluation of adhesiveness was conducted by investigating whether delamination occurred between the recording layer 4 and the second dielectric layer 6 adjacent to it. These results are shown in Table 7 together with a peak power (Pp) obtained on evaluating overwrite cyclability.

TABLE 7

| Sample No. | De-lamination | Groove Recording | | | Land Recording | | |
| --- | --- | --- | --- | --- | --- | --- | --- |
| | | Number of Overwrite Cycles | Power (mW) Pp | Pb | Number of Overwrite Cycles | Power (mW) Pp | Pb |
| 7-1 | No | ≧100000 | 10.5 | 4.7 | ≧100000 | 10.8 | 4.9 |
| Comparative Sample | No | ≧100000 | 11.0 | 5.0 | ≧100000 | 11.3 | 5.2 |

As shown in Table 7, adhesiveness, the number of overwrite cycles, a peak power and a bias power of the information recording medium 27 of Sample No. 7-1 of this Example in which $(ZrSiO_4)_{54}(ZnS)_{46}$ (mol %) was used only as a material for the second dielectric layer 6 and of which total number of layers was 6 were in a substantially equal level of the information recording medium 31 in the prior art of which total number of layers was 7. The total number of layers is referred to as the number of layers formed on the substrate by a sputtering method (that is, up to the reflective layer 8). In the information recording medium 27 of Sample No. 7-1 produced in this Example, a measured Rc value was 20%, and a measured Ra value was 3% (at an unrelieved flat surface thereof). Though a layer consisting of material which had a composition of $(ZrSiO_4)_{54}(ZnS)_{46}$ (mol %) (a Zr—Zn—S—O based material-layer) was used as the second dielectric layer 6 in this Example, such composition is an exemplary one. With respect to a $ZrSiO_4$—ZnS based material, acceptable results were obtained as in this Example over the whole composition range in which the content ratio of $ZrSiO_4$ was 33 to 67 mol %. Furthermore, a Zr—Zn—S—O based material-layer other than this may be used as the second dielectric layer 6.

Example 8

In Example 8, an information recording medium which had a constitution similar to the information recording medium 28 described in Embodiment 4 with reference to FIG. 4 was produced.

The information recording medium 28 of this Example was produced as follows. Firstly, a circular polycarbonate substrate having the diameter of 120 mm and the thickness of 1.1 mm was prepared as a substrate 101. A guide groove was previously provided on one side of the circular polycarbonate substrate with a depth of 21 nm and a track pitch (i.e. a distance between centers of adjacent groove surfaces in a plane parallel to the principal surface of the substrate) of 0.32 $\mu$m.

On this substrate 101, a reflective layer 8 in the form of bilayer consisting of Ag—Pd—Cu with a thickness of 80 nm and AlCr with a thickness of 10 nm, the second dielectric layer 6 of $(ZrSiO_4)_{54}(ZnS)_{46}$ (mol %) with a thickness of 16 nm, a recording layer 4 of $Ge_{37.5}Sb_{11}Te_{51.5}$ (atomic %) with a thickness of 11 nm, and the first dielectric layer 2 of $(ZrSiO_4)_{54}(ZnS)_{46}$ (mol %) with a thickness of 68 nm were formed into films in order by a sputtering method.

A process for forming the reflective layer 8 was conducted as follows. Firstly, a layer of Ag—Pd—Cu was formed as similarly to the process for forming the reflective layer in the production method of the information recording medium of Sample No. 1-1 of Example 1. Secondary, a sputtering target (a diameter of 100 mm, a thickness of 6 mm) which material had a composition of AlCr was attached to the film-forming device, and then a DC sputtering was carried out with a power of 200 W under a pressure of about 0.4 Pa while introducing Ar gas (100%). As a result, the layer of AlCr was formed on the layer of Ag—Pd—Cr to form the reflective layer 8 in the form of bilayer.

In a process for forming the second dielectric layer 6, a sputtering target (a diameter of 100 mm, a thickness of 6 mm) which material had a composition of $(ZrSiO_4)_{54}(ZnS)_{46}$ (mol %) was attached to a film-forming device, and then a high frequency sputtering was carried out with a power of 400 W under a pressure of about 0.13 Pa while introducing Ar gas (100%).

In a process for forming the recording layer 4, a sputtering target (a diameter of 100 mm, a thickness of 6 mm) made of a Ge—Sb—Te based material was attached to a film-forming device, and then a DC sputtering was carried out with a power of 100 W under a pressure of about 0.13 Pa while introducing a mixed gas of Ar gas (97%) and $N_2$ gas (3%).

A process for forming the first dielectric layer 2 was conducted similarly to the process for forming the second interface layer 6 described above except for the thickness of the layer so that the first dielectric layer 2 and the second dielectric layer 6 had the substantially same composition.

After the reflective layer 8, the second dielectric layer 6, the recording layer 4, and the first dielectric layer 2 were formed into films in order on the substrate 101 as described above to obtain a multilayered structure, an ultraviolet-curing resin was applied on the first dielectric layer 2. A circular polycarbonate substrate of a diameter of 120 mm and a thickness of 90 $\mu$m as a dummy substrate 110 was stuck on the applied ultraviolet-curing resin. Then, an ultraviolet ray was applied from the dummy substrate 110 to cure the resin. Thereby, an adhesive layer 9 consisting of the cured resin was formed at a thickness of 10 $\mu$m. The dummy substrate 110 was laminated to the multilayered structure with the adhesive layer 9.

In an initialization process following the lamination, the recording layer 4 of the information recording medium 28 was crystallized in the substantially all of an annular area ranging from 22 to 60 mm in a radial direction by using a semiconductor laser with a wavelength of 670 nm. Thereby, the initialization process was finished and the information recording medium 28 of Sample No. 8-1 was produced.

For the purpose of comparison, an information recording medium of Comparative Example was produced (not shown). This medium had a constitution similar to the information recording medium of this Example described above except that the first interface layer 103 and the second interface layer 105 of Ge—Cr—N were each provided between the first dielectric layer 2 and the recording layer 4 and between the second dielectric layer 6 and the recording layer 4, and that it contained the first dielectric layer 102 and the second dielectric layer 106 of $(ZnS)_{80}(SiO_2)_{20}$ (mol %) in place of the first dielectric layer 2 and the second dielectric layer 6. The first interface layer 103 and the second interface layer 105 were each formed at a thickness of 5 mm.

The information recording medium of this Comparative Example was produced as in the production method of the information recording medium of this Example except that the processes forming the first interface layer 103 and the second interface layer 105 as well as the first dielectric layer 102 and the second dielectric layer 106 were conducted similarly to in the production method of the information recording medium 31 in the prior art as another Comparative Example which was produced in Example 1.

As to the information recording medium 28 of Sample No. 8-1 and the information recording medium of Comparative Sample thus obtained, adhesiveness of the dielectric layer and overwrite cyclability of the information recording medium were evaluated. These results are shown in Table 8 together with a peak power (Pp) obtained on evaluating overwrite cyclability.

In this Example, adhesiveness of the dielectric layer in the information recording medium 28 was evaluated based on the occurrence of delamination in a similar manner in Example 1. On the other hand, overwrite cyclability was evaluated based on a different condition from in the case of Example 1, though it overlapped in the point of using the number of overwrite cycles as an index similarly to Example 1.

On evaluating overwrite cyclability of the information recording medium 28, recording which was equivalent to a capacity of 23 GB was conducted by using a semiconductor laser with a wavelength of 405 nm and an objective lens with numerical aperture of 0.85 in a system as that used in Example 1. A linear velocity of rotation of the information recording medium 28 was set at 5 m/second. A spectrum analyzer was used for measurements of CNR (Carrier-to-Noise Ratio, i.e. a ratio of an amplitude of a signal to a noise) and a erase ratio.

In order to determine a measurement condition for obtaining the number of overwrite cycles, a peak power (Pp) and a bias power (Pb) were determined according to the following procedure. The information recording medium 28 was irradiated with a laser beam 12 while modulating its power between a peak power (mW) in a high power level and a bias power (mW) in a low power level to record a 2T signal with a mark length of 0.16 μm ten times on the same groove surface of the recording layer 4. CNR was measured after the 2T signal was recorded ten times. This CNR was measured on each condition with the bias power being fixed at a certain value while the peak power was varied during ten times-recording of the 2T signal. A power that was 1.2 times as large as a minimum peak power at which the amplitude of the signal was saturated was determined as Pp1. After the 2T signal was recorded ten times as described above, the recorded signal was reproduced and the amplitude of the 2T signal was measured. Further, a 9T signal was recorded one time on the same groove surface to overwrite it. Then, the recorded signal was reproduced and the amplitude of the 2T signal was measured, and the erase ratio was obtained as a decrement of the 2T signal on the basis of the amplitude measured after ten times-recording. This erase ratio defined as above was obtained on each condition with the peak power being fixed at Pp determined above while the bias power was varied during ten times-recording of the 2T signal and one time-recording of the 9T signal. The center value of the range of the bias power at which the erase ratio was not less than 25 dB was determined as Pb. Considering the upper limit of the laser power of the system, it is desirable to satisfy Pp≦7 mW and Pb≦3.5 mW.

The number of overwrite cycles used as the index of overwrite cyclability was determined in this Example based on CNR and the erase ratio. The information recording medium 28 was irradiated with the laser beam while modulating its power between Pp and Pb thus determined to continuously record a 2T signal in the same groove surface while repeating this to overwrite predetermined times. After that, CNR was measured and a erase ratio was obtained. The erase ratio was obtained as a decrement of a 2T signal as described above. More specifically, the 2T signal was measured after recording the 2T signal predetermined times and after overwriting the 9T signal on it, the erase ratio was obtained as a decrement of the measured amplitude of the 2T signal after recording of the predetermined times on the basis of the measured amplitude of the 2T signal after overwriting of the 9T signal. The repeating times, i.e. the number of overwrite cycles, was 1, 2, 3, 5, 10, 100, 200, 500, 1000, 2000, 3000, 5000, 7000, and 10000 times. The limit of overwriting was defined when CNR dropped by 2 dB or when the erase ratio dropped by 5 dB, on the basis of CNR and the erase ratio in the case of the number of overwrite cycles of 10. Overwrite cyclability was evaluated based on the number of overwrite cycles at this limit. Of course, the larger number of overwrite cycles, the higher overwrite cyclability. The number of overwrite cycles of the information recording medium 28 is preferably not less than 10000 times.

TABLE 8

| Sample No. | Delamination | Groove Recording Number of Overwrite Cycles | Power (mW) Pp | Power (mW) Pb |
|---|---|---|---|---|
| 8-1 | No | ≧10000 | 5.0 | 2.3 |
| Comparative Sample | No | ≧10000 | 5.0 | 2.4 |

According to the information recording medium 28 of Sample No. 8-1 of this Example, an acceptable performance was obtained without providing an interface layer(s) by using layers of which material had a composition of $(ZrSiO_4)_{54}(ZnS)_{46}$ (mol %) (a Zr—Zn—S—O based material-layer) as the first dielectric layer 2 and the second dielectric layer 6, irrespective of reversing the order for forming the layers on the substrate, using a different condition for recording (such as the wavelength of the laser and the numerical aperture of the lens), and increasing the recording capacity to about 5 times when compared with the information recording medium 25 as shown in FIG. 1. In the information recording medium 28 of Sample No. 10-1 produced in this Example, a measured Rc value was 20%, and a measured Ra value was 3% (at an unrelieved flat surface thereof). From Table 8, it was confirmed that the performance of the information recording medium 28 of Sample No. 8-1 was in a substantially equal level of the information recording medium of Comparative Sample which contained the first and the second interface layers.

In the information recording medium 28 of Sample No. 8-1 of this Example, the layer consisting of the $ZrSiO_4$—ZnS based material was used for both of the first and the second dielectric layers. However, a Zr—Zn—S—O based material-layer other than this may be used.

Furthermore, in the information recording medium 28 of this Example, a Zr—Zn—S—O based material-layer was used as both of the first and the second dielectric layers. However, this invention is not limited to this. As an example, a Zr—Zn—S—O based material-layer can be used as one of the first and the second dielectric layers, and a material having the composition of, for example, $(ZnS)_{80}(SiO_2)_{20}$ (mol %) as described in the prior art can be used for the other dielectric layer, and an interface layer can be provided between the other dielectric layer and the recording layer. Also in such case, the similar result as in this Example was obtained. Therefore, by using a Zr—Zn—S—O based material-layer, at least one of, and preferably both of the two interface layers provided between the first and the second dielectric layer and the recording layer in the prior art can be omitted, and a performance equivalent to the information recording medium of Comparative Example can be ensured.

Example 9

In Example 9, an information recording medium which had a constitution similar to the information recording medium 29 described in Embodiment 5 with reference to FIG. 5 was produced.

The information recording medium 29 of this Example was produced as follows. Firstly, a substrate 101 as that in Example 8 was prepared. On this substrate 101, the second reflective layer 20 in the form of bilayer consisting of Ag—Pd—Cu with a thickness of 80 nm and AlCr with a thickness of 10 nm, the fifth dielectric layer 19 of (ZrSiO$_4$)$_{43}$(ZnS)$_{57}$ (mol %) with a thickness of 16 nm, the second recording layer 18 of Ge$_{37.5}$Sb$_{11}$Te$_{51.5}$ (atomic %) with a thickness of 11 nm, and the fourth dielectric layer 17 of (ZrSiO$_4$)$_{43}$(ZnS)$_{57}$ (mol %) with a thickness of 68 nm were formed into films in order by a sputtering method. Thereby, the second information layer 22 was formed on the substrate 101.

Processes for forming the second reflective layer 20 and the second recording layer 18 were conducted under conditions similar to the process for forming the reflective layer 8 and the recording layer 4 in the production method of the information recording medium 28 of Example 8, respectively. Processes for forming the fifth dielectric layer 19 and the fourth recording layer 17 were conducted under a condition similar to the processes for forming the second dielectric layer 6 and the first dielectric layer 2 in the production method of the information recording medium 28 of Example 8 respectively except that a sputtering target (a diameter of 100 mm, a thickness of 6 mm) which material had a composition of (ZrSiO$_4$)$_{43}$(ZnS)$_{57}$ (mol %) was used.

Next, an ultraviolet-curing resin was applied on the second information layer 22 by, for example, a spin coat. A polycarbonate substrate on which surface a guide groove was provided was located on the applied ultraviolet-curing resin so that the guide groove stuck on it. Then, an ultraviolet ray was applied from the polycarbonate substrate to cure the resin. The polycarbonate substrate was removed from an intermediate layer 16. Thereby, the intermediate layer 16 consisted of the cured resin to which the groove was transferred was formed at a thickness of 30 μm.

In the first initialization process following this, the second recording layer 18 of the second information layer 22 was crystallized in the substantially all of an annular area ranging from 22 to 60 mm in a radial direction by using a semiconductor laser with a wavelength of 670 nm.

Next, on the intermediate layer 16 of a multilayered structure thus obtained, the third dielectric layer 15 of TiO$_2$ with a thickness of 15 nm, the first reflective layer 14 of Ag—Pd—Cu with a thickness of 10 nm, the second dielectric layer 6 of (ZrSiO$_4$)$_{43}$(ZnS)$_{57}$ (mol %) with a thickness of 12 nm, the first recording layer 13 of Ge$_{37}$Sb$_{10}$Te$_{52}$ (atomic %) with a thickness of 6 nm, and the first dielectric layer 2 of (ZrSiO$_4$)$_{43}$(ZnS)$_{57}$ (mol %) with a thickness of 45 nm were formed into films in order by a sputtering method. Thereby, the first information layer 21 was formed. Please note that a layer of thin film of Cr$_2$O$_3$ could be formed between the first reflective layer 14 and the second dielectric layer 6 if necessary.

In a process for forming the third dielectric layer 15, a sputtering target (a diameter of 100 mm and a thickness of 6 mm) which had a composition of TiO$_2$ was attached to a film-forming device, and then a high frequency sputtering was carried out with a power of 400 W under a pressure of about 0.13 Pa while introducing a mixed gas of Ar gas (97%) and O$_2$ gas (3%).

A process for forming the first reflective layer 14 was conducted under a condition similar to that for forming the layer of Ag—Pd—Cu of the second reflective layer 20 described above except for the thickness of the layer.

In a process for forming the second dielectric layer 6, a sputtering target (a diameter of 100 mm and a thickness of 6 mm) which had a composition of (ZrSiO$_4$)$_{43}$(ZnS)$_{57}$ was attached to the film-forming device, and then a high frequency sputtering was carried out with a power of 500 W under a pressure of about 0.13 Pa while introducing Ar gas (100%).

In a process for forming the first recording layer 13, a sputtering target (a diameter of 100 mm and a thickness of 6 mm) made of a Ge—Sn—Sb—Te based material was attached to the film-forming device, and then a DC sputtering was carried out with a power of 50 W while introducing Ar gas (100%). A pressure during the sputtering was set at about 0.13 Pa.

A process for forming the first dielectric layer 2 was conducted similarly to the process for forming the second interface layer 6 described above except for the thickness of the layer so that the first dielectric layer 2 and the second dielectric layer 6 had the substantially same composition.

After the layers up to the first dielectric layer 2 were formed into films on the substrate 101 as described above to obtain a multilayered structure, an ultraviolet-curing resin was applied on the first dielectric layer 2. A circular polycarbonate substrate of a diameter of 120 mm and a thickness of 65 μm as a dummy substrate 110 was stuck on the applied ultraviolet-curing resin. Then, an ultraviolet ray was applied from the dummy substrate 110 to cure the resin. Thereby, an adhesive layer 9 consisting of the cured resin was formed at a thickness of 10 μm. The dummy substrate 110 was laminated to the multilayered structure with the adhesive layer 9.

In the second initialization process following the lamination, the first recording layer 13 of the first information layer 21 was crystallized in the substantially all of an annular area ranging from 22 to 60 mm in a radial direction by using a semiconductor laser with a wavelength of 670 nm. Thereby, the information recording medium 29 of Sample No. 9-1 was produced.

With respect to the information recording medium 29 of Sample No. 9-1 thus obtained, adhesiveness of the dielectric layers and overwrite cyclability of the information recording medium were evaluated for each of the first information layer 21 and the second information layer 22. These results are shown in Table 9 together with a peak power (Pp) and a bias power (Pb) obtained on evaluating overwrite cyclability.

In this Example, the evaluation of adhesiveness for the information recording medium 29 was conducted under a condition similarly to Example 1. However, it was different from Example 1 in that the investigation of delamination was carried out with respect to both of the first information layer 21 and the second information layer 22. Moreover, the evaluation of overwrite cyclability of the information recording medium 29 was conducted under a condition similarly to Example 8. However, it was different from Example 8 in that recording which was equivalent to a capacity of 23 GB was conducted on each of the first information layer 21 and the second information layer 22, and that the number of overwrite cycles was obtained with respect to both of the first information layer 21 and the second information layer 22. A laser beam 12 was focused on the first recording layer 13 when recording on the first information layer 21, and on the second recording layer 18 when recording on the second information layer 22. Considering the upper limit of the laser power of the system, it is desirable to satisfy Pp≦14 mW and Pb≦7 mW as to the first information layer 21 (the value of about half of these Pp and Pb as to the second information layer 22 since the laser beam 12 which has passed through the first information layer 21 is to be used for the recording).

TABLE 9

| | First Information Layer | | | Second Information Layer | | |
|---|---|---|---|---|---|---|
| Sample No. | Delamination | Number of Overwrite Cycles | Peak Power Pp (mW) | De-lamination | Number of Overwrite Cycles | Peak Power Pp (mW) |
| 9-1 | No | ≧10000 | 11 | No | ≧10000 | 5.5 |

As shown in Table 9, according to the information recording medium 29 of Sample No. 9-1 of this Example, an acceptable performance was obtained by using layers consisting of a $ZrSiO_4$—ZnS based material as the first dielectric layer 2, the second dielectric layer 6, the fourth dielectric layer 17, and the fifth dielectric layer 19, irrespective of reversing the order for forming the layers on the substrate, using a different condition for recording, and increasing the recording capacity to about 10 times when compared with the information recording medium 25 as shown in FIG. 1. In the information recording medium 29 of Sample No. 9-1 produced in this Example, a designed Rc value was 6%, and a designed Ra value was 0.7% for the first information layer 21 (at an unrelieved flat surface thereof). Further, a designed Rc value was 25%, and a designed Ra value was 3% for the second information layer 22.

In the information recording medium 29 of Sample No. 9-1 of this Example, the layer consisting of the $ZrSiO_4$—ZnS based material was used for all of the first dielectric layer 2, the second dielectric layer 6, the fourth dielectric layer 17, and the fifth dielectric layer 19. However, a Zr—Zn—S—O based material-layer other than this (e.g. a layer consisting of a $ZrO_2$—$SiO_2$—ZnS based material which contains $ZrO_2$ and $SiO_4$ at a different content from each other) may be used as a dielectric layer(s). Also in such case, an acceptable performance was obtained.

Furthermore, in the information recording medium 29 of this Example, a Zr—Zn—S—O based material-layer was used as all of the first dielectric layer 2, the second dielectric layer 6, the fourth dielectric layer 17, and the fifth dielectric layer 19. However, this invention is not limited to this. As an example, a Zr—Zn—S—O based material-layer (or a Zr—Cr—Zn—O based material-layer) can be used as one of the first and the second dielectric layers, and a material having the composition of, for example, $(ZnS)_{80}(SiO_2)_{20}$ (mol %) as in the prior art can be used for the remaining dielectric layers, and an interface layer can be provided between the other dielectric layer and the recording layer. Also in such case, the similar result as in this Example was obtained.

Furthermore, in the information recording medium 29 of this Example, all of materials used for the first dielectric layer 2, the second dielectric layer 6, the fourth dielectric layer 17 and the fifth dielectric layer 19 had the same composition. However, materials having a different composition can also be used for at least two of these dielectric layers. Also in such case, an acceptable performance as high as this Example was obtained.

Example 10

In Example 10, an information recording medium which had a constitution similar to the information recording medium 30 described in Embodiment 6 with reference to FIG. 6 was produced. A Zr—Zn—S—O based material-layer was used for the first interface layer 3 and the second interface layer 5 in the information recording medium 30 of this Example, unlikely the dielectric layer in the information recording medium of Examples 1–9 described above.

The information recording medium 30 of this Example was produced as follows. Firstly, a substrate 1 as that in Example 1 was prepared. On this substrate 1, the first dielectric layer 102 of $(ZnS)_{80}(SiO_2)_{20}$ (mol %) with a thickness of 150 nm, the first interface layer 3 of $(ZrSiO_4)_{54}(ZnS)_{46}$ (mol %) with a thickness of 5 nm, a recording layer 4 of $Ge_{27}Sn_8Sb_{12}Te_{53}$ (atomic %) with a thickness of 9 nm, the second interface layer 5 of $(ZrSiO_4)_{54}(ZnS)_{46}$ (mol %) with a thickness of 5 nm, the second dielectric layer 106 of $(ZnS)_{80}(SiO_2)_{20}$ (mol %) with a thickness of 50 nm, an optical compensation layer 7 of $Ge_{80}Cr_{20}$ (atomic %) with a thickness of 40 nm, and the reflective layer 8 of Ag—Pd—Cu with a thickness of 80 nm were formed into films in order by a sputtering method. Each material for the first dielectric layer 102 and the second dielectric layer 106 was substantially the same as that in the information recording medium 31 described above while referring to FIG. 9.

This information recording medium 30 had the constitution as in the case of the information recording medium 31 in the prior art which was produced in Example 1 (see FIG. 9), and was produced similarly to this except for processes for forming the first interface layer 3 and the second interface layer 5. In the processes for forming the first interface layer 3 and the second interface layer 5, a sputtering target (a diameter of 100 mm, a thickness of 6 mm) which material had a composition of $(ZrSiO_4)_{54}(ZnS)_{46}$ (mol %) was attached to a film-forming device, and then a high frequency sputtering was carried out with a power of 400 W under a pressure of about 0.13 Pa while introducing Ar gas (100%).

With respect to the information recording medium 30 of Sample No. 10-1 thus obtained, adhesiveness of the dielectric layer and overwrite cyclability of the information recording medium were evaluated similarly to Example 1. However, in this Example, the evaluation of adhesiveness was conducted by investigating whether delamination occurred between the recording layer 4 and the adjacent interface layer, more specifically, between the recording layer 4 and at least one of the first interface layer 3 and the second interface layer 5. The evaluation of overwrite cyclability was conducted not only by groove recording but also by land recording (i.e. by land-groove recording) and measuring numbers of overwrite as to each of the groove recording and the land recording. These results are shown in Table 10. In the purpose of comparison, the result as to the information recording medium in the prior art shown in FIG. 9 which was produced in Example 1 is also shown in Table 10.

TABLE 10

| | | Groove Recording | | | Land Recording | | |
|---|---|---|---|---|---|---|---|
| Sample No. | De-lamination | Number of Overwrite Cycles | Power (mW) Pp | Pb | Number of Overwrite Cycles | Power (mW) Pp | Pb |
| 10-1 | No | ≧100000 | 10.5 | 4.7 | ≧100000 | 11.0 | 4.9 |
| Comparative Sample | No | ≧100000 | 11.0 | 5.0 | ≧100000 | 11.3 | 5.2 |

As shown in Table 10, in the information recording medium 30 of Sample No. 10-1 of this Example in which a material of $(ZrSiO_4)_{54}(ZnS)_{46}$ (mol %) was used for the interface layers, the performance thereof was in a substantially equal level of the information recording medium 31 in the prior art of Comparative Sample.

In this Example, a Zr—Zn—S—O based material-layer was used as the interface layer. The number of layers of the information recording medium was the same as that in the prior art and was not reduced. However, such interface layer consisting of a Zr—Zn—S—O based material can be formed by a sputtering in the atmosphere of Ar gas, without the need of a reactive sputtering which was required for forming an interface layer of, for example, Ge—Cr—N in the prior art. According to this Example, therefore, the variations in composition and in thickness of the interface layer become smaller than of the interface layer of Ge—Cr—N in the prior art. Thus, the readiness and the stability of production can be improved.

In the information recording medium 30 of Sample No. 10-1 of this Example, the layer of which material had the composition of $(ZrSiO_4)_{54}(ZnS)_{46}$ (mol %) (a Zr—Zn—S—O based material-layer) was used for both of the first interface layer 3 and the second interface layer 5. However, such composition is an example. A Zr—Zn—S—O based material-layer other than this can be used. Additionally, the first interface layer 3 and the second interface layer 5 can be layers having a different composition from each other which are selected from the Zr—Zn—S—O based material.

Example 11

In Example 11, information recording mediums, which each had a constitution similar to the information recording medium 28 described in Embodiment 4 with reference to FIG. 4, were produced while varying the material for a recording layer 4.

The information recording mediums 28 of this Example each had a constitution which was similar to the information recording medium 28 of Example 8 except that both of the first and the second dielectric layers were made of $(ZrO_2)_{50}(SiO_2)_{30}(ZnS)_{20}$ (mol %) and that the recording layer was made of a material shown in Table 11 (i.e. $Ge_{35}Sn_{10}Sb_4Te_{51}$ (atomic %), $Ge_{45}Bi_4Te_{51}$ (atomic %) $Ge_{42}Sn_3Bi_4Te_{51}$ (atomic %), $Ge_{45}Sb_2Bi_2Te_{51}$ (atomic %) $Ge_{42}Sn_3Sb_3Bi_1Te_{51}$ (atomic %), $Ag_2In_3Sb_{77}Te_{18}$ (atomic %), and $Sb_{77}Te_{18}Ge_5$ (atomic %) for each sample). The mediums were produced as in Example 8 except that the processes for forming the first and the second dielectric layers and the process for forming the recording layer were changed.

As in Example 8, a reflective layer 8 in the form of bilayer consisting of Ag—Pd—Cu with a thickness of 80 nm and AlCr with a thickness of 10 nm, the second dielectric layer 6 of $(ZrO_2)_{50}(SiO_2)_{30}(ZnS)_{20}$ (mol %) with a thickness of 16 nm, a recording layer 4 made of a material shown in Table 11 with a thickness of 11 nm, and the first dielectric layer 2 of $(ZrO_2)_{50}(SiO_2)_{30}(ZnS)_{20}$ (mol %) with a thickness of 68 nm were formed into films on a substrate 101 in order by a sputtering method.

In the processes for forming the first dielectric layer 2 and the second dielectric layer 6 in order to produce the information recording mediums 28, a sputtering target (a diameter of 100 mm and a thickness of 6 mm for each) which material had a composition of $(ZrO_2)_{50}(SiO_2)_{30}(ZnS)_{20}$ (mol %) was used Additionally, in the processes for forming the first dielectric layer and the second dielectric layer as to all samples, a power was set at 400 W, a pressure was set at about 0.13 Pa, and a gas to be introduced to a film-forming device was Ar gas (100%).

In the process for forming the recording layer 4 in order to produce the information recording mediums 28 of Sample Nos. 11-1 to 11-7, sputtering targets (a diameter of 100 mm and a thickness of 6 mm for each) which material had a certain composition shown in Table 11 were respectively used. Additionally, in the processes for forming the recording layer as to all samples, a power was set at 100 W, a pressure was set at about 0.13 Pa, and a gas to be introduced to a film-forming device was a mixed gas of Ar gas (97%) and $N_2$ gas (3%).

The recording layer formed into a film by the sputtering method was regarded to have the substantially same composition as the used sputtering target.

Other steps such as the processes for layers forming into films, a lamination process, and a initialization process were similar to those in Example 8.

With respect to the information recording mediums of Sample Nos. 11-1 to 11-7 thus obtained, adhesiveness of the dielectric layers and overwrite cyclability of the information recording medium were evaluated similarly to Example 8. These results are shown in Table 11 together with a peak power (Pp) obtained on evaluating overwrite cyclability. Please note that the condition of evaluations in this Example was different from that of Example 8 in the point that the linear velocity of rotation of the information recording medium was set at 10 m/second. As to other conditions, similarly to that in Example 8, recording which was equivalent to a capacity of 23 GB was conducted by using a semiconductor laser with a wavelength of 405 nm and an objective lens with numerical aperture of 0.85.

TABLE 11

| | | | Groove Recording | | |
|---|---|---|---|---|---|
| Sample No. | Material of Recording Layer (at. %) | De-lamination | Number of Overwrite Cycles | Power (mW) Pp | Pb |
| 11-1 | $Ge_{35}Sn_{10}Sb_4Te_{51}$ | No | ≧10000 | 5.1 | 2.1 |
| 11-2 | $Ge_{45}Bi_4Te_{51}$ | No | ≧10000 | 5.2 | 2.0 |
| 11-3 | $Ge_{42}Sn_3Bi_4Te_{51}$ | No | ≧10000 | 5.3 | 1.9 |
| 11-4 | $Ge_{45}Sb_2Bi_2Te_{51}$ | No | ≧10000 | 5.0 | 2.2 |
| 11-5 | $Ge_{42}Sn_3Sb_3Bi_1Te_{51}$ | No | ≧10000 | 5.1 | 2.0 |
| 11-6 | $Ag_2In_3Sb_{77}Te_{18}$ | No | ≧10000 | 5.2 | 1.9 |
| 11-7 | $Sb_{77}Te_{18}Ge_5$ | No | ≧10000 | 5.0 | 2.0 |

With reference to Table 11, a high adhesiveness and a large number of overwrite cycles and an appropriate power level were obtained with the condition of the linear velocity of rotation set at 10 m/second though the material for the recording layer 4 was varied. By using a material consisting of $(ZrO_2)_{50}(SiO_2)_{30}(ZnS)_{20}$ (mol %) as the first and the second dielectric layers, an acceptable performance was obtained as to the information recording medium without providing an interface layer(s).

Example 12

Though the information recording mediums for recording an information by optical means were produced in above Examples 1–11, an information recording medium 207 for recording an information by electric means shown in FIG. 7 was produced in Example 12. The information recording medium 207 of this Example was a so-called memory.

The information recording medium 207 of this Example was produced as follows. Firstly, a Si substrate 201 having a length of 5 mm, a width of 5 mm, and a thickness of 1 mm of which surface was subjected to a nitriding treatment was prepared. On this substrate 201, a lower electrode 202 of Au in an area of 1.0 mm×1.0 mm with a thickness of 0.1 µm, a phase-change part 205 of $Ge_{38}Sb_{10}Te_{52}$ (which is expressed as $Ge_8Sb_2Te_{11}$ as a compound) in a circular area of a diameter of 0.2 mm with a thickness of 0.1 µm, a thermal insulating part 206 of $(ZrSiO_4)_{54}(ZnS)_{46}$ in a area of 0.6 mm×0.6 mm (excluding the phase-change part 205) with the same thickness as the phase-change part 205, and an upper electrode 204 of Au in an area of 0.6 mm×0.6 mm with a thickness of 0.1 µm were formed into films in order by a sputtering method.

In a process for forming the phase-change part 205, a sputtering target (a diameter of 100 mm, a thickness of 6 mm) made of a Ge—Sb—Te based material was attached to a film-forming device, and then a DC sputtering was carried out with a power of 100 W while introducing Ar gas (100%). A pressure during the sputtering was set at about 0.13 Pa. In a process for forming the thermal insulating part 206, a sputtering target (a diameter of 100 mm, a thickness of 6 mm) which material had a composition of $(ZrSiO_4)_{54}(ZnS)_{46}$ was attached to the film-forming device, and then a high frequency sputtering was carried out with a power of 500 W under a pressure of about 0.13 Pa while introducing Ar gas (100%). Each sputtering in these processes was conducted while covering an area excluding the surface to be sputtered with a mask so that these layers did not overlap. Please note that the order for carrying out the processes for forming the phase-change part 205 and the thermal insulating part 206 is not specified, and each of these processes could be conducted as described above.

The phase-change part 205 and the thermal insulating part 206 constituted a recording part 203. The phase-change part 205 corresponded to a recording layer according to this invention. The thermal insulating part 206 corresponded to a Zr—Zn—S—O based material-layer according to this invention.

Please note that the detailed description of processes for forming the lower electrode 202 and the upper electrode 204 is omitted since these processes could be conducted by a general method in the technical field of formation of an electrode with a sputtering method.

Phase change occurred in the phase-change part 205 by applying an electric energy to the information recording medium 207 of this Example thus produced. This was confirmed by means of a system shown in FIG. 8. The cross sectional view of the information recording medium 207 shown in FIG. 8 is the cross section of the information recording medium 207 taken along a line A–B in a direction of its thickness shown in FIG. 7.

Figure 8:
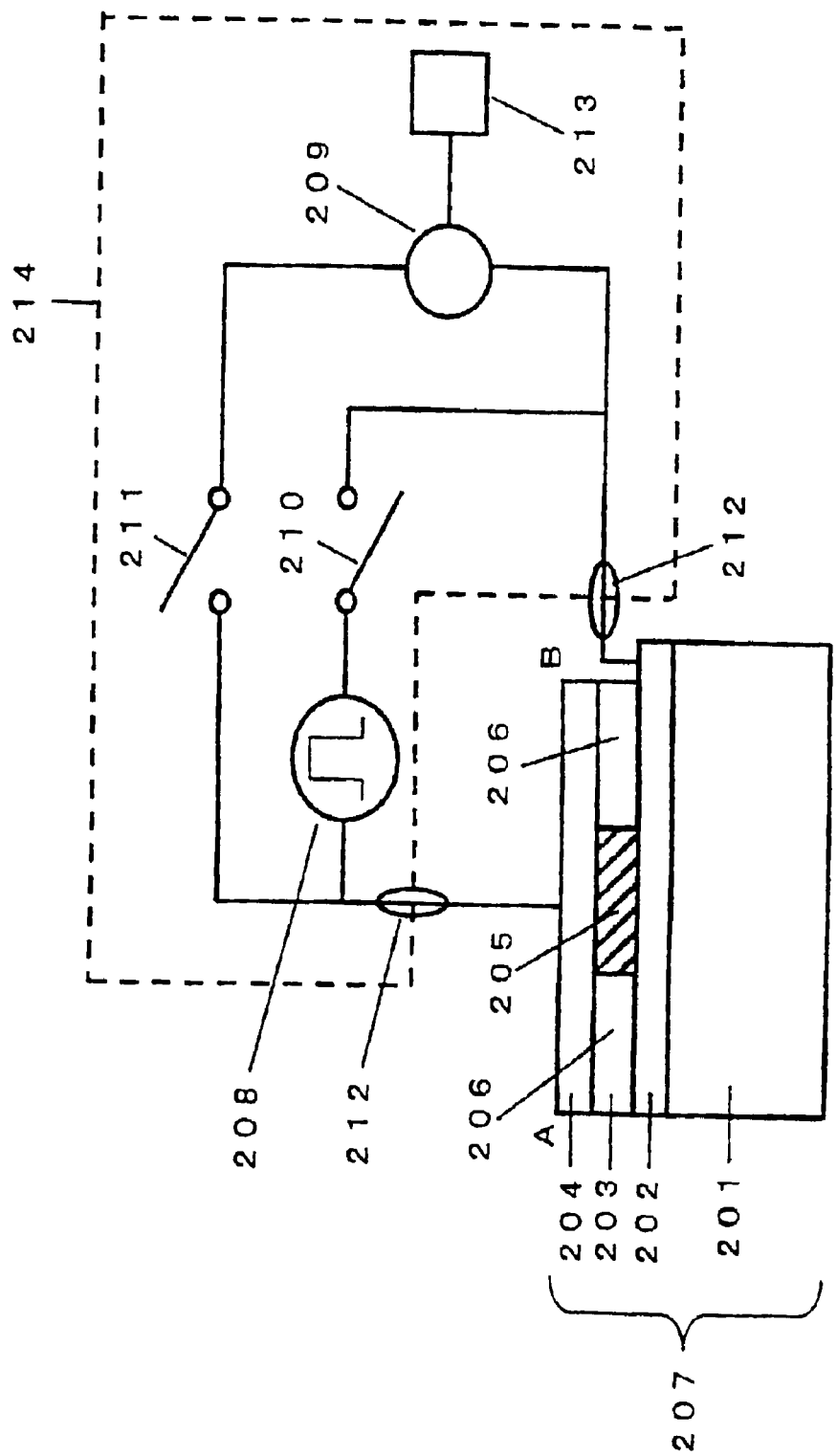
FIG. 8 is a schematical view which shows an example of a system for the information recording medium shown in FIG. 7.

As shown in FIG. 8, more specifically, two parts 212 for application were bonded to the lower electrode 202 and the upper electrode 204 respectively with a lead wire of Au. Thus, an electrically recording/reproducing device 214 was connected to the information recording medium (memory) 207 through this application parts 212. Between the application parts 212 which were respectively connected to the lower electrode 202 and the upper electrode 204 in the electrically recording/reproducing device 214, a pulse producing part 208 was connected to the application parts 212 through a switch 210, and a resistance measuring device 209 was also connected to the application parts 212 through a switch 211. The resistance measuring device 209 was connected to a judgment part 213 which judges whether a resistance value measured by the resistance measuring device 209 was high or low. A current pulse was flowed between the upper electrode 204 and the lower electrode 202 by means of the pulse producing part 208 through the application parts 212. A resistance value between the lower electrode 202 and the upper electrode 204 was measured by the resistance measuring device 209. Thus measured resistance value was judged by the judgment part 213 whether it was high or low. Such resistance value generally changes by the phase change of the phase-change part 205. Therefore, the state of a phase of the phase-change part 205 could be told based on the result of this judgment.

In the case of this Example, the melting point of the phase-change part 205 was 630° C., the crystallization temperature thereof was 170° C., and the crystallization time thereof was 130 ns. The resistance value between the lower electrode 202 and the upper electrode 204 was 1000Ω when the phase-change part 205 was in the state of amorphous phase, and was 20Ω when it was in the state of crystalline phase. A current pulse of 20 mA and 150 ns was applied between the upper electrodes 204 and the lower electrode 202 when the phase-change part 205 was in the state of amorphous phase (i.e. in the level of high resistance), so that the resistance value between the lower electrode 202 and the upper electrode 204 dropped and the phase-change part 205 changed into the state of crystalline phase from the state of amorphous phase. Further, a current pulse of 200 mA and 100 ns was applied between the upper electrodes 204 and the lower electrode 202 when the phase-change part 205 was in the state of crystalline phase (i.e. in the level of low resistance), so that the resistance value between the lower electrode 202 and the upper electrode 204 rose and the phase-change part 205 changed into the state of amorphous phase from the state of crystalline phase.

From the result described above, it was confirmed that a phase change occurred in the phase-change part (a recording layer) by using the layer made of a material having a composition of $(ZrSiO_4)_{54}(ZnS)_{46}$ as the thermal insulating part 206 around the phase-change part 205 and by applying an electric energy to it. Therefore, it was also confirmed that the information recording medium 207 had a function of recording an information.

In the case where the thermal insulating part 206 of $(ZrSiO_4)_{54}(ZnS)_{46}$ which is a dielectric is provided for the periphery of the phase-change part 205 in a cylindrical shape as in this Example, it effectively prevents a current, which flows into the phase-change part 205 by applying a voltage between the upper electrode 204 and the lower electrode 202, from escaping to the periphery of the phase-change part 205. Therefore, a temperature of the phase-change part 205 can be efficiently raised by the Joule heat generated by the current. Particularly, a process of melting the phase-change part 205 of $Ge_{38}Sb_{10}Te_{52}$ followed by quenching it is required to change the phase-change part 205 into the state of amorphous phase. By providing the thermal insulating part 206 for the periphery of the phase-change part 205, a temperature of the phase-change part 205 can be raised not less than the melting point thereof with a smaller current.

A material of $(ZrSiO_4)_{54}(ZnS)_{46}$ for the thermal insulating part 206 has a high melting point. Moreover, an atomic diffusion by heat hardly takes place in this material. Thus, the material is applicable to an electric memory such as the information recording medium 207. Additionally, in the case where the thermal insulating part 206 is located in the periphery of the phase-change part 205, the thermal insulating part 206 serves to substantially isolate the phase-change part 205 electrically and thermally in the plane of the recording part 203. Therefore, by providing the plural number of phase-change parts 205 for the information recording medium 207 while the phase-change parts 205 are isolated from each other by the thermal insulating part 206, the memory capacity of the information recording medium 207 can be made higher and functions of, for example, accessing and/or switching can be improved. In addition, the plural number of information recording mediums 207 themselves can also be connected to each other.

An information recording medium of this invention has been demonstrated through various Examples thereinbefore. A Zr—Zn—S—O based material-layer can be used for both an information recording medium recorded with optical means and an information recording medium recorded with electric means. According to an information recording medium of this invention, excellent effects are obtained compared with the information recording medium in the prior art.

What is claimed is:

1. An information recording medium comprising:
   a substrate;
   a recording layer wherein a phase change between a crystal phase and an amorphous phase is generated by irradiation of light or application of an electric energy; and
   a Zr—Zn—S—O-based material layer comprising Zr, Zn, S and O.

2. The information recording medium according to claim 1, wherein the Zr—Zn—S—O-based material layer consists essentially of a material expressed with the formula (1):

$$Zr_B Zn_C S_D O_{100-B-C-D} \text{ (atomic \%)} \quad (1)$$

wherein B, C and D are respectively within the range of $8 \leq B \leq 33$, and $3 \leq C \leq 30$, $C \leq D \leq 2C < 45$, and satisfy $40 \leq B+C+D \leq 80$.

3. The information recording medium according to claim 1, wherein the Zr—Zn—S—O-based material layer further contains Si and consists essentially of a material expressed with the formula (2):

$$Zr_E Si_F Zn_G S_H O_{100-E-F-G-H} \text{ (atomic \%)} \quad (2)$$

wherein E, F, G and H are respectively in the range of $1 \leq E \leq 30$, $0 < F \leq 23$, $2 \leq G \leq 30$ and $G \leq H \leq 2G < 45$, and satisfy $40 \leq E+F+G+H \leq 80$.

4. The information recording medium according to claim 2, wherein the Zr—Zn—S—O-based material layer consists essentially of a material expressed with the formula (11):

$$(ZrO_2)_X(Zn-S)_{100-X} \text{ (mol \%)} \quad (11)$$

wherein X is in the range of $50 \leq X \leq 80$.

5. The information recording medium according to claim 3, wherein the Zr—Zn—S—O-based material containing Si consists essentially of a material expressed with the formula (21):

$$(ZrO_2)_Y(SiO_2)_Z(Zn-S)_{100-Y-Z} \text{ (mol \%)} \quad (21)$$

wherein Y and Z are respectively within the range of $20 \leq Y \leq 70$, and $10 \leq Z \leq 50$, and satisfy $50 \leq Y+Z \leq 80$.

6. The information recording medium according to claim 5, wherein the material expressed with the formula (21) contains $ZrO_2$ and $SiO_2$ at a substantially equal ratio and is expressed with the formula (22):

$$(ZrSiO_4)_A(Zn-S)_{100-A} \text{ (mol \%)} \quad (22)$$

wherein A is within the range of $33 \leq A \leq 67$.

7. The information recording medium according to claim 1, wherein the phase change is generated reversibly in the recording layer.

8. The information recording medium according to claim 7, wherein the recording layer comprises a material selected from Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te.

9. The information recording medium according to claim 1, wherein the thickness of the recording layer is 15 nm or less.

10. The information recording medium according to claim 1, wherein two or more recording layers are provided.

11. The information recording medium according to claim 1, wherein a first dielectric layer, the recording layer, a second dielectric layer, and a reflective layer are formed in this order on one surface of the substrate, and at least one of the first dielectric layer and the second dielectric layer is the Zr—Zn—S—O-based material layer which contacts the recording layer.

12. The information recording medium according to claim 1, wherein a reflective layer, a second dielectric layer, the recording layer and a first dielectric layer are formed in this order on one surface of the substrate, and at least one of the first dielectric layer and the second dielectric layer is the Zr—Zn—S—O-based material layer which contacts the recording layer.

13. A method for producing an information recording medium which comprises a substrate, a recording layer, and a Zr—Zn—S—O-based material layer comprising Zr, Zn, S and O, the method comprising a process of forming the Zr—Zn—S—O-based material layer by a sputtering method.

14. The method according to claim 13, wherein a sputtering target consisting essentially of a material expressed with the formula (10):

$$Zr_b Zn_c S_d O_{100-b-c-d} \text{ (atomic \%)} \quad (10)$$

wherein, b, c, and d are respectively within the range of $11 \leq b \leq 30$, $5 \leq c \leq 27$ and $c \leq d \leq 2c < 40$, and satisfy $40 \leq b+c+d \leq 80$, is used in the process of forming the Zr—Zn—S—O-based material layer by the sputtering method.

15. The method according to claim 13, wherein a sputtering target consisting essentially of a material expressed with the formula (20):

$$Zr_e Si_f Zn_g S_h O_{100-e-f-g-h} \text{ (atomic \%)} \quad (20)$$

wherein e, f, g and h are respectively in the range of $3 \leq e \leq 27$, $1 < f \leq 20$, $5 \leq g \leq 27$ and $g \leq h \leq 2g < 40$, and satisfy $40 \leq e+f+g+h \leq 80$, is used to form a Zr—Zn—S—O-based material layer containing Si in the process of forming the Zr—Zn—S—O-based material layer by the sputtering method.

16. The method according to claim 13, wherein a sputtering target consisting essentially of a material expressed with the formula (110):

$$(ZrO_2)_x(Zn\text{---}S)_{100-x} \text{ (mol \%)} \quad (110)$$

wherein x is in the range of $50 \leq x \leq 80$, is used in the process of forming the Zr—Zn—S—O-based material layer by the sputtering method.

17. The method according to claim 13, wherein a sputtering target consisting essentially of a material expressed with the formula (210):

$$(ZrO_2)_y(SiO_2)_z(Zn\text{---}S)_{100-y-z} \text{ (mol \%)} \quad (210)$$

wherein y and z are respectively within the range of $20 \leq y \leq 70$, and $10 \leq z \leq 50$, and satisfy $50 \leq y+z \leq 80$, is used to form a Zr—Zn—S—O-based material layer containing Si in the process of forming the Zr—Zn—S—O-based material layer by the sputtering method.

18. The method according to claim 17, wherein the material expressed with the formula (210) contains $ZrO_2$ and $SiO_2$ at a substantially equal ratio and is expressed with the formula (220):

$$(ZrSiO_4)_a(Zn\text{---}S)_{100-a} \text{ (mol \%)} \quad (220)$$

wherein a is within the range of $33 \leq a \leq 67$.

* * * * *

UNITED STATES PATENT AND TRADEMARK OFFICE
CERTIFICATE OF CORRECTION

PATENT NO.   : 6,761,950 B2
DATED        : July 13, 2004
INVENTOR(S)  : Rie Kojima et al.

It is certified that error appears in the above-identified patent and that said Letters Patent is hereby corrected as shown below:

<u>Column 61,</u>
Line 45, please replace "$Zr_BZn_CS_DO_{100-B-C-D}$ (atomic %)     (1)"
with -- $Zr_BZn_CS_DO_{100-B-C-D}$ (atomic %)     (1) --.

Signed and Sealed this

Eleventh Day of January, 2005

JON W. DUDAS
*Director of the United States Patent and Trademark Office*